United States Patent
Ravelli et al.

(10) Patent No.: US 11,315,583 B2
(45) Date of Patent: Apr. 26, 2022

(54) AUDIO ENCODERS, AUDIO DECODERS, METHODS AND COMPUTER PROGRAMS ADAPTING AN ENCODING AND DECODING OF LEAST SIGNIFICANT BITS

(71) Applicant: Fraunhofer-Gesellschaft zur Förderung der angewandten Forschung e.V., Munich (DE)

(72) Inventors: Emmanuel Ravelli, Erlangen (DE); Guillaume Fuchs, Erlangen (DE); Markus Schnell, Erlangen (DE); Adrian Tomasek, Erlangen (DE); Stefan Geyersberger, Erlangen (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 95 days.

(21) Appl. No.: 16/870,419

(22) Filed: May 8, 2020

(65) Prior Publication Data
US 2020/0273472 A1    Aug. 27, 2020

Related U.S. Application Data

(63) Continuation of application No. PCT/EP2018/080698, filed on Nov. 8, 2018, which is a continuation of application No. PCT/EP2017/078959, filed on Nov. 10, 2017.

(51) Int. Cl.
*G10L 19/032* (2013.01)
*G10L 19/002* (2013.01)
*H03M 7/30* (2006.01)

(52) U.S. Cl.
CPC .......... *G10L 19/032* (2013.01); *G10L 19/002* (2013.01); *H03M 7/3059* (2013.01);
(Continued)

(58) Field of Classification Search
CPC ... H03M 7/6005; H03M 7/6011; G10L 25/18; G10L 19/02; G10L 19/18
(Continued)

(56) References Cited

U.S. PATENT DOCUMENTS

| | | |
|---|---|---|
| 4,972,484 A | 11/1990 | Link et al. |
| 5,012,517 A | 4/1991 | Chhatwal et al. |
| 5,581,653 A | 12/1996 | Todd |
| 5,651,091 A | 7/1997 | Chen et al. |
| 5,781,888 A | 7/1998 | Herre |

(Continued)

FOREIGN PATENT DOCUMENTS

| | | |
|---|---|---|
| CN | 101140759 A | 3/2008 |
| CN | 102779526 A | 11/2012 |

(Continued)

OTHER PUBLICATIONS

John Tan, "Office Action for SG Application 11202004173P", dated Jul. 23, 2021, IPOS, Singapore.

(Continued)

*Primary Examiner* — Akwasi M Sarpong
(74) *Attorney, Agent, or Firm* — Novick, Kim & Lee, PLLC; Jae Youn Kim; Jihun Kim

(57) ABSTRACT

An audio decoder for providing a decoded audio information on the basis of an encoded audio information is configured to obtain decoded spectral values on the basis of an encoded information representing the spectral values. The audio decoder is configured to jointly decode two or more most significant bits per spectral value on the basis of respective symbol codes for a set of spectral values using an arithmetic decoding, wherein a respective symbol code represents two or more most significant bits per spectral value for one or more spectral values. The audio decoder is configured to decode one or more least significant bits associated with one or more of the spectral values in dependence on how much least significant bit information is available, such that one or more least significant bits associated with one or more of the spectral values are decoded.

19 Claims, 23 Drawing Sheets

(52) U.S. Cl.
CPC ....... *H03M 7/3066* (2013.01); *H03M 7/6005* (2013.01); *H03M 7/6011* (2013.01)

(58) Field of Classification Search
USPC .................................. 704/1, 200, 500, 503
See application file for complete search history.

(56) References Cited

U.S. PATENT DOCUMENTS

| | | |
|---|---|---|
| 5,812,971 A | 9/1998 | Herre |
| 5,819,209 A | 10/1998 | Inoue |
| 5,909,663 A | 6/1999 | Iijima et al. |
| 5,999,899 A | 12/1999 | Robinson |
| 6,018,706 A | 1/2000 | Huang et al. |
| 6,148,288 A | 11/2000 | Park |
| 6,167,093 A | 12/2000 | Tsutsui et al. |
| 6,507,814 B1 | 1/2003 | Gao |
| 6,570,991 B1 | 5/2003 | Scheirer et al. |
| 6,665,638 B1 | 12/2003 | Kang et al. |
| 6,735,561 B1 | 5/2004 | Johnston et al. |
| 7,009,533 B1 | 3/2006 | Wegener |
| 7,353,168 B2 | 4/2008 | Chen et al. |
| 7,395,209 B1 | 7/2008 | Dokic et al. |
| 7,539,612 B2 | 5/2009 | Chen et al. |
| 7,546,240 B2 | 6/2009 | Chen et al. |
| 8,015,000 B2 | 9/2011 | Chen et al. |
| 8,095,359 B2 | 1/2012 | Boehm et al. |
| 8,280,538 B2 | 10/2012 | Kim et al. |
| 8,473,301 B2 | 6/2013 | Chen et al. |
| 8,543,389 B2 | 9/2013 | Ragot et al. |
| 8,554,549 B2 | 10/2013 | Morii et al. |
| 8,612,240 B2 | 12/2013 | Fuchs et al. |
| 8,682,681 B2 | 3/2014 | Fuchs et al. |
| 8,738,385 B2 | 5/2014 | Chen |
| 8,751,246 B2 | 6/2014 | Bayer et al. |
| 8,847,795 B2 | 9/2014 | Faure et al. |
| 8,891,775 B2 | 11/2014 | Mundt et al. |
| 8,898,068 B2 | 11/2014 | Fuchs et al. |
| 9,026,451 B1 | 5/2015 | Kleijn et al. |
| 9,123,350 B2 | 9/2015 | Zhao et al. |
| 9,489,961 B2 | 11/2016 | Kovesi et al. |
| 9,595,262 B2 | 3/2017 | Fuchs et al. |
| 10,726,854 B2 | 7/2020 | Ghido et al. |
| 2001/0026327 A1* | 10/2001 | Schreiber ........... H04N 21/4347 348/518 |
| 2003/0101050 A1 | 5/2003 | Ouperman et al. |
| 2005/0010395 A1* | 1/2005 | Chiu .................... G10L 19/035 704/200.1 |
| 2005/0015249 A1 | 1/2005 | Chen et al. |
| 2005/0192799 A1 | 9/2005 | Kim et al. |
| 2005/0246178 A1 | 11/2005 | Fejzo |
| 2006/0288851 A1 | 12/2006 | Esima et al. |
| 2007/0033056 A1 | 2/2007 | Groeschl et al. |
| 2007/0078646 A1 | 4/2007 | Lei et al. |
| 2007/0118369 A1 | 5/2007 | Chen |
| 2007/0127729 A1 | 6/2007 | Breebaart et al. |
| 2007/0129940 A1 | 6/2007 | Geyersberger et al. |
| 2007/0276656 A1 | 11/2007 | Solbach et al. |
| 2008/0033718 A1* | 2/2008 | Zopf ..................... G10L 19/005 704/229 |
| 2008/0126086 A1 | 5/2008 | Kandhadai et al. |
| 2008/0126096 A1 | 5/2008 | Choo et al. |
| 2009/0076805 A1 | 3/2009 | Du et al. |
| 2009/0076830 A1 | 3/2009 | Taleb |
| 2009/0089050 A1 | 4/2009 | Mo et al. |
| 2009/0138267 A1 | 5/2009 | Davidson et al. |
| 2009/0254352 A1 | 10/2009 | Zhao |
| 2010/0010810 A1 | 1/2010 | Morii |
| 2010/0070270 A1 | 3/2010 | Gao |
| 2010/0094637 A1 | 4/2010 | Vinton |
| 2010/0115370 A1 | 5/2010 | Ramo et al. |
| 2010/0198588 A1 | 8/2010 | Osada et al. |
| 2010/0223061 A1 | 9/2010 | Ojanpera |
| 2010/0312552 A1 | 12/2010 | Kandhadai et al. |
| 2010/0312553 A1 | 12/2010 | Fang et al. |
| 2010/0324912 A1 | 12/2010 | Oh et al. |
| 2011/0015768 A1 | 1/2011 | Soo et al. |
| 2011/0022924 A1 | 1/2011 | Malenovsky et al. |
| 2011/0035212 A1 | 2/2011 | Briand et al. |
| 2011/0060597 A1 | 3/2011 | Chen et al. |
| 2011/0071839 A1 | 3/2011 | Budnikov et al. |
| 2011/0095920 A1 | 4/2011 | Ashley et al. |
| 2011/0096830 A1 | 4/2011 | Ashley et al. |
| 2011/0116542 A1 | 5/2011 | Antonini et al. |
| 2011/0125505 A1 | 5/2011 | Gournay et al. |
| 2011/0145003 A1 | 6/2011 | Bessette |
| 2011/0196673 A1 | 8/2011 | Park et al. |
| 2011/0200198 A1 | 8/2011 | Bayer et al. |
| 2011/0238425 A1 | 9/2011 | Lecomte et al. |
| 2011/0238426 A1 | 9/2011 | Borsum et al. |
| 2012/0010879 A1 | 1/2012 | Kikuiri et al. |
| 2012/0022881 A1 | 1/2012 | Geiger et al. |
| 2012/0072209 A1 | 3/2012 | Krishnan et al. |
| 2012/0109659 A1 | 5/2012 | Chen et al. |
| 2012/0214544 A1 | 8/2012 | Rodriguez et al. |
| 2012/0245947 A1* | 9/2012 | Neuendorf ............ G10L 19/022 704/500 |
| 2012/0265540 A1 | 10/2012 | Fuchs et al. |
| 2012/0265541 A1 | 10/2012 | Geiger et al. |
| 2013/0030819 A1 | 1/2013 | Pontus et al. |
| 2013/0096912 A1 | 4/2013 | Resch et al. |
| 2013/0226594 A1* | 8/2013 | Fuchs .................. G10L 19/0017 704/500 |
| 2013/0282369 A1 | 10/2013 | Ryu et al. |
| 2014/0052439 A1 | 2/2014 | Nanjundaswamy et al. |
| 2014/0067404 A1 | 3/2014 | Baumgarte |
| 2014/0074486 A1 | 3/2014 | Dietz et al. |
| 2014/0108020 A1 | 4/2014 | Bai et al. |
| 2014/0142957 A1 | 5/2014 | Lee et al. |
| 2014/0223029 A1 | 8/2014 | Bhaskar et al. |
| 2014/0358531 A1 | 12/2014 | Vos |
| 2015/0010155 A1 | 1/2015 | Lang et al. |
| 2015/0081312 A1 | 3/2015 | Fuchs et al. |
| 2015/0142452 A1 | 5/2015 | Lee et al. |
| 2015/0154969 A1 | 6/2015 | Craven et al. |
| 2015/0170668 A1 | 6/2015 | Kovesi et al. |
| 2015/0221311 A1 | 8/2015 | Jeon et al. |
| 2015/0228287 A1 | 8/2015 | Bruhn et al. |
| 2015/0255079 A1 | 9/2015 | Huang et al. |
| 2015/0302859 A1 | 10/2015 | Aguilar et al. |
| 2015/0325246 A1 | 11/2015 | Chen et al. |
| 2015/0371647 A1 | 12/2015 | Faure et al. |
| 2016/0019898 A1* | 1/2016 | Schreiner ................ G10L 19/02 704/500 |
| 2016/0027450 A1 | 1/2016 | Gao |
| 2016/0078878 A1 | 3/2016 | Ravelli et al. |
| 2016/0111094 A1 | 4/2016 | Dietz et al. |
| 2016/0189721 A1 | 6/2016 | Johnston et al. |
| 2016/0225384 A1 | 8/2016 | Kjörling et al. |
| 2016/0285718 A1 | 9/2016 | Bruhn |
| 2016/0293174 A1 | 10/2016 | Atti et al. |
| 2016/0293175 A1 | 10/2016 | Atti et al. |
| 2016/0307576 A1 | 10/2016 | Doehla et al. |
| 2016/0365097 A1* | 12/2016 | Guan ...................... G10L 25/90 |
| 2016/0372125 A1 | 12/2016 | Atti et al. |
| 2016/0372126 A1 | 12/2016 | Atti et al. |
| 2016/0379655 A1 | 12/2016 | Truman et al. |
| 2017/0011747 A1 | 1/2017 | Faure et al. |
| 2017/0053658 A1 | 2/2017 | Atti et al. |
| 2017/0078794 A1 | 3/2017 | Bongiovi et al. |
| 2017/0103769 A1 | 4/2017 | Laaksonen et al. |
| 2017/0110135 A1 | 4/2017 | Disch et al. |
| 2017/0133029 A1* | 5/2017 | Markovic ................ G10L 19/12 |
| 2017/0140769 A1 | 5/2017 | Ravelli et al. |
| 2017/0154631 A1 | 6/2017 | Bayer et al. |
| 2017/0154635 A1 | 6/2017 | Doehla et al. |
| 2017/0221495 A1 | 8/2017 | Sung et al. |
| 2017/0236521 A1 | 8/2017 | Atti et al. |
| 2017/0256266 A1 | 9/2017 | Sung et al. |
| 2017/0294196 A1 | 10/2017 | Bradley et al. |

(56) References Cited

U.S. PATENT DOCUMENTS

| | | |
|---|---|---|
| 2017/0303114 A1 | 10/2017 | Johansson et al. |
| 2019/0027156 A1 | 1/2019 | Sung et al. |

FOREIGN PATENT DOCUMENTS

| | | |
|---|---|---|
| CN | 107103908 A | 8/2017 |
| EP | 0716787 A1 | 6/1996 |
| EP | 0732687 B2 | 9/1996 |
| EP | 1791115 A2 | 5/2007 |
| EP | 2676266 B1 | 12/2013 |
| EP | 2980796 A1 | 2/2016 |
| EP | 2980799 A1 | 2/2016 |
| EP | 3111624 A1 | 1/2017 |
| FR | 2944664 A1 | 10/2010 |
| JP | H05-281996 A | 10/1993 |
| JP | H07-28499 A | 1/1995 |
| JP | H0811644 A | 1/1996 |
| JP | H9-204197 A | 8/1997 |
| JP | H10-51313 A | 2/1998 |
| JP | H1091194 A | 4/1998 |
| JP | H11-330977 A | 11/1999 |
| JP | 2004-138756 A | 5/2004 |
| JP | 2006-527864 A | 12/2006 |
| JP | 2007-525718 A | 9/2007 |
| JP | 2009-003387 A | 1/2009 |
| JP | 2009-008836 A | 1/2009 |
| JP | 2009-538460 A | 11/2009 |
| JP | 2010-500631 A | 1/2010 |
| JP | 2010-501955 A | 1/2010 |
| JP | 2012-533094 A | 12/2012 |
| JP | 2016-523380 A | 8/2016 |
| JP | 2016-200750 A | 12/2016 |
| JP | 2017-522604 A | 8/2017 |
| JP | 2017-528752 A | 9/2017 |
| KR | 100261253 B1 | 7/2000 |
| KR | 20030031936 A | 4/2003 |
| KR | 10-2010-0136890 A | 12/2010 |
| KR | 20130019004 A | 2/2013 |
| KR | 20170000933 A | 1/2017 |
| RU | 2337414 C2 | 10/2008 |
| RU | 2376657 C2 | 12/2009 |
| RU | 2413312 C2 | 2/2011 |
| RU | 2419891 C2 | 5/2011 |
| RU | 2439718 C1 | 1/2012 |
| RU | 2483365 C2 | 5/2013 |
| RU | 2520402 C2 | 6/2014 |
| RU | 2568381 C2 | 11/2015 |
| RU | 2596594 C2 | 9/2016 |
| RU | 2596596 C2 | 9/2016 |
| RU | 2015136540 A | 3/2017 |
| RU | 2628162 C2 | 8/2017 |
| RU | 2016105619 A | 8/2017 |
| TW | 200809770 A | 2/2008 |
| TW | 201005730 A | 2/2010 |
| TW | 201126510 A | 8/2011 |
| TW | 201131550 A | 9/2011 |
| TW | 201207839 A | 2/2012 |
| TW | 201243832 A | 11/2012 |
| TW | 201612896 A | 4/2016 |
| TW | 201618080 A | 5/2016 |
| TW | 201618086 A | 5/2016 |
| TW | 201642246 A | 12/2016 |
| TW | 201642247 A | 12/2016 |
| TW | 201705126 A | 2/2017 |
| TW | 201711021 A | 3/2017 |
| TW | 201713061 A | 4/2017 |
| TW | 201724085 A | 7/2017 |
| TW | 201732779 A | 9/2017 |
| WO | 9916050 A1 | 4/1999 |
| WO | 2004/072951 A1 | 8/2004 |
| WO | 2005/086138 A1 | 9/2005 |
| WO | 2005/086139 A1 | 9/2005 |
| WO | 2007/073604 A1 | 7/2007 |
| WO | 2007/138511 A1 | 12/2007 |
| WO | 2008/025918 A1 | 3/2008 |
| WO | 2008/046505 A1 | 4/2008 |
| WO | 2009/066869 A1 | 5/2009 |
| WO | 2011/048118 A1 | 4/2011 |
| WO | 2011/086066 A1 | 7/2011 |
| WO | 2011/086067 A1 | 7/2011 |
| WO | 2012/000882 A | 1/2012 |
| WO | 2012/000882 A1 | 1/2012 |
| WO | 2012/126893 A | 9/2012 |
| WO | 2014/165668 A | 10/2014 |
| WO | 2014/202535 A | 12/2014 |
| WO | 2014/202535 A1 | 12/2014 |
| WO | 2015/063045 A1 | 5/2015 |
| WO | 2015/063227 A1 | 5/2015 |
| WO | 2015/071173 A1 | 5/2015 |
| WO | 2015/174911 A1 | 11/2015 |
| WO | 2016/016121 A1 | 2/2016 |
| WO | 2016/142002 A1 | 9/2016 |
| WO | 2016/142337 A1 | 9/2016 |

OTHER PUBLICATIONS

Sujoy Sarkar, "Examination Report for IN Application No. 202037018091", dated Jun. 1, 2021, Intellectual Property India, India.

ETSI TS 126 445 V13.2.0 (Aug. 2016), Universal Mobile Telecommunications System (UMTS); LTE; Codec for Enhanced Voice Services (EVS); Detailed algorithmic description (3GPP TS 26.445 version 13.2.0 Release 13) [Online]. Available: http://www.3gpp.org/ftp/Specs/archive/26_series/26.445/26445-d00.zip.

Geiger, "Audio Coding based on integer transform", Ilmenau: https://www.db-thueringen.de/receive/dbt_mods_00010054, 2004.

Henrique S Malvar, "Biorthogonal and Nonuniform Lapped Transforms for Transform Coding with Reduced Blocking and Ringing Artifacts", IEEE Transactions on Signal Processing, IEEE Service Center, New York, NY, US, (Apr. 1998), vol. 46, No. 4, ISSN 1053-587X, XP011058114.

Anonymous, "ISO/IEC 14496-3:2005/FDAM 9, AAC-ELD", 82. MPEG Meeting;Oct. 22, 2007-Oct. 26, 2007; Shenzhen; (Motion Picture Expert Group or ISO/IEC JTC1/SC29/WG11),, (Feb. 21, 2008), No. N9499, XP030015994.

Virette, "Low Delay Transform for High Quality Low Delay Audio Coding", Universite de Rennes 1, (Dec. 10, 2012), pp. 1-195, URL: https://hal.inria.fr/tel-01205574/document, (Mar. 30, 2016), XP055261425.

ISO/IEC 14496-3:2001; Information technology—Coding of audio-visual objects—Part 3: Audio.

3GPP TS 26.403 v14.0.0 (Mar. 2017); General audio codec audio processing functions; Enhanced acPlus general audio codec; Encoder specification; Advanced Audio Coding (AAC) part; (Release 14).

ISO/IEC 23003-3; Information technology—MPEG audio technologies—Part 3: Unified speech and audio coding, 2011.

3GPP TS 26.445 V14.1.0 (Jun. 2017), 3rd Generation Partnership Project; Technical Specification Group Services and System Aspects; Codec for Enhanced Voice Services (EVS); Detailed Algorithmic Description (Release 14), http://www.3gpp.org/ftp//Specs/archive/26_series/26.445/26445-e10.zip, Section 5.1.6 "Bandwidth detection".

Eksler Vaclav et al., "Audio bandwidth detection in the EVS codec", 2015 IEEE Global Conference on Signal and Information Processing (GLOBALSIP), IEEE, (Dec. 14, 2015), doi:10.1109/GLOBALSIP. 2015.7418243, pp. 488-492, XP032871707.

Oger M et al, "Transform Audio Coding with Arithmetic-Coded Scalar Quantization and Model-Based Bit Allocation", International Conference on Acoustics, Speech, and Signalprocessing, IEEE, XX,Apr. 15, 2007 (Apr. 15, 2007), p. IV-545, XP002464925.

Asad et al., "An enhanced least significant bit modification technique for audio steganography", International Conference on Computer Networks and Information Technology, Jul. 11-13, 2011.

Makandar et al., "Least Significant Bit Coding Analysis for Audio Steganography", Journal of Future Generation Computing, vol. 2, No. 3, Mar. 2018.

ISO/IEC 23008-3:2015; Information technology—High efficiency coding and media delivery in heterogeneous environments—Part 3: 3D audio.

(56) References Cited

OTHER PUBLICATIONS

ITU-T G.718 (Jun. 2008): Series G: Transmission Systems and Media, Digital Systems and Networks, Digital terminal equipments—Coding of voice and audio signals, Frame error robust narrow-band and wideband embedded variable bit-rate coding of speech and audio from 8-32 kbit/s.
3GPP TS 26.447 V14.1.0 (Jun. 2017), Technical Specification, 3rd Generation Partnership Project; Technical Specification Group Services and System Aspects; Codec for Enhanced Voice Services (EVS); Error Concealment of Lost Packets (Release 14).
DVB Organization, "ISO-IEC 23008-3_A3_(E)_(H 3DA FDAM3).docx", DVB, Digital Video Broadcasting, C/O EBU—17A Ancienne Route—CH-1218 Grand Saconnex, Geneva—SWITZERLAND, (Jun. 13, 2016), XP017851888.
Hill et al., "Exponential stability of time-varying linear systems," IMA J Numer Anal, pp. 865-885, 2011.
3GPP TS 26.090 V14.0.0 (Mar. 2017), 3rd Generation Partnership Project; Technical Specification Group Services and System Aspects; Mandatory Speech Codec speech processing functions; Adaptive Multi-Rate (AMR) speech codec Transcoding functions (Release 14).
3GPP TS 26.190 V14.0.0 (Mar. 2017), Technical Specification, 3rd Generation Partnership Project; Technical Specification Group Services and System Aspects; Speech codec speech processing functions; Adaptive Multi-Rate-Wideband (AMR-WB) speech codec; Transcoding functions (Release 14).
3GPP TS 26.290 V14.0.0 (Mar. 2017), Technical Specification, 3rd Generation Partnership Project; Technical Specification Group Services and System Aspects; Audio codec processing functions; Extended Adaptive Multi-Rate-Wideband (AMR-WB+) codec; Transcoding functions (Release 14).
Edler et al., "Perceptual Audio Coding Using a Time-Varying Linear Pre- and Post-Filter," in AES 109th Convention, Los Angeles, 2000.
Gray et al., "Digital lattice and ladder filter synthesis," IEEE Transactions on Audio and Electroacoustics, vol. vol. 21, no. No. 6, pp. 491-500, 1973.
Lamoureux et al., "Stability of time variant filters," CREWES Research Report—vol. 19, 2007.
Herre et al., "Enhancing the performance of perceptual audio coders by using temporal noise shaping (TNS)." Audio Engineering Society Convention 101. Audio Engineering Society, 1996.
Herre et al., "Continuously signal-adaptive filterbank for high-quality perceptual audio coding." Applications of Signal Processing to Audio and Acoustics, 1997. 1997 IEEE ASSP Workshop on. IEEE, 1997.
Herre, "Temporal noise shaping, quantization and coding methods in perceptual audio coding: A tutorial ntroduction." Audio Engineering Society Conference: 17th International Conference: High-Quality Audio Coding. Audio Engineering Society, 1999.
Fuchs Guillaume et al., "Low delay LPC and MDCT-based audio coding in the EVS codec", 2015 IEEE International Conference on Acoustics, Speech and Signal Processing (ICASSP), IEEE, (Apr. 19, 2015), doi: 10.1109/ICASSP.2015.7179068, pp. 5723-5727, XP033187858.
Niamut et al., "RD Optimal Temporal Noise Shaping for Transform Audio Coding", Acoustics, Speech and Signal Processing, 2006. ICASSP 2006 PROCEEDINGS. 2006 IEEE International Conference on Toulouse, France May 14-19, 2006, Piscataway, NJ, USA,IEEE, Piscataway, NJ, USA, (Jan. 1, 2006), doi:10.1 109/ICASSP.2006.1661244, ISBN 978-1-4244-0469-8, pp. V-V, XP031015996.
ITU-T G.711 (Sep. 1999): Series G: Transmission Systems and Media, Digital Systems and Networks, Digital transmission systems—Terminal equipments—Coding of analogue signals by pulse code modulation, Pulse code modulation (PCM) of voice frequencies, Appendix I: A high quality low-complexity algorithm for packet loss concealment with G.711.
Cheveigne et al.,"YIN, a fundamental frequency estimator for speech and music." The Journal of the Acoustical Society of America 111.4 (2002): 1917-1930.
Ojala P et al, "A novel pitch-lag search method using adaptive weighting and median filtering", Speech Coding Proceedings, 1999 IEEE Workshop on Porvoo, Finland Jun. 20-23, 1999, Piscataway, NJ, USA, IEEE, US, (Jun. 20, 1999), doi:10.1109/SCFT.1999.781502, ISBN 978-0-7803-5651-1, pp. 114-116, XP010345546.
"5 Functional description of the encoder", Dec. 10, 2014 (Dec. 10, 2014), 3GPP Standard; 26445-C10_1_S05_S0501, 3rd Generation Partnership Project (3GPP)?, Mobile Competence Centre 350, Route Des Lucioles ; F-06921 Sophia-Antipolis Cedex; France Retrieved from the Internet:URL: http://www.3gpp.org/ftp/Specs/2014-12/Rel-12/26_series/ XP050907035.
P.A. Volkov, "Office Action for RU Application No. 2020120251", dated Oct. 28, 2020, ROSPATENT, Russia.
P.A. Volkov, "Office Action for RU Application No. 2020120256", dated Oct. 28, 2020, ROSPATENT, Russia.
D.V.Travnikov, "Decision on Grant for RU Application No. 2020118969", dated Nov. 2, 2020, ROSPATENT, Russia.
Guojun Lu et al., "A Technique towards Automatic Audio Classification and Retrieval, Forth International Conference an Signal Processing", 1998, IEEE, Oct. 12, 1998, pp. 1142 to 1145.
Hiroshi Ono, "Office Action for JP Application No. 2020-526135", dated May 21, 2021, JPO Japan.
Tetsuyuki Okumachi, "Office Action for JP Application 2020-118837", dated Jul. 16, 2021, JPO, Japan.
Tetsuyuki Okumachi, "Office Action for JP Application 2020-118838", dated Jul. 16, 2021, JPO, Japan.
Tomonori Kikuchi, "Office Action for JP Application No. 2020-524874", dated Jun. 2, 2021, JPO Japan.
ROSPATENT Examiner, "Decision on Grant Patent for Invention for RU Application No. 2020118949", Nov. 11, 2020, ROSPATENT, Russia.
Mao Xiaohong, "Examination Report for SG Application No. 11202004228V", dated Sep. 2, 2021, IPOS, Singapore.
Mao Xiaohong, "Search Report for SG Application No. 11202004228V", dated Sep. 3, 2021, IPOS, Singapore.
Nam Sook Lee, "Office Action for KR Application No. 10-2020-7015512", dated Sep. 9, 2021, KIPO, Republic of Korea.
D.E. Groshev, "Office Action for RU Application No. 2020118947", dated Dec. 1, 2020, ROSPATENT, Russia.
O.I. STARUKHINA, "Office Action for RU Application No. 2020118968", dated Dec. 23, 2020, ROSPATENT, Russia.
Santosh Mehtry, "Office Action for IN Application No. 202037019203", dated Mar. 19, 2021, Intellectual Property India, India.
Hiroshi Ono, "Office Action for JP Application No. 2020-526081", dated Jun. 22, 2021, JPO, Japan.
Hiroshi Ono, "Office Action for JP Application No. 2020-526084", dated Jun. 23, 2021, JPO, Japan.
Khalid Sayood, "Introduction to Data Compression", Elsevier Science & Technology, 2005, Section 16.4, Figure 16. 13, p. 526.
Patterson et al., "Computer Organization and Design", The hardware/software Interface, Revised Fourth Edition, Elsevier, 2012.
Kazunori Mochimura, "Decision to Grant a Patent for JP application No. 2020-524579", dated Nov. 25, 2021, JPO, Japan.
Takeshi Yamashita, "Office Action for JP Application 2020-524877", dated Jun. 24, 2021, JPO, Japan.
Dietz, Martin et al., "Overview of the EVS codec architecture." 2015 IEEE International Conference on Acoustics, Signal Processing (ICASSP), IEEE, 2015.
International Telecommunication Union, "G. 729-based embedded variable bit-rate coder: An 8-32 kbit/s scalable wideband coder bitstream interoperable with G.729". ITU-T Recommendation G.729.1., May 2006.
3GGP TS 26.445, "Universal Mobile TElecommunications System (UMTS); LTE; Codec for Enhanced Voice Services (EVS); Detailed algorithmic description (3GPP TS 26.445 version 13.4.1 Release 13)", ETSI TS 126 445 V13.4.1., Apr. 2017.
Nam Sook Lee, "Office Action for KR Application No. 10-2020-7016100", dated Jan. 13, 2022, KIPO, Republic of Korea.
Nam Sook Lee, "Office Action for KR Application No. 10-2020-7016224", dated Jan. 13, 2022, KIPO, Republic of Korea.
Nam Sook Lee, "Office Action for KR Application No. 10-2020-7015835", dated Jan. 13, 2022, KIPO, Republic of Korea.

(56) References Cited

OTHER PUBLICATIONS

Nam Sook Lee, "Office Action for KR Application No. 10-2020-7016424", dated Feb. 9, 2022, KIPO, Korea.
Nam Sook Lee, "Office Action for KR Application No. 10-2020-7016503", dated Feb. 9, 2022, KIPO, Korea.

* cited by examiner

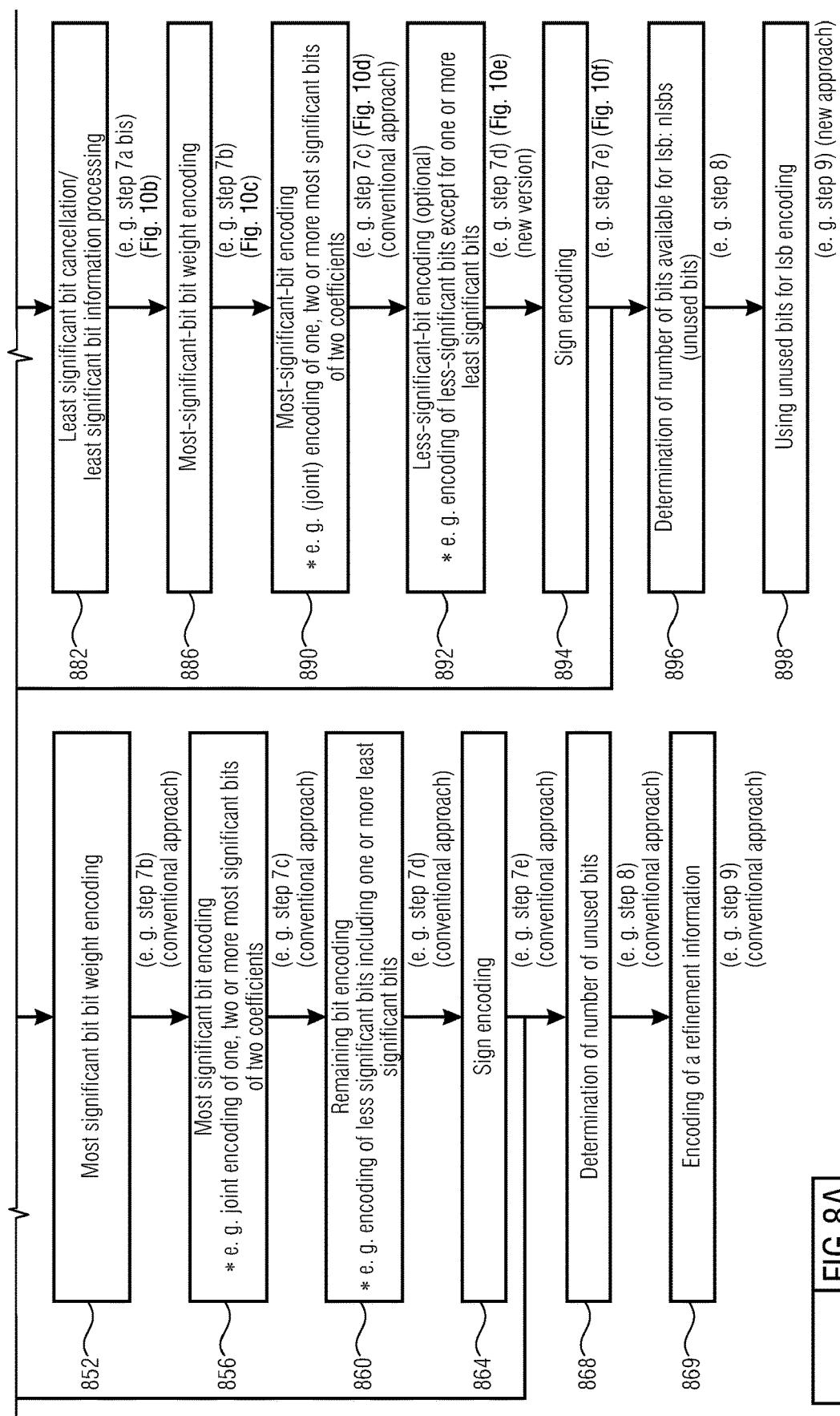

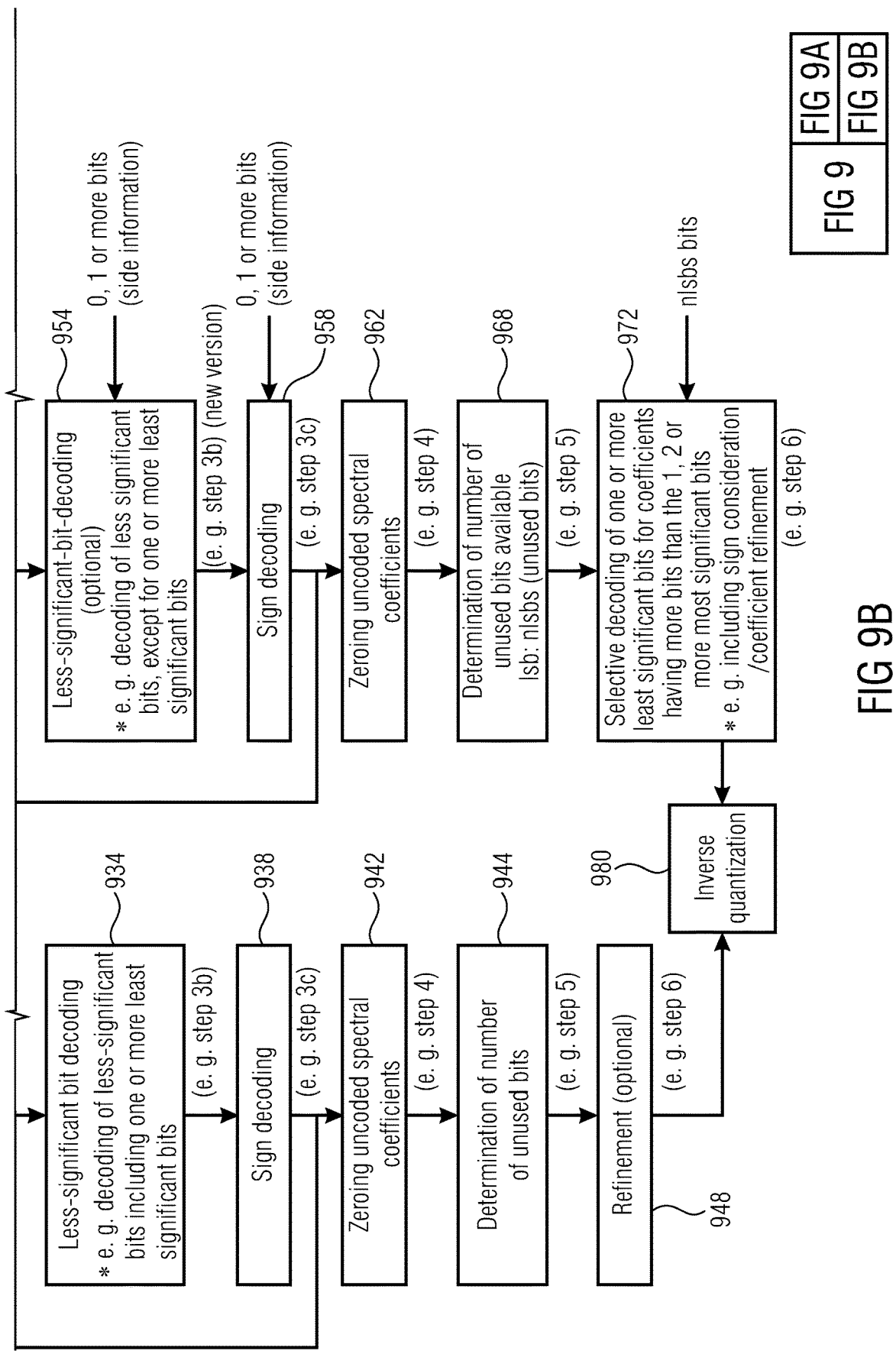

- Step 7a: compute the minimum number of bits needed to represent the amplitude of the two coefficients $X_q(n)$ and $X_q(n+1)$

```
numbits = ceil(log2(max(abs(Xq[n]), abs(Xq[n+1])) + 1));    ← 1000a
```

Fig. 10a

- Step 7a-bis: this is an additional step just after Step 7a, which is performed if *numbits* > 2. The least significant bit of each coefficient is saved, and the coefficient is then modified such that its LSB is now zero. The sign of the coefficient is also saved in case the coefficient was originally non-zero and becomes zero after setting its LSB to zero.

```
if (numbits > 2)
{
    bit = abs(Xq[n]) & 1;                          ← 1010a
    lsbs[nlsbs++] = bit;                           ← 1010b
    if (bit != 0 && (abs(Xq[n]) & FFFE) == 0)      ← 1010c
    {
        bit = 0;
        if (Xq[n]] < 0) {                          ← 1010d
            bit = 1;
        }
        lsbs[nlsbs++] = bit;                       ← 1010e
    }
    Xq[n] = (Xq[n]/2)*2;                           ← 1010f
    bit = abs(Xq[n+1]) & 1;                        ← 1011a
    lsbs[nlsbs++] = bit;                           ← 1011b
    if (bit != 0 && (abs(Xq[n+1]) & FFFE) == 0)    ← 1011c
    {
        bit = 0;
        if (Xq[n+1]] < 0) {                        ← 1011d
            bit = 1;
        }
        lsbs[nlsbs++] = bit;                       ← 1011e
    }
    Xq[n+1] = (Xq[n+1]/2)*2;                       ← 1011f
}
```

Fig. 10b

- Step 7b: encode *numbits*-2 escape values (VAL_ESC=16) if *numbits*>2

```
for (b = 0; b < numbits-2; b++) {
    Get probabilities p from context c
    Encode escape symbol VAL_ESC with ari. enc. and probabilities p
    Update context c
}
```
⎫
⎬ 1020a
⎭

Fig. 10c

- Step 7c: encode the 2 most significant bits of both coefficients $X_q(n)$ and $X_q(n+1)$ as a single symbol sym (whose value lies between 0 and 15)

```
s = max(0, numbits-2);                     ← 1040a
a = abs(Xq[n]) >> s;                       ← 1040b
b = abs(Xq[n+1]) >> s;                     ← 1040c
sym = a + 4*b;                             ← 1040d
Get probabilities p from context c
Encode symbol sym with ari. enc. and probabilities p
Update context c
```

Fig. 10d

- Step 7d: encode the remaining bits expert the least significant bit

```
for (b = 1; b < numbits-2; b++) {          ← 1050a
    bit0 = (abs(Xq[n]) >> b) & 1;         ⎱ ← 1050b
    Encode bit0 as side-information       ⎰
    bit1 = (abs(Xq[n+1]) >> b) & 1;       ⎱ ← 1050c
    Encode bit1 as side-information       ⎰
}
```

Fig. 10e

- Step 7e: encode the sign of each coefficient, except if the coefficient is zero

```
if (X_q[n] != 0) {                              ← 1060a
    bit0 = 0;
    if (X_q[n] < 0) {                           ← 1060b
        bit0 = 1;
    }
    Encode bit0 as side-information             ← 1060c
}
if (X_q[n+1] != 0) {                            ← 1061a
    bit1 = 0;
    if (X_q[n+1] < 0) {                         ← 1061b
        bit1 = 1;
    }
    Encode bit1 as side-information             ← 1061c
}
```

Fig. 10f

- Step 3a: decode the 2 most significant bits of both coefficients $X_q(n)$ and $X_q(n+1)$

```
numbits = 1;                                                    ← 1110a
do {
    Get probabilities p from context c                          ← 1110b
    Decode symbol sym with ari. dec. and probabilities p        ← 1110c
    Update context c                                            ← 1110d
    numbits++;
} while (sym==VAL_ESC)                                          ← 1110e
X_q[n]   = (sym & 3) << (numbits-2);                            ← 1110f
X_q[n+1] = (sym >> 2) << (numbits-2);                           ← 1110g
```

Fig. 11a

- Step 3b: decode the remaining bits expert the least significant bit
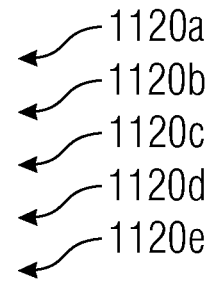
```
for (b = 1; b < numbits-2; b++) {          1120a
    Decode bit0                             1120b
    X_q[n] += bit0 << b                     1120c
    Decode bit1                             1120d
    X_q[n+1] += bit1 << b                   1120e
}
```
Fig. 11b
- Step 3c: decode the sign of each coefficient, except if the coefficient is zero
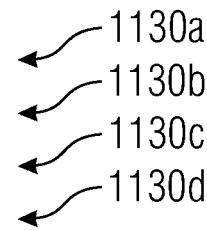
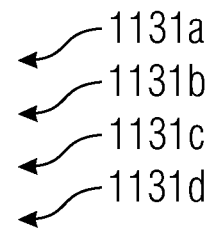
```
if (X_q[n] != 0) {                          1130a
    Decode bit0                             1130b
    if (bit0 == 1) {                        1130c
        X_q[n] = -X_q[n];                   1130d
    }
}
if (X_q[n+1] != 0) {                        1131a
    Decode bit1                             1131b
    if (bit1 == 1) {                        1131c
        X_q[n+1] = -X_q[n+1];               1131d
    }
}
```
Fig. 11c

- Step 6: if there are unused bits, decode *nlsbs* bits and store them in *lsbs[]*. Then refine the coefficients (n, n+1) if numbits[n] > 2 using the decoded LSB bits

```
k = 0;                                           ← 1140a
for (n = 0; n < lastnz; n+=2) {                  ← 1140b
    if (numbits[n] > 2) {                        ← 1140c
        if (k == nlsbs) {
            break;                               ← 1140d
        }
        bit0 = lsbs[k++];                        ← 1140e
        if (bit0 == 1) {
            if (Xq[n] > 0) {
                Xq[n] += 1;                      ← 1140f
            } else if (Xq[n] < 0) {
                Xq[n] -= 1;                      ← 1140g
            } else {
                if (k == nlsbs) {
                    break;                       ← 1140h
                }
                bit1 = lsbs[k++];                ← 1140i
                Xq[n] = 1 - 2*bit1;              ← 1140j
            }
        }
        if (k == nlsbs) {
            break;                               ← 1141d
        }
        bit0 = lsbs[k++];                        ← 1141e
        if (bit0 == 1) {
            if (Xq[n+1] > 0) {
                Xq[n+1] += 1;                    ← 1141f
            } else if (Xq[n+1] < 0) {
                Xq[n+1] -= 1;                    ← 1141g
            } else {
                if (k == nlsbs) {
                    break;                       ← 1141h
                }
                bit1 = lsbs[k++];                ← 1141i
                Xq[n+1] = 1 - 2*bit1;            ← 1141j
            }
        }
    }
}
```

Fig. 11d

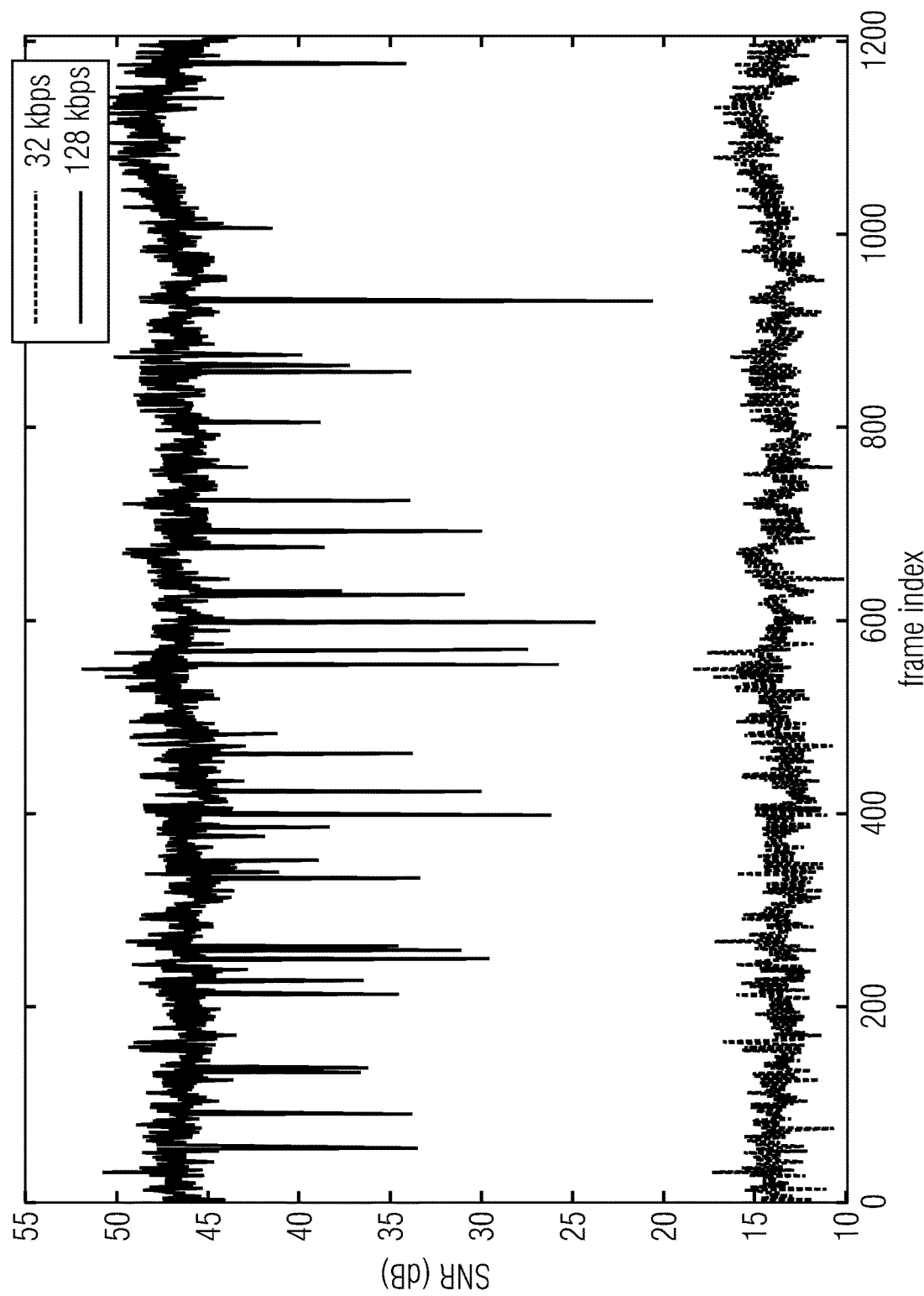

Obtaining decoded spectral values (132; 232; 732; $X_q[n]$, $X_q[n+1]$ ) on the basis of an encoded information (130; 230) representing the spectral values;

Jointly decoding (950; 1110a-1110g) two or more most significant bits per spectral value on the basis of respective symbol codes (sym) for a set of spectral values using an arithmetic decoding, wherein a respective symbol code (sym) represents two or more most significant bits per spectral value for one or more spectral values, Decoding (972; 1140a-1141j) one or more least significant bits associated with one or more of the spectral values in dependence on how much least significant bit information is available, such that one or more least significant bits associated with one or more of the spectral values are decoded, while no least significant bits are decoded for one or more other spectral values for which one or more most significant bits are decoded and which comprise more bits than the one or more most significant bits; and Providing the decoded audio information using the spectral values.

Fig. 14

```
┌─────────────────────────────────────────────────────────────────┐
│ Obtaining decoded spectral values (132; 232; 732; X_q[n], X_q[n+1]) on the │
│ basis of an encoded information (130; 230) representing the spectral values, │
│                                                                  │
│  ┌───────────────────────────────────────────────────────────┐  │
│  │ Selecting between                                         │  │
│  │                                                           │  │
│  │ – a first mode (930, 934, 938, 942, 944, 948) in which a decoding │
│  │   of spectral values in a higher frequency range is omitted in response │
│  │   to a signaling from the encoder and in which least significant bits are │
│  │   decoded (934) for all spectral values for which one or more most │
│  │   significant bits are decoded and which comprise more bits than the │
│  │   most significant bits, and                              │  │
│  │                                                           │  │
│  │ – a second mode (950, 954, 958, 962, 968, 972) in which one or │
│  │   more least significant bits associated with one or more of the spectral │
│  │   values are decoded, while no least significant bits are decoded for │
│  │   one or more other spectral values for which one or more most │
│  │   significant bits have been decoded and which comprise more bits │
│  │   than the most significant bits; and                     │  │
│  └───────────────────────────────────────────────────────────┘  │
│                              │                                   │
│                              ▼                                   │
│  ┌───────────────────────────────────────────────────────────┐  │
│  │ Decoding (950; 1110a-1110g) one or more most significant bits │
│  │ on the basis of respective symbol codes (sym) for a plurality of │
│  │      spectral values (X_q[0]...X_q[lastnz-1]),            │  │
│  └───────────────────────────────────────────────────────────┘  │
│                              │                                   │
│                              ▼                                   │
│  ┌───────────────────────────────────────────────────────────┐  │
│  │        Decoding one or more least significant bits        │  │
│  │           for one or more of the spectral values          │  │
│  └───────────────────────────────────────────────────────────┘  │
│                              │                                   │
│                              ▼                                   │
│  ┌───────────────────────────────────────────────────────────┐  │
│  │  Providing the decoded audio information using the spectral values. │
│  └───────────────────────────────────────────────────────────┘  │
└─────────────────────────────────────────────────────────────────┘
```

Fig. 15

Obtaining (620, 630, 640, 650, 660) spectral values (330; 662; $X_q[n]$) representing an audio content of the input audio information Encoding (670; 800) at least a plurality of the spectral values, in order to obtain an encoded information (350, 450, 550, 672; sym, lsbs[]) representing the spectral values;

Wherein the method comprises jointly encoding (878, 886, 890; 1000a, 1020a, 1040a-1040d) two or more most significant bits per spectral value, to obtain respective symbol codes (sym) for a set of spectral values ($X_q[0]...X_q[lastnz-1]$), using an arithmetic encoding, wherein a respective symbol code (sym) represents two or more most significant bits per spectral value for one or more spectral values, Encoding (882; 898; 1010a-1010e, 1011a-1011e) one or more least significant bits associated with one or more of the spectral values in dependence on a bit budget available, such that one or more least significant bits associated with one or more of the spectral values are encoded, while no least significant bits are encoded for one or more other spectral values for which two or more most significant bits are encoded and which comprise more bits than the two or more most significant bits; and Providing the encoded audio information using the encoded information representing the spectral values.

Fig. 16

AUDIO ENCODERS, AUDIO DECODERS, METHODS AND COMPUTER PROGRAMS ADAPTING AN ENCODING AND DECODING OF LEAST SIGNIFICANT BITS

CROSS-REFERENCE TO RELATED APPLICATIONS

This application is a continuation of copending International Application No. PCT/EP2018/080698, filed Nov. 8, 2018, which is incorporated herein by reference in its entirety, and additionally claims priority from International Application No. PCT/EP2017/078959, filed Nov. 10, 2017, which is also incorporated herein by reference in its entirety.

Embodiments according to the invention are related to audio decoders for providing a decoded audio information on the basis of an encoded audio information.

Further embodiments according to the invention are related to audio encoders for providing an encoded audio information on the basis of an input audio information.

Further embodiments according to the invention are related to methods for providing a decoded audio information on the basis of an encoded audio information.

Further embodiments according to the invention are related to methods for providing an encoded audio information on the basis of an input audio information.

Further embodiments according to the invention are related to respective computer programs.

Embodiments according to the invention are related to an improved truncation of arithmetic encoded audio data.

BACKGROUND OF THE INVENTION

In the past, many different concepts for the encoding and decoding of audio content have been developed.

For example, the New Bluetooth Codec (NBC) is an audio codec which is very similar to a MDCT-based TCX audio codec used in the 3GPP EVS standard [1]. Both employ scalar quantization and context-based arithmetic encoding (confer, for example, references [2] to [4]) for coding the MDCT data.

The scalar quantizer is a simple uniform quantizer (with an additional dead-zone) whose step size is controlled by a unique global-gain (which is, for example, sent to the decoder as side information). This global gain controls both the distortion introduced by the scalar quantizer and also the number of bits consumed by the arithmetic encoder. The higher the global-gain is, the higher is the distortion and the lower is the number of bits consumed by the arithmetic encoder.

In EVS, like in most other communication codecs, the codec bitrate is constant, i.e., there is a limited number of bits (bit budget) available for encoding the MDCT data.

Consequently, the encoder should find (or has to find) a global-gain which is not too low, otherwise the number of bits consumed by the arithmetic encoder would exceed the bit budget. Also, it should (or has to) find a global-gain which is not too high, otherwise the distortion introduced by the quantization would be higher, resulting in worse perceptual quality of the decoded output signal.

Ideally, the encoder should find at every frame the optimal global-gain: the one which gives minimum distortions while producing a number of bits below the bit budget.

This goal can, for example, be achieved using an iterative approach known also as rate-loop: at every iteration of the loop, the MDCT data is re-quantized, the number of bits consumed by the arithmetic encoder is estimated and the global gain is adjusted as a function of the number of bits and/or the distortion.

A rate-loop is, however, computationally complex, and to save complexity, usually a small number of iterations is used. This is particularly relevant for very low power communication codecs (for example, the New Bluetooth Codec) which need very low computational complexity. So, in practice, a suboptimal global-gain is usually found.

It has been found that in some cases, the found global-gain is too high, resulting in a consumed number of bits significantly lower than the bit budget. In this case, there is a number of unused bits. These bits can actually be used by an additional tool called "residual quantization/coding" (which is, for example, used in EVS and NBC). This tool refines the quantized non-zero coefficients using one bit pro coefficient, and helps getting a distortion which is not too high even when the global-gain is too high.

Moreover, it has been found that, in some other cases, the found global-gain is too low, resulting in a consumed number of bits exceeding the bit budget. In this case, the quantized data cannot be entirely encoded. In other words, a portion of the data has to be left out in order to stay within the bit budget. A solution employed in the EVS standard (and also currently in NBC) is to truncate the high-frequency non-zero coefficients, by setting them to zero. Since the arithmetic encoder does not encode the portion of high-frequency zero coefficients (by using a last-non-zero-coefficient index), this approach allows saving bits and if enough high-frequency non-zero coefficients are truncated, this allows to stay within the bit budget.

It has been found that this approach is producing good results at low bitrates because the high-frequency coefficients are perceptually less important and they can be replaced by a random noise (using a noise filling tool, see for example, EVS [1]) without a significant loss in perceptual quality.

However, it has also been found that, at high bitrates, this approach can severely degrade the codec performance.

In view of this situation, there is a desire to have a concept which allows for an improved tradeoff between audio quality, complexity and bitrate.

SUMMARY

An embodiment may have an audio encoder for providing an encoded audio information on the basis of an input audio information, wherein the audio encoder is configured to obtain spectral values representing an audio content of the input audio information, and wherein the audio encoder is configured to encode at least a plurality of the spectral values, in order to obtain an encoded information representing the spectral values; wherein the audio encoder is configured to obtain a gain information which determines quantization steps of a quantization of spectral values, and which determines a bit demand for encoding the quantized spectral values; wherein the audio encoder is configured to encode one or more most significant bits using respective symbol codes for a plurality of the spectral values using an arithmetic encoding, and to encode one or more least significant bits for one or more of the spectral values, wherein a respective symbol code represents one or more most significant bits per spectral value for one or more spectral values, wherein the audio encoder is configured to encode one or more least significant bits associated with one or more of the spectral values in dependence on a bit budget available, such that one or more least significant bits associated with one or more of the spectral values are encoded, while no least significant bits are encoded for one or more other spectral values for which one or more most significant bits are encoded and which include more bits than the one or more most significant bits; and wherein the audio encoder is configured to provide the encoded audio information using the encoded information representing the spectral values.

According to another embodiment, a method for providing an encoded audio information on the basis of an input audio information may have the steps of: obtaining spectral values representing an audio content of the input audio information, and encoding at least a plurality of the spectral values, in order to obtain an encoded information representing the spectral values; obtaining a gain information which determines quantization steps of a quantization of spectral values, and which determines a bit demand for encoding the quantized spectral values; encoding one or more most significant bits using respective symbol codes for a plurality of the spectral values using an arithmetic encoding, and encoding one or more least significant bits for one or more of the spectral values, wherein a respective symbol code represents one or more most significant bits per spectral value for one or more spectral values, encoding one or more least significant bits associated with one or more of the spectral values in dependence on a bit budget available, such that one or more least significant bits associated with one or more of the spectral values are encoded, while no least significant bits are encoded for one or more other spectral values for which one or more most significant bits are encoded and which include more bits than the one or more most significant bits; and providing the encoded audio information using the encoded information representing the spectral values.

Another embodiment may have a non-transitory digital storage medium having a computer program stored thereon to perform the inventive method when said computer program is run by a computer.

An embodiment according to the invention creates an audio decoder for providing a decoded audio information on the basis of an encoded audio information. The audio decoder is configured to obtain the decoded spectral values on the basis of an encoded information representing these spectral values. The audio decoder is configured to jointly decode two or more most significant bits per spectral value (for example, per quantized spectral value) on the basis of respective symbol codes for a set of spectral values using an arithmetic decoding. A respective symbol code represents two or more most significant bits per spectral value for one or more spectral values. The audio decoder is configured to decode one or more least significant bits associated with one or more of the spectral values in dependence on how much least significant bit information is available, such that one or more least significant bits associated with one or more of the spectral values (which may, for example, be quantized spectral values) are decoded, while no least significant bits are decoded for one or more other spectral values for which two or more most significant bits have been decoded and which comprise more bits than the two or more most significant bits. Moreover, the audio decoder is configured to provide the decoded audio information using the (decoded) spectral values.

This audio decoder allows for an efficient encoding/decoding concept which provides for a good tradeoff between audio quality, complexity and bitrate. For example, the audio decoder can well-handle cases in which a bit budget is insufficient in order to encode all (quantized) spectral values at the side of an audio encoder under a given bit budget constraint.

The audio decoder is based on the finding that, for a given bit budget, a comparatively good audio quality can be achieved if one or more most significant bits are encoded (and decoded) for many spectral values (or even for all non-zero spectral values) while omitting the encoding (and the decoding) of the least significant bits of some of the (quantized) spectral values. In other words, it is the key idea of the present invention that a degradation of an audio quality in a case in which a bit budget is insufficient (for example, for a full encoding of quantized spectral values) is often smaller if the encoding and decoding of some least significant bits is omitted when compared to a solution in which an encoding of full spectral values is omitted. Worded differently, it has been found that omitting an encoding of least significant bits of many spectral values is typically still a better solution to reduce a bit demand (to keep within a bit budget) when compared to completely omitting an encoding of a comparatively smaller number of spectral values (even if only spectral values in a high frequency region would be omitted). Wording it differently, the present invention is based on the finding that (selectively) omitting a decoding of least significant bits for spectral values, for which the one or more most significant bits have been decoded is a good way to reduce a bit demand which typically brings along less distortions when compared to an omission of the encoding and decoding of spectral values in a high frequency range.

Accordingly, the audio decoder described here typically does not bring along severe signal-to-noise-ratio degradations in frames in which a bit budget is insufficient for a full lossless encoding of quantized spectral values.

Moreover, it has been found that the concept is particularly efficient in a case in which two or more most significant bits per spectral value are jointly encoded and decoded, because in this case the most significant bits carry a sufficiently meaningful information in order to allow for a good audio representation even in the case that the least significant bits are not encoded and decoded. In other words, by jointly decoding two or more most significant bits per spectral value, it can be ensured that there are no excessive artifacts, which would be caused, for example, by introducing audio content encoded with less than two bits in a high frequency region. In other words, it has been found that the concept mentioned herein provides for a good comprise between bitrate, complexity and audio quality.

In an embodiment, the audio decoder is configured to map one symbol of an arithmetically encoded representation, which represents at least two most significant bits of at least one spectral value, onto the at least two most significant bits of the at least one spectral value. Accordingly, it can be achieved that the two or more most significant bits are represented by a single symbol of the arithmetically encoded representation (which is part of the encoded audio information), which allows for a good consideration of an encoding/decoding context and of statistical dependencies between adjacent (quantized) spectral values.

In an embodiment, the arithmetic decoding is configured to determine bit positions (for example, bit weights) of the at least two most significant bits (for example, designated herein as "numbits" and "numbits-1") and to allocate the at least two most significant bits determined by a symbol of the arithmetically encoded representation to the determined bit positions. The bit positions can be determined, for example, on the basis of a number of so-called "escape symbols", which may also be designated as "VAL_ESC". For example, the bit positions may be determined individually for different symbols of the arithmetically encoded representation. Accordingly, a proper numeric weight can be allocated to the most significant bits, and it can also be found out as to whether one or more least significant bits and one or more intermediate bits (bit positions of which are between the one or more least significant bits and the two or more most significant bits) are associated with a spectral value. Thus, it can be decided whether there should still be a decoding of one or more least significant bits for the respective spectral values (and, optionally, of one or more intermediate bits for the respective spectral value). Also, by using this concept, it is possible to avoid an encoding and decoding of least significant bits for such spectral values for which the two or more most significant bits are sufficient to fully represent the spectral value. This is, for example, true for spectral values lying within a range between 0 and 3 (in the case that there are two most significant bits).

In an embodiment, the audio decoder is configured to decode, for all spectral values for which two or more most significant bits have been decoded and which comprise more bits than the two or more most significant bits and a least significant bit, one or more intermediate bits, bit positions of which are between the least significant bit and the two or more most significant bits. Accordingly, it is possible to decode all bits of a binary number representation of a quantized spectral value, except for the least significant bit. For example, it is possible to decode all bits of the binary (and possibly signed) number representations of all spectral values, with the exception of the least significant bit, for all non-zero spectral values. Thus, a good representation of the spectrum can be obtained, wherein it is ensured that a maximum error for each spectral value is limited to the least significant bit, independent from the question whether the encoded representation of the least significant bit for the respective spectral value can be included into the encoded audio representation due to the bitrate constraints or not.

In an embodiment, the audio decoder is configured to decode, in a first decoding phase (for example, step 3 of the decoding), two or more most significant bits per spectral values, and for all spectral values for which two or more most significant bits are decoded and which comprise more bits than the two or more most significant bits (which are jointly decoded) and a least significant bit, one or more intermediate bits, bit positions of which are between the least significant bit and the two or more most significant bits. Moreover, in the first decoding phase, for all spectral values for which two or more most significant bits are decoded and for which the two or more most significant bits and any intermediate bits, as far as intermediate bits are present, indicate a non-zero value, signs are decoded. Moreover, the audio decoder is configured to selectively omit, in the first decoding phase, a decoding of a sign for spectral values for which the two or more most significant bits, and any intermediate bits, as far as intermediate bits are present, indicate a zero value. Moreover, the audio decoder is configured to selectively obtain, in a second decoding phase (for example, step 6 of the decoding) which follows the first decoding phase, sign information for spectral values for which the two or more most significant bits and any intermediate bits—as far as intermediate bits are present—indicate a zero value and for which a least significant bit information indicates a non-zero value.

Accordingly, no sign decoding is performed in the first phase if those bits decoded in the first phase (namely the two or more most significant bits and any intermediate bits which may be present) indicate that an absolute value of the spectral value is not larger than a contribution of a least significant bit. Thus, the decoding of the sign is postponed until the actual decoding of the least significant bit. Such a procedure is advantageous, since it can be avoided that a sign is decoded "too early" and in vain, which could be the case if the least significant bit corresponding to the respective spectral value is not included in the bitstream due to an exhaustion of a bit budget.

In an embodiment, the audio decoder is configured to sequentially use subsequent bits of a least-significant-bit-information bit sequence (for example, lsbs[ ]) in order to obtain least significant bit values associated with the spectral values. Accordingly, it can be achieved that there is a contiguous bit sequence which represents the least significant bits (any signs, as far as needed). By shortening this bit sequence (e.g. lsbs[ ]), a needed bitrate for the transmission of the encoded audio representation can easily be adjusted at the side of an audio encoder, and the audio decoder can very easily, and without a complex bit mapping, adapt to such an adjustment of the bitrate (or to a variable length or lsbs[ ]).

In an embodiment, the audio decoder is configured to use a single bit (e.g. step 6, bit0) of the least-significant-bit-information bit sequence (e.g. lsbs[ ]) for respective spectral values for which the two or more most significant bit values and any intermediate bits, as far as intermediate bits are present, indicate a non-zero value, wherein the single bit of the least-significant-bit-information bit sequence is used in order to obtain a least significant bit value in this case. Moreover, the audio decoder is configured to use a single bit (e.g. step 6, bit0) of the least-significant-bit-information bit sequence for respective spectral values for which the two or more most significant bits and any intermediate bits, as far as intermediate bits are present, indicate a zero value, and for which the used single bit of the least-significant-bit-information bit sequence confirms the zero value (e.g. value "0" of bit 0 in step 6). Moreover, the audio decoder is configured to use two subsequent bits (e.g. bit 0 and bit 1 in step 6) of the least-significant-bit-information bit sequence for respective spectral values for which the two or more most significant values and any intermediate bits, as far as intermediate bits are present, indicate a zero value, and for which a first of the used bits of the least-significant-bit-information bit sequence indicates a deviation from the zero value by a least significant bit value (value "1" of bit0 in step 6), wherein a second of the used bits (e.g. bit1 in step 6) of the least-significant-bit-information bit sequence determines a sign of the respective spectral value.

By using such a mechanism, a high bitrate efficiency can be achieved. There is only one contiguous bit sequence (e.g. lsbs[ ]) for the encoding and decoding of the least significant bits, wherein this one contiguous bit sequence also selectively contains sign information for such spectral values which only deviate from a zero value by a least significant bit value (i.e., for which the two or more most significant bits and any intermediate bits (as far as intermediate bits are present) indicate a zero value).

In an embodiment, the audio decoder is configured to decode least significant bits starting from a least significant bit associated with a lowest frequency spectral value and proceeding towards spectral values associated with increasingly higher frequencies, such that spectral values (for example, all spectral values which comprise more bits than the two or more most significant bits) are refined by a least significant bit information in a range from a lowest frequency spectral value up to a spectral value for which a last least significant bit information is available, and such that (for example, all) spectral values (for example, even decoded spectral values which comprise more bits than the two or more most significant bits) having associated frequencies higher than a frequency associated with the spectral value for which the last least significant bit information is available remain unrefined. In other words, spectral values in a lower frequency range (from the lowest frequency spectral value up to a spectral value having associated the last least significant bit information) are refined using a least significant bit information, while spectral values associated with higher frequencies all remain unrefined. Consequently, a resolution in the perceptually more important low frequency range is increased by using a least significant bit refinement, while only the two or more most significant bits (and intermediate bits, if available) are used in a higher frequency range, which is perceptually less important. Consequently, the best possible hearing impression can be obtained on the basis of the available bitrate, wherein there is also a simple mechanism for which spectral values least significant bit information is provided. Furthermore, the spectral values can be refined from a lowest frequency spectral value up to a spectral value to which the last least significant bit information is associated.

In an embodiment, the audio decoder is configured to be switchable between a first mode, in which a decoding of spectral values in a higher frequency range is omitted (for example, entirely omitted) in response to a signaling from the encoder and in which least significant bits are decoded for all spectral values for which one or more most significant bits are decoded and which comprise more bits than the most significant bits, and a second mode, in which one or more least significant bits associated with one or more of the spectral values are decoded, while no least significant bits are decoded for one or more other spectral values for which one or more most significant bits are decoded and which comprise more bits than the most significant bits.

In other words, the audio decoder is switchable between two modes, which use significantly different mechanisms for handling an exhaustion of a bit budget.

In the first mode, all spectral values in a lower frequency range are encoded (and decoded) fully including the least significant bit, while all spectral values in a higher frequency range are entirely discarded by the encoder even if they are non-zero and consequently not decoded at the side of the decoder. In the second mode, at least the most significant bits are encoded for all non-zero spectral values (and thus also decoded), but the least significant bits are only encoded (and decoded) if (or as long as) there is still a bit budget available.

However, it has been found that the possibility to switch between the two different modes allows the audio decoder to adapt to varying transmission conditions. For example, it has been found that the first mode is sometimes more advantageous than the second mode, for example if there is only a very small bitrate available. On the other hand, it has also been found that the first mode does not provide for good results in the presence of a sufficiently high bitrate, where the binary representations of many spectral values comprise least significant bits in addition to the two or more most significant bits. Accordingly, the audio decoder can operate with good results under circumstances in which there are only a few least significant bits and under circumstances where there is a comparatively large number of least significant bits (wherein the operation in the second mode is typically problematic in the first case, while the operation in the second mode is typically very advantageous in the second case).

In an embodiment, the audio decoder is configured to evaluate a bitstream flag which is included in the encoded audio representation in order to decide whether the audio encoder operates in the first mode or in the second mode. Accordingly, the switching between the first mode and the second can be controlled by an audio encoder, which typically comprises good knowledge about which mode is most advantageous. Also, the complexity of the audio decoder can be reduced, because the audio decoder does not need to decide by itself whether to use the first mode of the second mode.

In another embodiment, the audio decoder is configured to jointly decode two or more most significant bits per spectral value for at least two spectral values on the basis of respective symbol codes, wherein a respective symbol code represents two or more most significant bits per spectral value for at least two spectral values. Such a grouping of spectral values, wherein two or more spectral values are represented by a single symbol of the arithmetically encoded representation is also particularly efficient, because there is often some correlation between adjacent spectral values, and because it is not necessary to individually encode the bit position for each of two most significant bits. However, it can naturally happen that the "most significant bits" of one of the spectral values are both "zero", because the bit position is typically determined by the spectral value having a larger absolute value.

An embodiment according to the invention creates an audio decoder for providing a decoded audio information on the basis of an encoded audio information. The audio decoder is configured to obtain decoded spectral values on the basis of an encoded information representing the spectral values. The audio decoder is configured to decode one or more most significant bits on the basis of respective symbol codes for a plurality of spectral values, and to decode one or more least significant bits for one or more of the spectral values. In particular, the audio decoder is configured to be switchable between a first mode, in which a decoding of spectral values in a higher frequency range is omitted (for example, entirely omitted) in response to a signaling from the encoder and in which least significant bits are decoded for all spectral values for which one or more most significant bits are decoded (or have been decoded) and which comprise more bits than the most significant bits, and a second mode in which one or more least significant bits associated with one or more of the spectral values are decoded, while no least significant bits are decoded for one or more other spectral values for which one or more most significant bits are decoded (or have been decoded) and which comprise more bits than the one or more most significant bits. Moreover, the audio decoder is configured to provide the decoded audio information using the spectral values.

This embodiment is based on the idea that the first mode or the second mode may be more advantageous in terms of a tradeoff between complexity, bitrate and audio quality depending on the circumstances. The audio decoder can handle two different approaches for dealing with an exhaustion of a bit budget. When operating in the first mode, the audio decoder can handle situations in which an audio encoder omits an encoding of spectral values in the higher frequency range, while spectral values in a low frequency range are all fully encoded (including least significant bits). In the second mode, the audio decoder handles an encoded audio information in which least significant bits are selectively omitted for some of the spectral values, even though the one or more most significant bits are encoded for all spectral values. As already mentioned above, both approaches have their advantages depending on some other system parameters (like, for example, the available bitrate), and the audio decoder described here can therefore provide good results under varying conditions.

This audio decoder can also be supplemented by any of the features and functionalities of the above mentioned audio decoder.

In an embodiment, the audio decoder is configured to obtain intermediate bits, bit positions of which are between the least significant bit and the one or more most significant bits, and the least significant bit associated with a given spectral value from a contiguous bit sequence in the first mode. Moreover, the audio decoder is configured to obtain intermediate bits, bit positions of which are between the least significant bit and the one or more most significant bits, and the least significant bit associated with a given spectral value from a separate bit sequence or from separate, non-contiguous bit locations of a bit sequence in the second mode.

In other words, in the first mode, there may be a single contiguous bit sequence which encodes both the intermediate bits (as far as intermediate bits are present) and the least significant bits. This contiguous bit sequence, which comprises both the information about the intermediate bits and the information about the least significant bits (but which typically does not comprise information about the one or more most significant bits) can easily be shortened in the case that a bitrate budget is reduced. On the other hand, in the second mode, information representing the least significant bits and the information representing the intermediate bits are contained in separate bit sequences or in separate subsequences of a bit sequence. Accordingly, there is one bit sequence which obtains the information about the intermediate bits (and, optionally, sign information), and there is one sequence which comprises information about the least significant bits (and, optionally, about the signs of values which are very close to zero). Consequently, since the information about the least significant bits is in a separate sequence when operating in the second mode, it is easy to remove or to shorten the sequence comprising the least significant bits, to thereby reduce the bitrate needed. The audio decoder can easily adapt to a varying length of the sequence comprising the least significant bits in that the least-significant bit refinement of spectral values is applied to more or less spectral values, depending on how many bits are contained in the sequence representing the least significant bits.

An embodiment according to the invention creates an audio encoder for providing an encoded audio information on the basis of an input audio information. The audio encoder is configured to obtain spectral values representing an audio content of the input audio information. The audio encoder is also configured to encode at least a plurality of the spectral values, in order to obtain an encoded information representing the spectral values (which may be a part of the encoded audio information). Moreover, the audio encoder is configured to jointly encode two or more most significant bits per spectral value, to obtain respective symbol codes for a set of spectral values using an arithmetic encoding. A respective symbol code may represent two or more most significant bits per spectral value for one or more spectral values.

The audio decoder is also configured to encode one or more least significant bits associated with one or more of the spectral values in dependence on a bit budget available, such that one or more least significant bits associated with one or more of the spectral values are encoded, while no least significant bits are encoded for one or more other spectral values for which two or more most significant bits are encoded and which comprise more bits than the two or more most significant bits. Moreover, the audio encoder is configured to provide the encoded audio information using the encoded information representing the spectral values.

This audio encoder is based on the idea that a good tradeoff between complexity, bitrate and audio quality can be achieved by selectively omitting an encoding of one or more least significant bits for spectral values for which two or more most significant bits are encoded using an arithmetic encoding. It has been found that omitting the encoding of one or more least significant bits is not particularly detrimental in the case that there are at least two most significant bits which are encoded.

In particular, it has been found that omitting the encoding of the least significant bits for one or more (quantized) spectral values for which most significant bits are encoded causes a much smaller degradation of an audio quality when compared to totally omitting an encoding of some spectral values to remain within a bit budget.

In an embodiment, the arithmetic encoding is configured to determine bit positions (for example, bit weights) of the at least two most significant bits (for example, numbits and numbits-1), for example, individually for different symbols of the arithmetically encoded representation, and to include into the arithmetically encoded representation an information, for example, an escape sequence comprising one or more "VAL_ESC" symbols, describing the bit positions. Accordingly, the bit positions or bit weights of the two or more most significant bits can be adapted to the actual spectral values, wherein the most significant bits can have a large bit weight for comparatively large spectral values and wherein the most significant bits may have a comparatively small bit weight for comparatively smaller spectral values. Accordingly, some quantized spectral values may be entirely encoded using the two or more most significant bits, wherein there are no least significant bits (or intermediate bits) remaining. In contrast, other, comparatively larger spectral values may be encoded using two or more most significant bits and using at least one least significant bit. For such comparatively large spectral values for which there is at least one least significant bit, in addition to the two or more most significant bits, the encoder can flexibly decide whether to encode the least significant bit or not, depending on whether an available bit budget is exhausted or not. However, the higher a quantization resolution, the higher the number of spectral values which comprise one or more least significant bits, in addition to the two or more most significant bits. Accordingly, a possibility for saving bits by not encoding the least significant bits is particularly high for fine quantization.

In an embodiment, the audio encoder is configured to map at least two most significant bits of the at least one spectral value onto one symbol of the arithmetically encoded representation, which represents the at least two most significant bits of the at least one spectral value. Jointly encoding two or more most significant bits using one symbol of an arithmetically encoded representation has been found to be particularly efficient, since correlations between most significant bits of adjacent spectral values can be exploited, for example when determining a context for the arithmetic encoding.

In an embodiment, the audio encoder is configured to encode, for all spectral values for which two or more most significant bits are encoded and which comprise more bits than the two or more most significant bits and the least significant bit, one or more intermediate bits, bit positions of which are between the least significant bit and the two or more most significant bits. Accordingly, all the spectral values for which two or more most significant bits are encoded are actually encoded with a good resolution. For such spectral values, all bits except for the least significant bit are encoded, which brings along a good resolution and has the effect that only the least significant bits are affected in case that a bit budget is exhausted. Thus, a very good hearing impression can be maintained.

In an embodiment, the audio encoder is configured to encode, in a first encoding phase, two or more most significant bits per spectral values and to also encode, in the first encoding phase, for spectral values for which two or more most significant bits are encoded and which comprise more bits than the two or more most significant bits (which are jointly encoded) and a least significant bit, one or more intermediate bits, bit positions of which are between the least significant bit and the two or more most significant bits. Moreover, the encoder is configured to encode, in the first encoding phase, signs for all spectral values for which two or more most significant bits are encoded and for which the two or more most significant bits and any intermediate bits, as far as intermediate bits are present, indicate a non-zero value. However, the audio encoder is configured to selectively omit, in the first encoding phase, an encoding of a sign for spectral values for which the two or more most significant values and any intermediate bits, as far as intermediate bits are present, indicate a zero value. Accordingly, in the first encoding phase, the most significant bits and the intermediate bits (as far as intermediate bits are present in between the most significant bits and the least significant bit) are encoded. However, in the first encoding phase, signs are only encoded if the two or more most significant bits and the intermediate bits indicate a non-zero value. In other words, in the first encoding phase, signs are not encoded if the spectral values are so small that they differ from zero only by a least significant bit value (which is the case if the bit weight of the two or more most significant bits is chosen such that the most significant bits are all zero, which can, for example, happen if the bit weights of a given spectral value are affected by one or more adjacent spectral values which are larger than the given spectral value).

Moreover, the audio encoder is configured to selectively encode, in a second encoding phase which follows the encoding phase, sign information for spectral values for which the two or more most significant bits and any intermediate bits, as far as intermediate bits are present, indicate a zero value and for which a least significant bit information indicates a non-zero value. In other words, for very small spectral values, which differ from zero only by a least significant bit value, the sign is only encoded in the second encoding phase, wherein a decision of whether the second encoding phase is actually executed (or completed) for a given spectral value (i.e. whether the least significant bit information is included into the encoded audio information) is dependent on the bit budget. Thus, the first encoding phase is streamlined, and the sign information is only encoded (e.g. included into the encoded audio information) in the second encoding phase, unless it is already clear from the encoding of the most significant bits and any intermediate bits (as far as there are any intermediate bits) that a sign information is needed in any case. The encoding of unnecessary information is avoided and the efficiency is maximized, since it is not clear from the beginning for which spectral values the second encoding phase would be performed. The final decision as to whether the second encoding phase will be performed can only be made when it is known how many bits are needed for the decoding of the most significant bits and any intermediate bits, and how many bits have already been used by the encoding of other least significant bits.

In an embodiment, the audio encoder is configured to only include a sign information into the encoded audio representation for spectral values which only differ from zero by a least significant bit if the least significant bit of such spectral values is actually encoded (included in the encoded audio representation). Accordingly, an inclusion of unnecessary information into the encoded audio information (or encoded audio representation) can be avoided. In other words, a sign information is included for all spectral values which are non-zero even when not considering the least significant bit. For spectral values which are non-zero only when considering the least significant bit, the sign information is only included into the encoded audio representation if the least significant bit information is actually included in the encoded audio representation.

In an embodiment, the audio encoder is configured to sequentially provide subsequent bits of a least-significant-bit-information bit sequence in order to encode the least significant bit values associated with the spectral values. Accordingly, a contiguous bit sequence or bit stream is provided which only comprises the least significant bit information and possibly some sign information for such spectral values which are non-zero only when considering the least significant bit. Consequently, there is a separate sequence of least significant bit information (including associated sign information), which can be shortened or omitted without affecting the encoding of the most significant bits and of the intermediate bits (and of any sign information which is relevant even when leaving the least significant bit unconsidered).

In an embodiment, the audio encoder is configured to provide a single bit of the least-significant-bit-information bit sequence for respective spectral values for which the two or more most significant bit values and any intermediate bits, as far as intermediate bits are present, indicate a non-zero value, wherein the used single bit of the least-significant-bit-information bit sequence is used in order to encode a least significant bit value. Moreover, the audio encoder is configured to provide a single bit of the least-significant-bit-information bit sequence for respective spectral values for which the two or more most significant values and any intermediate bits, as far intermediate bits are present, indicate a zero value and for which the provided single bit of the least-significant-bit-information bit sequence confirms the zero value. Moreover, the audio encoder is configured to provide two subsequent bits of the least-significant-bit-information bit sequence for respective spectral values for which the two or more most significant bits, and any intermediate bits, as far as intermediate bits are present, indicate a zero value and for which a first of the provided bits of the least-significant-bit-information bit sequence indicates deviation from the zero value by a least significant bit value, wherein a second of the provided bits of the least-significant-bit-information bit sequence encodes a sign of the respective spectral value. In other words, the least-significant-bit-information bit sequence typically comprises one bit per spectral values, but comprises two bits per spectral value if the spectral value deviates from a zero value only by a least significant bit value. In the latter case, the sign information is included into the least-significant-bit-information bit sequence, because it is only needed if the respective part of the least-significant-bit-information is actually encoded or is actually transmitted to an audio decoder, or is actually evaluated by an audio decoder.

In other words, the sign is selectively included into the least-significant-bit-information bit sequence for spectral values for which the most significant bits and intermediate bits (if present) indicate a zero value and for which the least significant bit indicates a non-zero value (deviating from a zero value only by a least significant bit value).

In an embodiment, the audio encoder is configured to encode the least significant bits starting from a least significant bit associated with a lowest frequency spectral value and proceeding towards spectral values associated with increasingly higher frequencies. Accordingly, encoded information for refining spectral values (for example, for refining all spectral values which comprise more bits than the one or more most significant bits) by least-significant-bit information is provided in a range from a lowest frequency spectral value up to a spectral value for which the "last" least significant bit information is provided. Moreover, no encoded information for refining spectral values by least significant bit information is provided for (all) spectral values (even for encoded spectral values which comprise more bits than the two or more most significant bits) having associated frequencies higher than a frequency associated with a spectral value for which the last least significant bit information is provided. Worded different, unused bits of the bit budget are used for refining spectral values in a low frequency region by a least significant bit information, until the bit budget is exhausted. Spectral values in a higher frequency region are not refined by the least significant bit information if the bit budget is exhausted. Such a procedure brings along that spectral values in a lower frequency portion are advantageous over spectral values in a higher frequency portion when providing least significant bit information. This is in agreement with psycho-acoustic requirements, since a hearing impression will be less distorted by inaccuracies in a higher frequency region when compared to inaccuracies in a lower frequency region. Accordingly, the audio encoder can flexibly decide, on the basis of the bit budget, up to which frequency (spectral value for which the last least significant bit information is provided) there is a refinement of spectral values using the least significant bit information in dependence on the bit budget.

In an embodiment, the audio encoder is configured to be switchable between a first mode, in which an encoding of non-zero spectral values in a higher frequency range is (for example, completely) omitted in case that an available bit budget is used up (exhausted) by an encoding of spectral values in a lower frequency range and in which least significant bits are encoded for all spectral values for which one or more most significant bits are encoded and which comprise more bits than the most significant bits, and a second mode in which one or more least significant bits associated with one or more of the spectral values are encoded, while no least significant bits are encoded for one or more other spectral values for which one or more most significant bits are encoded and which comprise more bits than the most significant bits.

As already mentioned above, being able to switch between such modes allows for an efficient coding in different environments and under different bitrate constraints. In the first mode, the number of spectral values encoded can be varied, and an encoding of non-zero spectral values in a higher frequency range can be omitted in response to an exhaustion of a bit budget. Accordingly, a hearing impression in a high frequency range is degraded, but this may be acceptable under some circumstances, for example in low bitrate environments. On the other hand, in the second mode, the audio encoder may vary for how many of the spectral values least significant bits are encoded depending on the bit budget, while at least most significant bits are encoded for all spectral values (even in a high frequency region). Thus, in the second mode, the encoding precision may be reduced even for lower frequencies in some cases, while there is no total omission of non-zero (quantized) spectral values in the high frequency region. The second mode of operation may, for example, result in an improved hearing impression under higher bitrate conditions, which would suffer from a significant degradation if non-zero spectral values in the high frequency region would be totally omitted. Thus, the audio encoder can adapt to different situations and bitrate requirements in a flexible manner by being switchable between the first mode and the second mode.

In an embodiment, the audio encoder is configured to provide a bitstream flag which is included in the encoded audio information (or encoded audio representation) in order to indicate whether the audio encoder operates in the first mode or in the second mode. Accordingly, it is easy for an audio decoder to recognize whether a first decoding mode or a second decoding mode should be used. Using a bitstream flag for such a signal is reasonable, since the audio encoder typically has more knowledge about the specific circumstances than the audio decoder.

In an embodiment, the audio encoder may be configured to jointly encode two or more most significant bits per spectral value for at least two spectral values using respective symbol codes. Accordingly, a respective symbol code may represent two or more most significant bits per spectral value for at least two spectral values. It has been found that such an encoding is particularly efficient, since dependencies and correlations between spectrally adjacent spectral values can be exploited. Also, the bit weight of the most significant bits can be determined on the basis of both spectral values, wherein the spectral value having the larger absolute value may decide on the common bit weight of the most significant bits for both spectral values. Accordingly, a signaling overhead for signaling the bit weight of the most significant bits can be reduced, because it can be signaled jointly for two or more spectral values.

In an embodiment, the audio encoder is configured to determine an actual highest-frequency non-zero spectral value (for example, without truncating spectral values) and to encode at least two or more most significant bits of all non-zero (quantized) spectral values of all non-zero groups of (quantized) spectral values. Accordingly, it can be ensured that at least most significant bits of all non-zero (quantized) spectral values are encoded, which typically results in a good hearing impression.

In an embodiment, the audio encoder is configured to encode all bits except for a least significant bit for all non-zero (quantized) spectral values. Moreover, the audio encoder is configured to encode least significant bits for spectral values until a bit budget is exhausted (for example, starting with a lowest frequency spectral value and proceeding towards higher frequency spectral values). Accordingly, a good hearing impression can be achieved and only a variable number of least significant bits will be skipped in the encoding, depending on the bit budget.

In an embodiment, the audio encoder is configured to obtain a global gain information which determines quantization steps of a quantization of spectral values, and which determines a bit demand for the encoding of the quantized spectral values. It has been found that the usage of such a (global) gain information can be helpful to adjust the quantization steps. However, it has also been recognized that it is not easily possible to fine tune a bit demand when using a global gain information. Accordingly, the concept to selectively omit an encoding of least significant bits for some spectral values can be used to compensate for inaccuracies in the adjustment of the bit demand which are caused by the usage of the global gain information. However, it has been found that the combination of the usage of the global gain information with the encoding concept described herein creates a system having a comparatively low computational complexity and still allowing for a good tradeoff between audio quality and bitrate. In particular, a given fixed bitrate can be fully utilized even with a low complexity adjustment of the global gain information by flexibly deciding how many least significant bits should be encoded.

An embodiment according to the invention creates an audio encoder for providing an encoded audio information on the basis of an input audio information. The audio encoder is configured to obtain spectral values representing an audio content of the input audio information. The audio encoder is configured to encode at least a plurality of the spectral values, in order to obtain an encoded information representing the spectral values. The audio encoder is configured to encode one or more most significant bits using respective symbol codes for a plurality of the spectral values, and to encode one or more least significant bits for one or more of the spectral values, wherein a respective symbol code represents one or more most significant bit values for one or more spectral values. The audio encoder is configured to be switchable between a first mode in which an encoding of non-zero spectral values in a higher frequency range is (for example, entirely) omitted in case that an available bit budget is used up (for example, exhausted) by encoded spectral values in a lower frequency range and in which least significant bits are encoded for all spectral values for which one or more most significant bits are encoded and which comprise more bits than the most significant bits, and a second mode in which one or more least significant bits associated with one or more of the spectral values are encoded, while no least significant bits are encoded for one or more other spectral values for which one or more most significant bits are encoded and which comprise more bits than the most significant bits. The audio encoder is configured to provide the encoded audio information using the encoded information representing the spectral values.

This audio encoder is based on the considerations mentioned above for the similar audio encoder and also for the similar audio decoder. In particular, while being switchable between the first mode and the second mode, the audio encoder can adapt to different encoding situations and bitrate requirements.

In an embodiment, the audio encoder is configured to encode one or more most significant bits of all non-zero spectral values or of all non-zero groups of spectral values in the second mode. Accordingly, a good hearing impression can be reached.

In an embodiment, the audio encoder is configured to limit, when operating in the first mode, a frequency range for which the spectral values are encoded, in case a bit budget is insufficient, such that one or more spectral values (for example, in a high frequency range) are left unconsidered in the encoding of spectral values. Thus, a selective limitation of the frequency range, in dependence on a bit budget, is used in the first mode, wherein the limitation of the frequency range helps to save bits.

In an embodiment, the audio encoder is configured to determine, when operating in the first mode, a maximum frequency value and to encode, when operating in the first mode, spectral values up to the maximum frequency and to leave, when operating in the first mode, spectral values above the maximum frequency unencoded even if the spectral values are non-zero (or have non-zero most significant bits). Moreover, the audio encoder is configured to select, when operating in the first mode, the maximum frequency value in dependence on a computation or estimation of a bit demand for encoding all spectral values, such that a number of spectral values to be encoded is reduced if the computed or estimated bit demand would exceed a bit budget. Moreover, the audio encoder is configured to determine, when operating in the second mode, the maximum frequency value (for example, to be equal to an actual maximum frequency value) and to encode, when operating in the second mode, spectral values up to the maximum frequency and to leave, when operating in the second mode, spectral values above the maximum frequency unencoded. When operating in the second mode, the maximum frequency value is selected such that at least one or more most significant bits of all non-zero spectral values or of all non-zero groups of spectral values are encoded and such that at most zero-valued spectral values are left unencoded. In other words, the audio encoder uses different criteria for the selection of the maximum frequency value in the different modes. In the first mode, the maximum frequency value is chosen in dependence on the bit demand, wherein non-zero (quantized) spectral values are left unencoded in case the bit budget is too small. On the other hand, in second mode, the maximum frequency value is chosen such that for all spectral values quantized to a non-zero value at least the one or more most significant bits are encoded. Thus, different concepts are used for dealing with an exhaustion of a bit budget. In the first mode, an exhaustion of a bit budget is handled by reducing the maximum frequency value. In the second mode, an exhaustion of a bit budget is handled by omitting the encoding of least significant values of one or more spectral values for which the most significant bits are encoded.

In an embodiment, the audio encoder is configured to include an information describing the maximum frequency into the encoded audio information. Accordingly, an audio decoder knows how many spectral values should be decoded. The information describing the maximum frequency can be used both for a limitation of the number of encoded (and decoded) spectral values due to an exhaustion of a bit budget and also to signal that all spectral values above the maximum frequency are zero (e.g. actually zero even without truncation).

In an embodiment, the audio encoder is configured to make a mode decision whether to use the first mode or the second mode in dependence on an available bitrate (for example, such that the first mode is used for comparatively smaller bitrates and such that the second mode is used for comparatively higher bitrates).

Such a mechanism is useful, since the second mode is better suited for dealing with an exhaustion of a bit budget in the case of higher bitrates. In contrast, the first mode sometimes brings better results than the second mode in the case of comparatively low bitrates.

In another embodiment, the audio encoder is configured to make a mode decision whether to use the first mode or the second mode in dependence on an information on a number of spectral values or groups of spectral values which comprise, in addition to one or more most significant bits encoded in a most-significant-bit-encoding step, one or more least significant bits, an encoding of which can selectively be omitted in dependence on a bit demand and a bit budget. Such a concept is helpful since the second mode is best suited for cases in which there is (after the quantization) a large number of least significant bits. Such a large number of least significant bits is, for example, present in the case of a high bitrate, where an encoding can be done with a high resolution (and wherein a fine quantization can be used).

In an embodiment, the audio encoder is configured to include a bitstream flag into the encoded audio information indicating whether the audio encoder operates in the first mode or in the second mode. Accordingly, an audio decoder can be informed which decoding mode to use.

In an embodiment, the audio encoder is configured to encode intermediate bits, bit positions of which are between the least significant bit and the one or more most significant bits, and a least significant bit associated with a given spectral value into a contiguous bit sequence in the first mode. Moreover, the audio encoder is configured to encode intermediate bits, bit positions of which are between the least significant bit and the one or more most significant bits, and the least significant bit associated with a given spectral value into separate bit sequences or into separate, non-contiguous bits locations (or bitstream portions) of a bit sequence in the second mode. Accordingly, when operating in the first mode, there is a contiguous bit sequence which represents both intermediate bits and the least significant bits. In contrast, when operating in the second mode, intermediate bits and least significant bits are provided in separate sequences (or into separate portions of a common sequence) which allows for a simple shortening of the sequence representing the least significant bits. Accordingly, an adaptation to the bit budget is easily possible, even after the encoding is completed. This facilitates adaptation to the bit budget.

In an embodiment, the audio encoder is configured to encode, when operating in the first mode, a sign information associated with a spectral value in a bit sequence which is associated with intermediate bits, bit positions of which are between the least significant bit and the one or more most significant bits, and least significant bits. Moreover, the audio encoder is configured to selectively encode, when operating in the second mode, a sign information associated with a spectral value in a bit sequence which is associated with intermediate bits, bit positions of which are between the least significant bit and the one or more most significant bits, or in a bit sequence associated with least significant bits (and sign information) such that sign information for spectral values which deviate from zero only by a least significant bit value are encoded in the bit sequence associated with least significant bits (and sign information). Accordingly, the sign information is placed within the bit sequence associated with least significant bits (and sign information) in the case that the sign information is only needed when the least significant bit information is evaluated. Accordingly, the information which is included into the encoded audio representation, namely the bit sequence which is associated with intermediate bits and sign information, does not comprise any information which is unnecessary in the case that the least significant bit information is omitted. This simplifies scalability of the bitrate.

An embodiment according to the invention creates an audio decoder for providing an encoded audio information on the basis of an input audio information. The audio encoder is configured to obtain spectral values representing an audio content of the input audio information (for example, using a MDCT transform). The audio encoder is configured to encode at least a plurality of the spectral values, in order to obtain an encoded information representing the spectral values. The audio encoder is configured to obtain a (global) gain information which determines quantization steps of a quantization of spectral values, and which determines a bit demand for encoding the quantized spectral values. The audio encoder is configured to encode one or more most significant bits using respective symbol codes for a plurality of the spectral values using an arithmetic encoding, and to encode one or more least significant bits for one or more of the spectral values, wherein a respective symbol code represents one or more most significant bits per spectral value for one or more spectral values. The audio encoder is configured to encode one or more least significant bits associated with one or more of the spectral values in dependence on a bit budget available, such that one or more least significant bits associated with one or more of the spectral values are encoded, while no least significant bits are encoded for one or more other spectral values for which one or more most significant bits are encoded and which comprise more bits than the one or more most significant bits. Moreover, the audio encoder is configured to provide the encoded audio information using the encoded information representing the spectral values.

This audio encoder is based on the finding that the usage of a gain information (or global gain information) is useful for defining a quantization. Also, the concept to selectively encode least significant bits is very efficient in combination with this concept. For details, reference is also made to the discussion above.

In an embodiment, the audio encoder is configured to obtain a first estimate of the gain information based on an energy of groups of spectral values (for example, MDCT coefficients). Moreover, the audio encoder is configured to quantize the set of spectral values (for example, a MDCT spectrum) using the first estimate of the gain information. Moreover, the audio encoder is configured to compute or estimate a number of bits needed to encode the set of spectral values quantized using the first estimate of the gain information or using a refined gain information. Moreover, the audio encoder is configured to decide whether to use the first mode or the second mode in dependence on a number of bits needed. Accordingly, a decision about the quantization, and also a decision which mode to use, can be made in an efficient way. Depending on whether an iterative procedure is to be chosen or not, the number of bits needed to encode the set of spectral values can be estimated using a quantization in dependence on the first estimate of the gain information or using a quantization in dependence on an iteratively refined gain information. Accordingly, the complexity of the determination of the quantization accuracy can be kept reasonably small.

In an embodiment, the audio encoder is configured to be switchable between the first mode and the second mode mentioned above. In particular, the audio encoder is configured to decide whether to use the first mode or the second mode in dependence on a number of bits needed and in dependence on a criterion which indicates how many spectral values comprise more bits than the one or more most significant bits. In particular, the number of bits needed, which can be determined after deciding on the gain information to be used (first estimate or refined gain information) can be compared with a bit budget, and the decision which mode to use can made both in dependence on this comparison and in dependence on the criterion which indicates how many spectral values comprise more bits than the one or more most significant bits. Accordingly, the second mode can be used if there are many spectral values comprising one or more less significant bits in addition to the one or more most significant bits.

In an embodiment, the audio encoder is configured to be switchable between the first mode and the second mode mentioned above. In this case, the audio encoder can be configured to decide whether to use the first mode or the second mode in dependence on the number of bits needed and in dependence on a bitrate, such that the second mode is chosen if the bitrate is larger than or equal to a threshold bitrate and if a computed or estimated number of bits needed to encode the set of spectral values is higher than a bit budget. It has been shown that the usage of the second mode is particularly helpful in said case.

Moreover, the audio encoder can also be supplemented by any of the other features mentioned before. The same advantages discussed before also apply.

Further embodiments according to the invention create methods for providing a decoded audio information on the basis of an encoded audio information and methods for providing an encoded audio information on the basis of an input audio information. These methods correspond to the respective audio decoder and to the respective audio encoder and can be supplemented by any of the features and functionalities discussed herein with respect to the corresponding audio decoder or audio encoder.

Further embodiments according to the invention comprise a computer program for performing any of the methods described herein.

A further embodiment comprises a bitstream, which is based on the same considerations discussed above and which may be supplemented by any of the information items to be encoded and decoded as mentioned herein.

BRIEF DESCRIPTION OF THE DRAWINGS

Embodiments of the present invention will be detailed subsequently referring to the appended drawings, in which:

FIG. 8A-8B show flowcharts of a functionality of an audio encoder, according to an embodiment of the present invention;

FIG. 9A-9B show flowcharts of a functionality of an audio decoder, according to an embodiment of the present invention;

FIGS. 10*a*-10*f* show pseudo program code representations of functionalities of an audio encoder, according to an embodiment of the present invention;

FIGS. 11*a*-11*d* show pseudo program code representations of the functionalities of an audio decoder, according to an embodiment of the present invention;

FIG. 12 shows a graphic representation of a signal-to-noise ratio generated by a conventional audio encoder/decoder;

FIGS. 14-18 show flowcharts of methods for audio encoding and audio decoding, according to embodiments of the present invention.

DETAILED DESCRIPTION OF THE INVENTION

1). Audio Decoder According to FIG. 1

Figure 1:
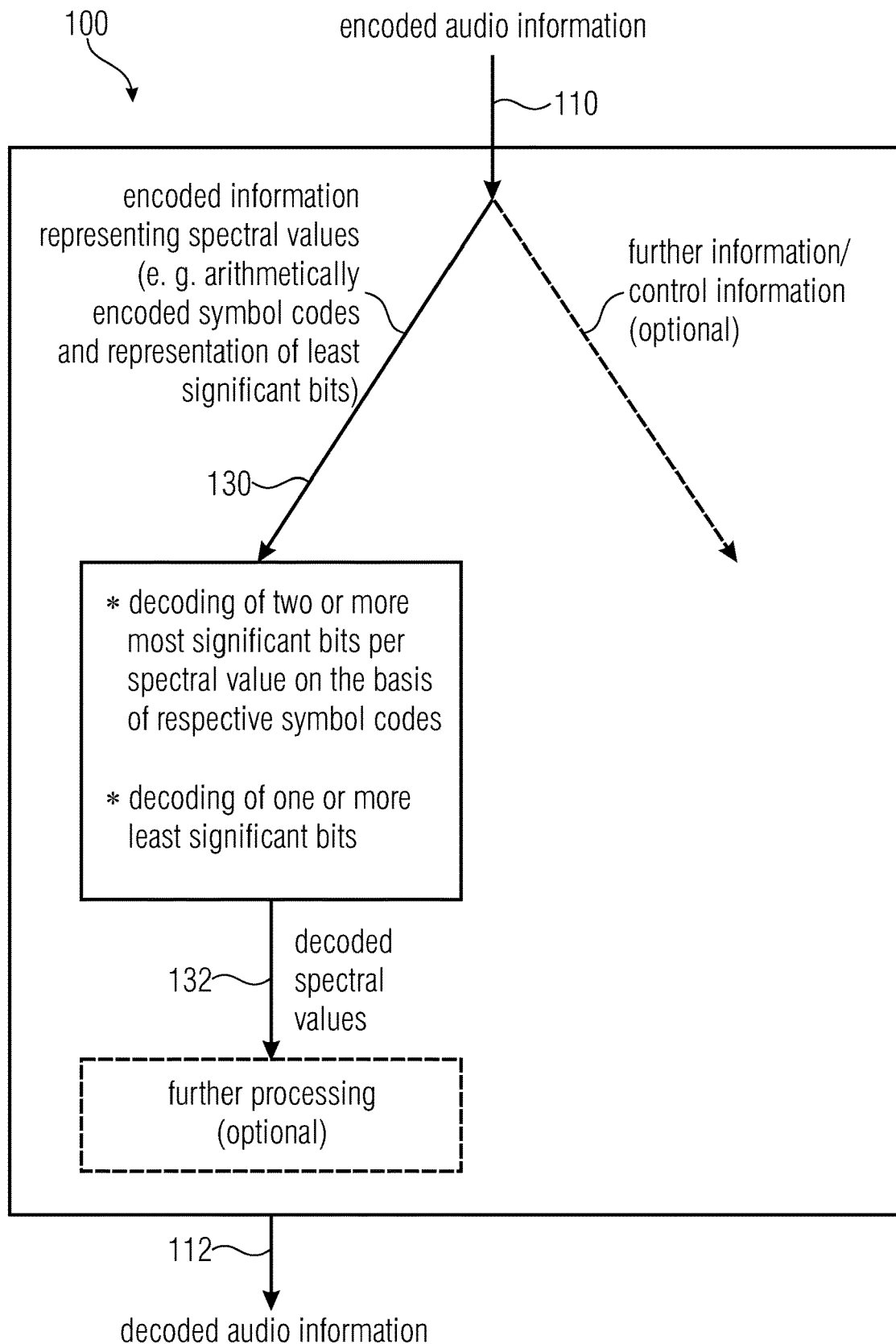
FIG. 1 shows a block schematic diagram of an audio decoder, according to an embodiment of the present invention.

FIG. 1 shows a block schematic diagram of an audio decoder 100 according to an embodiment of the present invention.

The audio decoder 100 is configured to receive an encoded audio information 110 and to provide, on the basis thereof, a decoded audio information 112. The audio decoder 100 is configured to obtain decoded spectral values 132 on the basis of an encoded information 130 representing the spectral values, wherein the encoded information 130 may be part of the encoded audio information 110. In addition, the encoded audio information 110 may optionally comprise further information, like noise shaping information, control information and the like.

The audio decoder is configured to jointly decode two or more most significant bits per spectral value (for example, per quantized spectral value) on the basis of respective symbol codes (for example, symbol codes of an arithmetically encoded representation of the most significant bits) for a set of spectral values using an arithmetic decoding. A respective symbol code may represent two or more most significant bits per spectral value for one or more spectral values. The arithmetically encoded symbol codes may, for example, be part of the encoded information 130 representing spectral values.

Moreover, the audio decoder is configured to decode one or more least significant bits associated with one or more spectral values in dependence on how much least significant bit information is available. The least significant bit information, which can be considered as a representation of least significant bits, may also be part of the encoded information 130 representing spectral values.

In particular, the audio decoder may be configured to decode one or more least significant bits associated with one or more of the spectral values in dependence on how much least significant bit information is available, such that one or more least significant bits associated with one or more of the (quantized) spectral values are decoded, while no least significant bits are decoded for one or more other spectral values for which one or more most significant bits are decoded (or have been decoded) and which comprise more bits than the one or more most significant bits.

In other words, the audio decoder may be configured to decode least significant bits for some of the spectral values for which two or more most significant bits have been decoded, and the audio decoder may omit a decoding of one or more least significant bits for some other spectral values for which one or more most significant bits have been decoded.

Wording it yet differently, the audio decoder may, for example, only refine a true subset of the spectral values, for which most significant bits have been decoded, wherein the number how many spectral values are refined by least significant bits depends on how much least significant bit information is available (for example, how much least significant bit information is included in the encoded audio information 110 by an audio decoder in view of bit budget constraints).

The audio decoder 100 can optionally be supplemented by any of the features, functionalities and details described herein, either individually or in combination.

2). Audio Decoder According to FIG. 2

Figure 2:
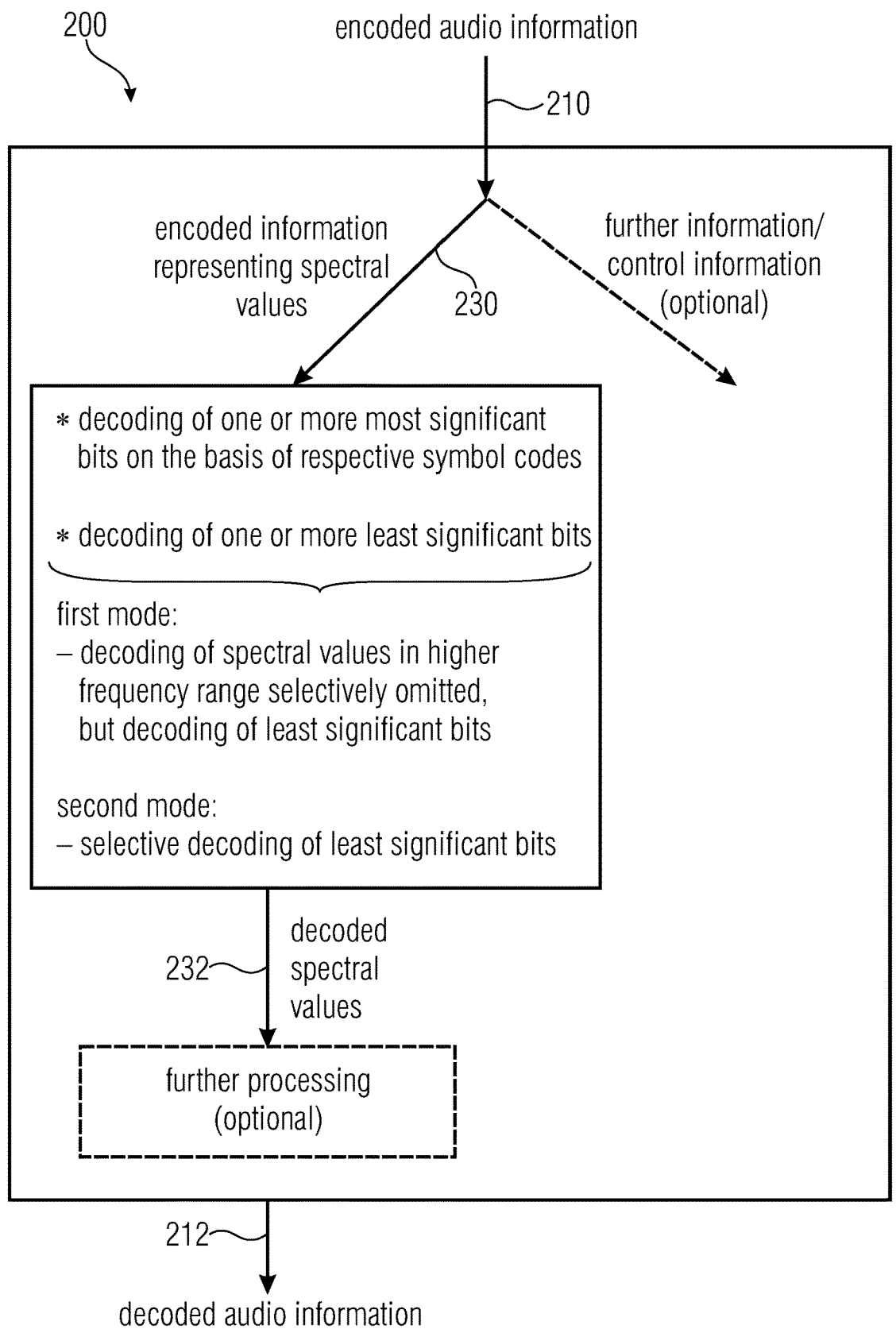
FIG. 2 shows a block schematic diagram of an audio decoder, according to another embodiment of the present invention.

FIG. 2 shows a block schematic diagram of an audio decoder 200, according to an embodiment of the present invention.

The audio decoder 200 is configured to receive and encoded audio information 210 and to provide, on the basis thereof, a decoded audio information 212.

The encoded audio information 210 may, for example, comprise an encoded information 230 representing spectral values, wherein the encoded information 230 representing spectral values may, for example, comprise arithmetically encoded symbol codes representing one or more most significant bits and a representation of least significant bits and of signs. The encoded audio information 210 may optionally comprise further information, like for example, control information of noise shaping information. The optional further information may also be used in the decoding process, but is not essential for the present invention.

The audio decoder is configured to obtain decoded spectral values 232 on the basis of the encoded information 230 representing the spectral values.

The audio decoder is configured to decode one or more most significant bits on the basis of respective symbol codes (for example, on the basis of arithmetically encoded symbol codes) for a plurality of spectral values, and to decode one or more least significant bits for one or more of the spectral values. For example, the audio decoder may use the arithmetically encoded symbol codes and the representation of least significant bits, which may be included in the encoded information 130.

The audio decoder 200 is configured to be switchable between a first mode in which a decoding of spectral values in a higher frequency range is omitted (for example, entirely omitted) in response to a signaling from an encoder and in which least significant bits are decoded for all spectral values for which one or more most significant bits have been decoded and which comprise more bits than the most significant bits, and a second mode in which one or more least significant bits associated with one or more of the spectral values are decoded, while no least significant bits are decoded for one or more other spectral values for which one or more most significant bits have been decoded and which comprise more bits than the most significant bits. In other words, in the first mode, the audio decoder 200 may, for example, decode only spectral values in a lower frequency range (for example, up to a frequency determined and signaled by an audio encoder) while omitting a decoding of spectral values in a higher frequency range (for example, above the frequency specified by the encoder). However, in the first mode, a full number representation of the spectral values may be decoded for all spectral values in the lower frequency range, such that most significant bits, any intermediate bits and any least significant bits are decoded for all spectral values in the lower frequency range. In contrast, in the second mode, the audio decoder may only decode least significant bits for some of the spectral values for which one or more most significant bits are decoded, but not for all spectral values for which one or more most significant bits are decoded. Thus, in the second mode, least significant bits may be decoded in one frequency region but not in another frequency region (for example, in a higher frequency region).

Moreover, the audio decoder 200 is configured to provide decoded audio information 212 using the spectral values 232. For example, the audio decoder 200 may comprise a further processing of the decoded spectral values 232, which, details of which, however, are not of particular relevance for the subject-matter of the present invention.

Moreover, it should be noted that the audio decoder 200 can be supplemented by any of the features, functionalities and details described herein, either individually or in combination.

3). Audio Encoder According to FIG. 3

Figure 3:
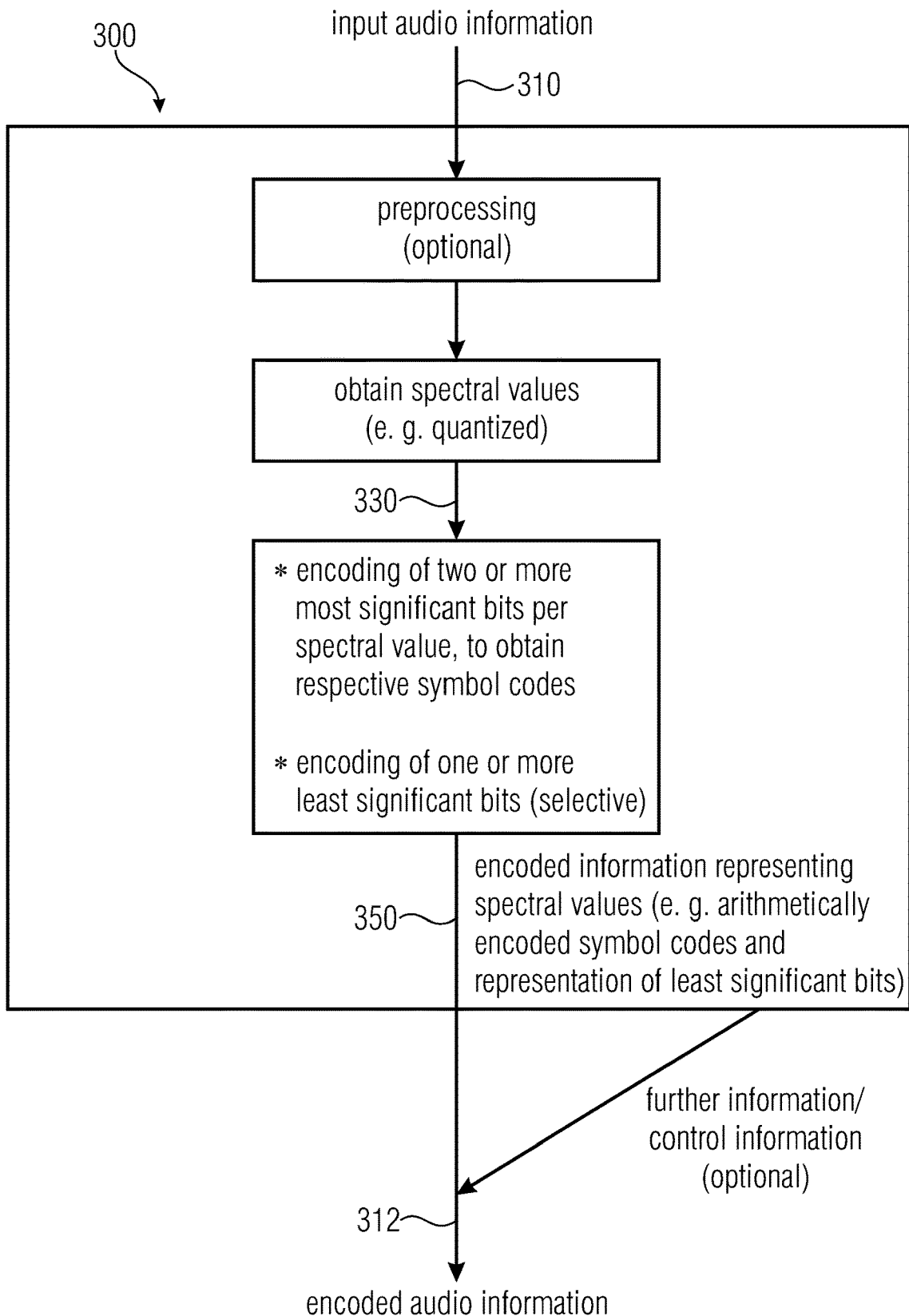
FIG. 3 shows a block schematic diagram of an audio encoder, according to an embodiment of the present invention.

FIG. 3 shows a block schematic diagram of an audio encoder 300 according to an embodiment of the present invention. The audio encoder 300 is configured to receive an input audio information 310 and may provide an encoded audio information 312 (which may correspond to the encoded audio information 110, 210). The audio encoder 300 is configured to obtain spectral values 330 representing an audio content of the input audio information 310. For example, the audio decoder 300 may optionally comprise any form of preprocessing, like, for example, a time-domain-to-spectral-domain conversion (for example, an MDCT) and/or a spectral shaping (in the time domain and/or in the spectral domain) in order to obtain the spectral values 330.

The spectral values 330 may, for example, be quantized (integer) values in a signed binary number representation. Moreover, the audio encoder is configured to encode at least a plurality of the spectral values 330, in order to obtain an encoded information 350 representing the spectral values 330. The audio encoder 300 may, for example, be configured to provide the encoded audio information 312 using the encoded information 350 representing the spectral values. However, the audio encoder 300 may optionally also provide further information, like control information or noise shaping information, which is also included in the encoded audio information 312 (but details of which are not of particular relevance for the present invention).

The audio encoder 300 is configured to jointly encode two or more most significant bits per spectral value, to obtain respective symbol codes for a set of spectral values using an arithmetic encoding. A respective symbol code may, for example, represent two or more most significant bits per spectral value for one or more spectral values.

The audio encoder is further configured to encode one or more least significant bits associated with one or more of the spectral values 330 in dependence on a bit budget, such that one or more least significant bits associated with one or more of the spectral values are encoded, while no least significant bits are encoded for one or more other spectral values for which two or more most significant bits are encoded and which comprise more bits than the two or more most significant bits.

For example, the audio encoder 300 may only provide encoded least significant bits for spectral values in a lower frequency portion but not for spectral values in a higher frequency portion. By selecting for which spectral values least significant bits are provided, a number of bits can be adapted to a bit budget.

Moreover, it should be noted that the audio encoder according to FIG. 3 can be supplemented using any of the features, functionalities and details described herein, either individually or in combination.

4). Audio Encoder According to FIG. 4

Figure 4:
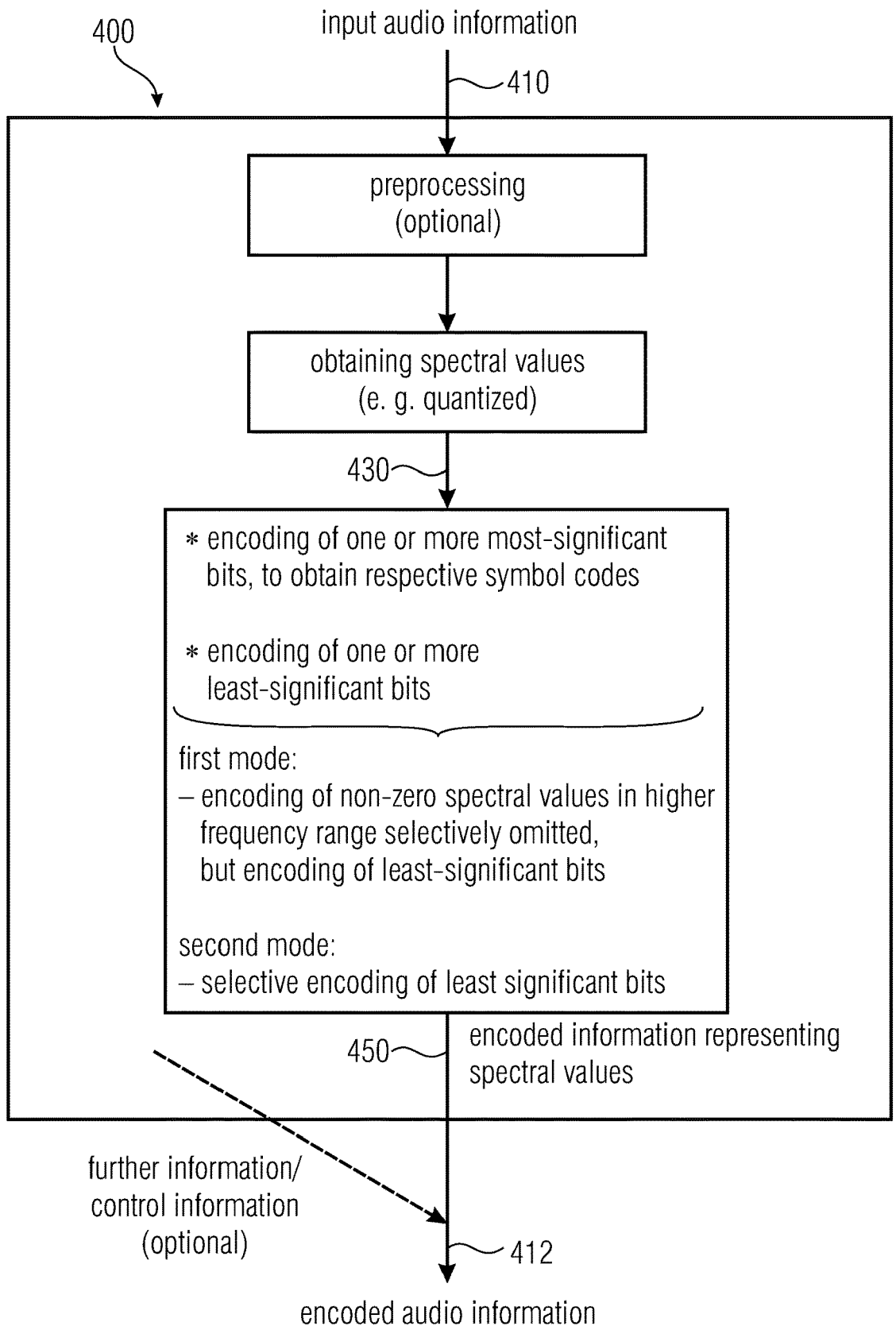
FIG. 4 shows a block schematic diagram of an audio encoder, according to an embodiment of the present invention.

FIG. 4 shows a block schematic diagram of an audio encoder 400, according to an embodiment of the present invention.

The audio encoder 400 is configured to receive an input audio information 410 and to provide, on the basis thereof, an encoded audio information 412. The audio encoder is configured to obtain spectral values 330 (which may, for example, be quantized (integer) spectral values in a signed binary number representation) representing an audio content of the input audio information 410. For example, an optional preprocessing may be used, which may, for example, comprise a time-domain to frequency-domain conversion and/or a noise shaping. Moreover, a quantization may optionally be used to obtain the spectral values 430.

The audio encoder is further configured to encode at least a plurality of the spectral values 430, in order to obtain an encoded information 450 representing the spectral values. The audio encoder is configured to encode one or more most significant bits (of the spectral values) using respective symbol codes for a plurality of spectral values and to encode one or more least significant bits for one or more of the spectral values. A respective symbol code may, for example, represent one or more most significant bit values for one or more spectral values. The audio encoder may be configured to be switchable between a first mode, in which an encoding of non-zero spectral values in a higher frequency range is omitted (for example, entirely omitted) in case that an available bit budget is used up (exhausted) by an encoding of spectral values in a lower frequency range and in which least significant bits are encoded for all spectral values for which one or more most significant bits are encoded and which comprise more bits than the most significant bits, and a second mode in which one or more least significant bits associated with one or more of the spectral values are encoded, while no least significant bits are encoded for one or more other spectral values for which one or more most significant bits are encoded and which comprise more bits than the one or more most significant bits.

In other words, the audio encoder may, for example, encode a comparatively smaller number (for example, not all non-zero spectral values) in the first mode, but those spectral values which are encoded are encoded with full accuracy (including the least significant bit). In contrast, in the second mode, the audio encoder may, for example, encode at least the most significant bits of all non-zero spectral values, but may encode some of the spectral values with reduced resolution (for example, without encoding the corresponding least significant bit). Thus, the encoder may, for example, be switchable between two modes which provide different mechanisms for adapting a number of bits to the bit budget, wherein the first mode relies on an omission of an encoding of spectral values in a higher frequency range for the reduction of the number of bits, and wherein the second mode relies on an omission of least significant bits for some spectral values (for which only the most significant bit and possibly some intermediate bits are encoded, and which are "partially encoded").

The audio encoder 400 according to FIG. 4 can be supplemented by any features, functionalities and details described herein, either individually or in combination.

5). Audio Encoder According to FIG. 5

Figure 5:
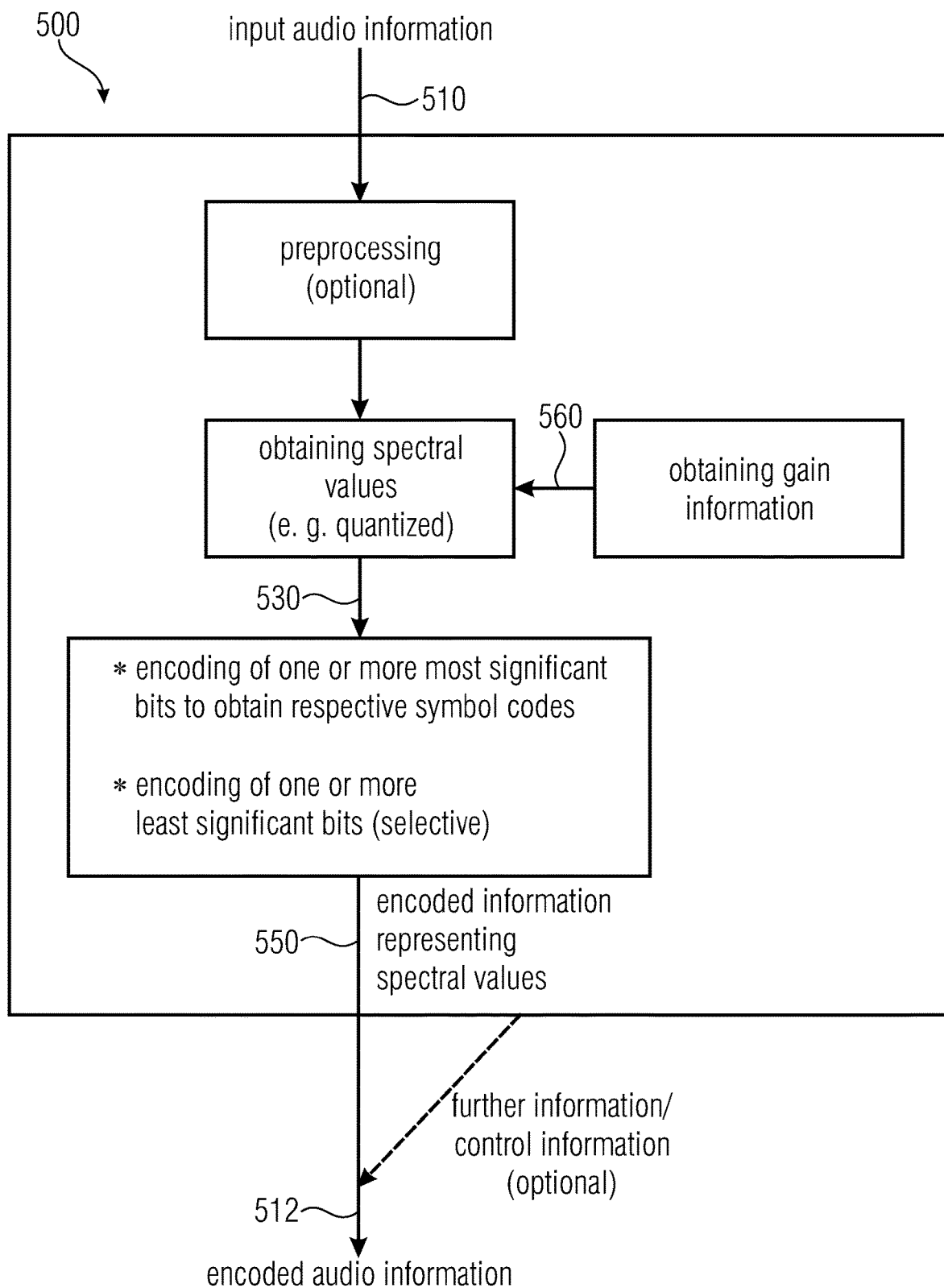
FIG. 5 shows a block schematic diagram of an audio encoder, according to an embodiment of the present invention.

FIG. 5 shows a block schematic diagram of an audio encoder 500, according to an embodiment of the present invention. The audio encoder 500 is configured to receive an input audio information 510 and to provide, on the basis thereof, an encoded audio information 512. The audio encoder is configured to obtain spectral values 530 representing an audio content of the input audio information 510. For example, the audio encoder may use a modified discrete cosine transform (MDCT) to obtain the spectral values 530. Generally speaking, the audio encoder 500 may optionally use any type of preprocessing, like a time-domain-to-frequency-domain conversion and a noise shaping, and the audio encoder 500 may optionally also use a quantization. For example, the spectral values 530 may be quantized spectral values or may be noise-shaped and quantized MDCT coefficients.

The audio encoder is configured to encode at least a plurality of the spectral values 530, in order to obtain an encoded information 550 representing the spectral values. The encoded information 550 may be a part of the encoded audio information 512. However, the encoded audio information 512 may also comprise, optionally, further information, like a control information or a spectral shaping information.

The audio encoder 500 is also configured to obtain a gain information (for example, a global gain information) 560, which determines quantization steps of a quantization of spectral values, and which determines a bit demand for encoding the quantized spectral values.

The audio encoder 500 is configured to encode one or more most significant bits (of the quantized spectral values) using respective symbol codes for a plurality of the (quantized) spectral values using an arithmetic encoding, and to encode one or more least significant bits for one or more of the (quantized) spectral values. A respective symbol code may, for example, represent one or more most significant bits per spectral value for one or more spectral values.

The audio encoder is configured to encode one or more least significant bits associated with one or more of the (quantized) spectral values in dependence on a bit budget available, such that one or more least significant bits associated with one or more of the spectral values are encoded, while no least significant bits are encoded for one or more other spectral values for which one or more most significant bits are encoded and which comprise more bits than the one or more most significant bits. For example, the audio encoder may only provide encoded least significant bits for some of the spectral values, while no least significant bit information is provided for other spectral values which would also benefit from a least significant bit refinement.

Moreover, the audio encoder 500 is configured to provide the encoded audio information 512 using the encoded information 550 representing the spectral values.

It should be noted that the audio encoder 500 can be supplemented by any of the features, functionalities and details described herein, either individually or in combination.

6). Audio Encoder According to FIG. 6

Figure 6:
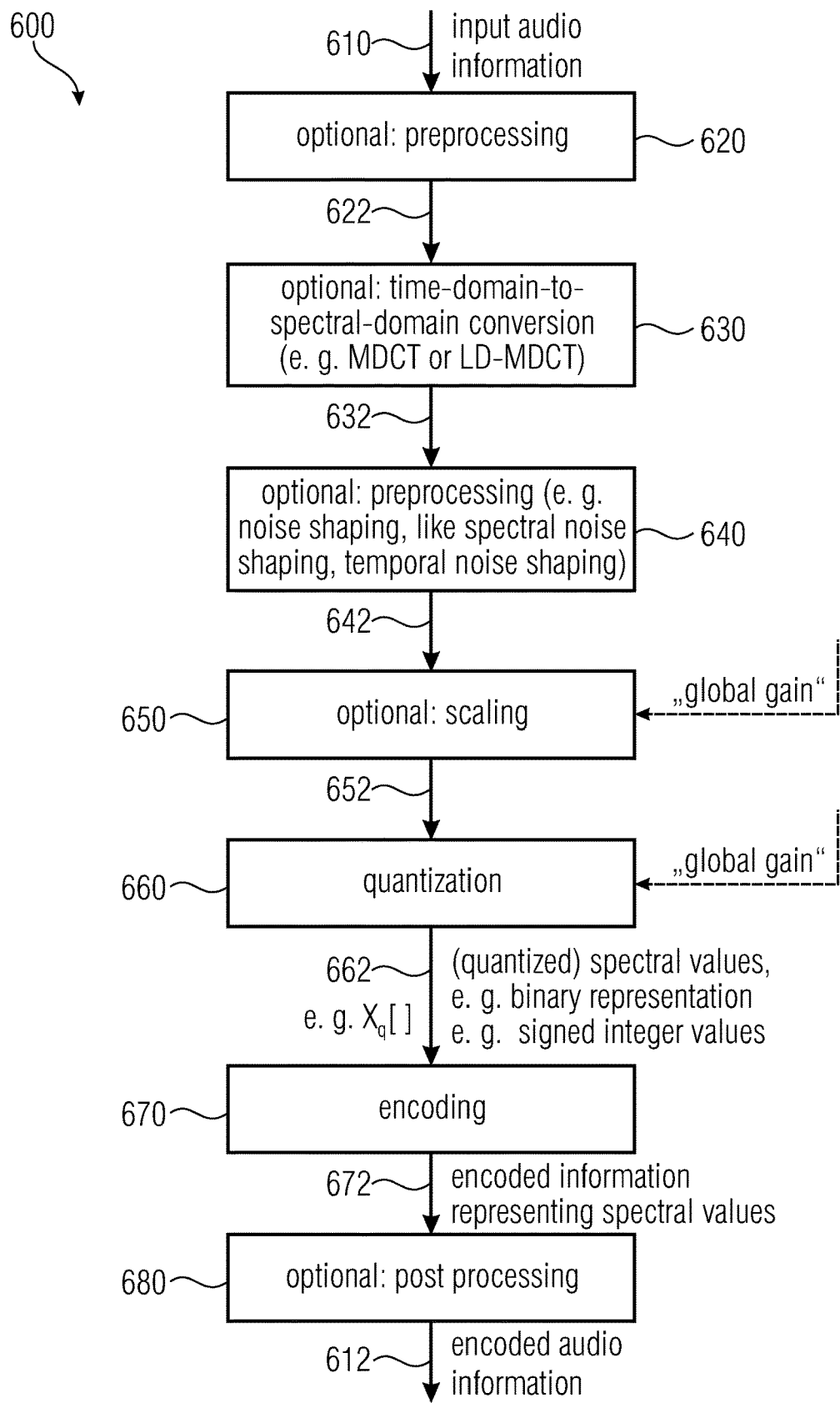
FIG. 6 shows a block schematic diagram of another audio encoder, according to an embodiment of the present invention.

FIG. 6 shows a block schematic diagram of an audio encoder, according to an embodiment of the invention.

The audio encoder according to FIG. 6 is designated in its entirety with 600.

The audio encoder 600 is configured to receive an input audio information 610 and to provide, on the basis thereof, an encoded audio representation 612.

The audio encoder 600 may comprise an optional preprocessing 620, which may apply some type of preprocessing (like, for example, a filtering, a bandwidth limitation, a time-domain noise shaping, or the like) on the input audio signal.

The audio encoder 600 may optionally comprise a time-domain-to-spectral-domain conversion 630 which may, for example, perform a modified-discrete-cosine-transform or a similar transform, like a low-delay-modified-discrete-cosine-transform. The time-domain-to-spectral-domain conversion 630 may, for example, receive the input audio information 610, or the preprocessed version 622 thereof and provide spectral values 632.

The audio encoder 600 may optionally comprise a (further) preprocessing, which receives the spectral values 632 and which may, for example, perform a noise shaping. For example, the (further) preprocessing 640 may perform a spectral noise shaping and/or a temporal noise shaping. Optionally, the preprocessing 640 may, for example, apply scale factors to scale different frequency bands ("scale factor bands") in accordance with a psychoacoustic relevance of the frequency bands (which may be determined, for example, by a psychoacoustic model). Accordingly, preprocessed spectral values 642 may be obtained.

The audio encoder 600 may optionally comprise a scaling 650 which may, for example, scale the spectral values 632 or the preprocessed spectral values 642. For example, the scaling 650 may scale the spectral values 632 or the preprocessed spectral values 642 using a global gain, to thereby provide scaled spectral values 652.

The audio encoder 600 also comprises a quantization (or quantizer) 660, which may receive the spectral values 632, the preprocessed spectral values 642 or the scaled spectral values 652. The quantization 660 may, for example, quantize the spectral values 632 or the preprocessed spectral values 642 or the scaled spectral values 652, to thereby obtain quantized spectral values 662, which may, for example, be signed integer values and which may, for example, be represented in a binary representation (for example, in a two's-complement representation). The quantized spectral values 662 may, for example, be designated with $X_q$. For example, a predetermined number of 256, 512, 1024 or 2048 quantized spectral values may be provided per frame, wherein different frequencies are associated with the quantized spectral values.

The encoder 600 may also comprise an encoding 670, which receives the quantized spectral values 662 ($X_q$) and which may provide, on the basis thereof, an encoded information representing the (quantized) spectral values 672.

It should be noted that the quantized spectral values 662 may correspond to the spectral values 330, 430, 530 and that the encoded information 672 representing spectral values may correspond to the encoded information 350, 450, 550 representing spectral values. Moreover, it should be noted that the encoding 670 may, for example, perform the functionalities described with respect to the encoders 300, 400, 500. However, the encoding 670 may also comprise the functionality described in the following (for example with reference to FIG. 8), or at least part of said functionality.

The audio encoder 600 also optionally comprises a post processing 680, which may apply a post processing to the encoded information 672.

Accordingly, the encoded representation 612 is provided, which typically comprises the encoded information 672. However, the encoded audio representation 612 may optionally also comprise additional information, like control information and information regarding the noise shaping (like scale factor information, linear prediction coefficients, or the like). The encoded audio representation may optionally also comprise global gain information and/or encoding mode information/decoding mode information and/or a "lastnz" information.

To conclude, the concept for the encoding of spectral values disclosed herein can, for example, be implemented in an audio encoder 600, wherein only some or all of the features of the scale factor encoding described herein can be taken over in the audio encoder 600.

7). Audio Decoder According to FIG. 7

Figure 7:
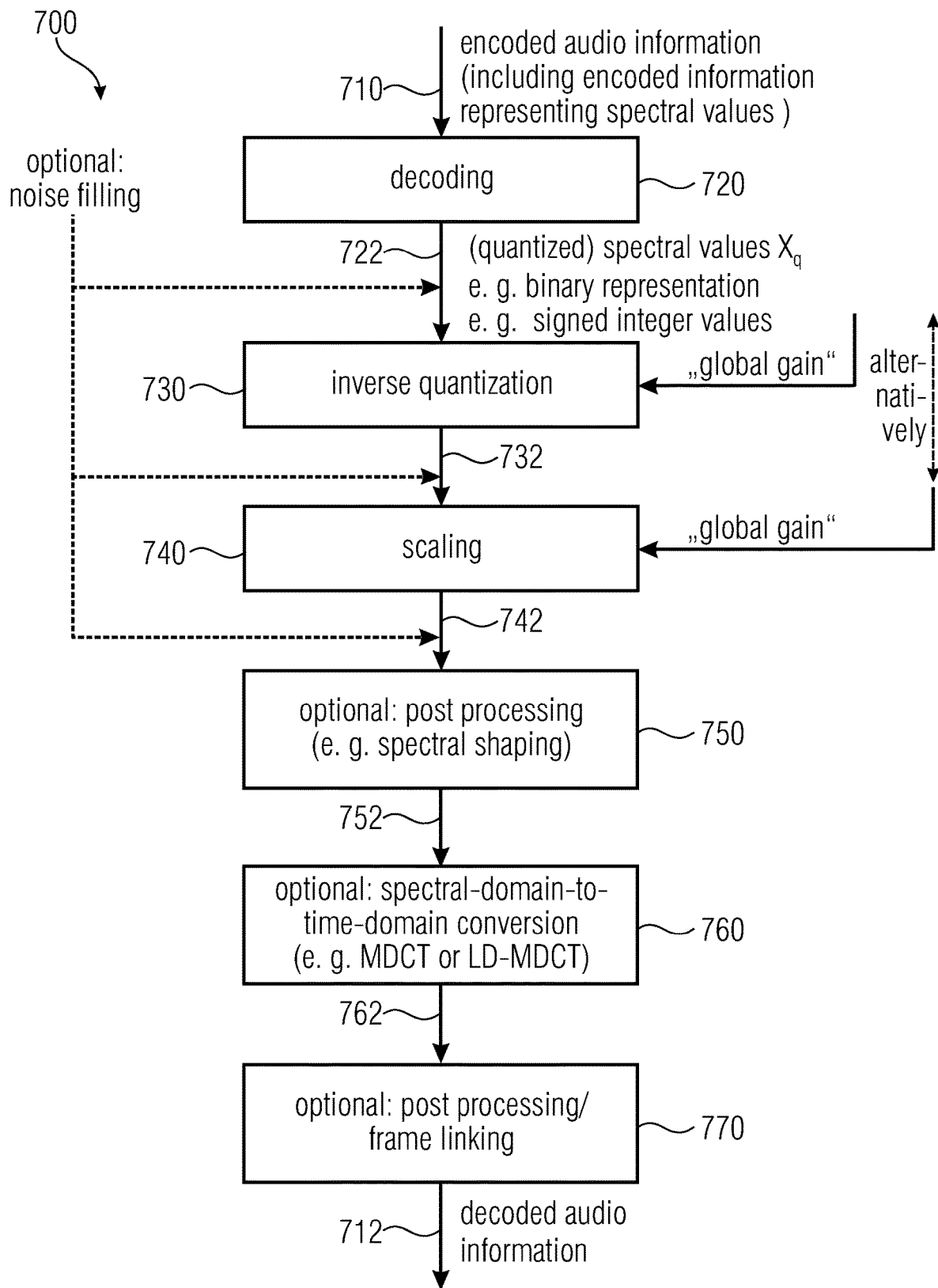
FIG. 7 shows a block schematic diagram of an audio decoder according to another embodiment of the present invention.

FIG. 7 shows a block schematic diagram of an audio decoder 700, according to an embodiment of the present invention. The audio decoder 700 is configured to receive an encoded audio information 710 (which may, for example, correspond to the encoded audio representation 612) and may provide, on the basis thereof, a decoded audio information 712. The audio encoder 700 may, for example, comprise a decoding 720 which receives the encoded audio information, or a part thereof, and provides, on the basis thereof, quantized spectral values 722 (also designated with $X_q$). For example, the decoding 720 may provide signed integer values in a binary representation (for example, in a two's complement representation).

The audio decoder 700 optionally comprises an inverse quantizer 730, which receives the quantized spectral values and which may perform an inverse quantization. For example, the inverse quantizer 730 may use a global gain information to adjust the mapping performed by the inverse quantization.

The audio decoder 700 optionally comprises a scaling 740, which may receive inversely quantized spectral values 732 provided by the inverse quantizer and which may perform a scaling, to thereby obtain inversely quantized and scaled spectral values 742. The scaling may optionally be dependent on the global gain.

The audio decoder 700 may also, optionally, comprise a post processing 750, which may receive the inversely quantized spectral values 730 or the inversely quantized and scaled spectral values 742 and which may perform a spectral shaping. For example, the spectral shaping may be a spectral noise shaping, and/or may be based on a scaling of different frequency bands using scale factors and/or may be based on a spectral shaping using linear prediction coefficients (wherein information controlling the spectral shaping may be included in the encoded audio information).

The audio decoder 700 may also, optionally, comprise a spectral-domain-to-time-domain conversion 760, which may receive the inversely quantized spectral values 732, the inversely quantized and scaled spectral values 742 or the post processed (for example, spectrally shaped) spectral values 752 provided by the post processing 750. The spectral-domain-to-time-domain conversion may, for example, perform an inverse modified discrete cosine transform, or a low-delay-inverse-modified-discrete-cosine-transform, or any other spectral-domain-to-time-domain conversion, to thereby obtain a time-domain audio representation 762 on the basis of the input information received by the spectral-domain-to-time-domain conversion.

The time-domain audio representation 762 may, for example, be input into an (optional) post processing 770, which may perform one or more post processing steps and which may, for example, also perform a time domain spectral shaping (for example, in the case that no spectral shaping is performed in the spectral domain, for example, using an LPC filtering).

Accordingly, the decoded audio information 712 may be provided on the basis of the output of the spectral-domain-to-time-domain conversion 762, and may possibly be obtained using some form of post processing and/or frame linking (like an overlap-and-add operation).

To conclude, the audio decoder 700 may perform some audio decoding functionality, wherein details, for example regarding a noise shaping or spectral shaping, may vary significantly from implementation to implementation. The spectral shaping or noise shaping may be performed in the spectral-domain (i.e., before the spectral-domain-to-time-domain conversion) and/or in the time-domain (for example, after the spectral-domain-to-time-domain conversion).

However, it should be noted that the encoded audio information 710 may correspond to the encoded audio information 110, 210, and that the encoded audio information 710 may comprise additional control information and information for adjusting a spectral shaping. Moreover, the quantized spectral values 722 may, for example, correspond to the decoded spectral values 132, 232.

Also, the decoding 720 may perform some or all of the functionalities described with respect to the audio decoders 100, 200.

Also, the decoding 720 may be supplemented by any of the features, functionalities and details described herein with respect to a decoding of spectral values (or spectral coefficients) which is disclosed herein, either individually or in combination.

8). Audio Encoding (Spectral Value Encoding) According to FIG. 8

Figure 8A:
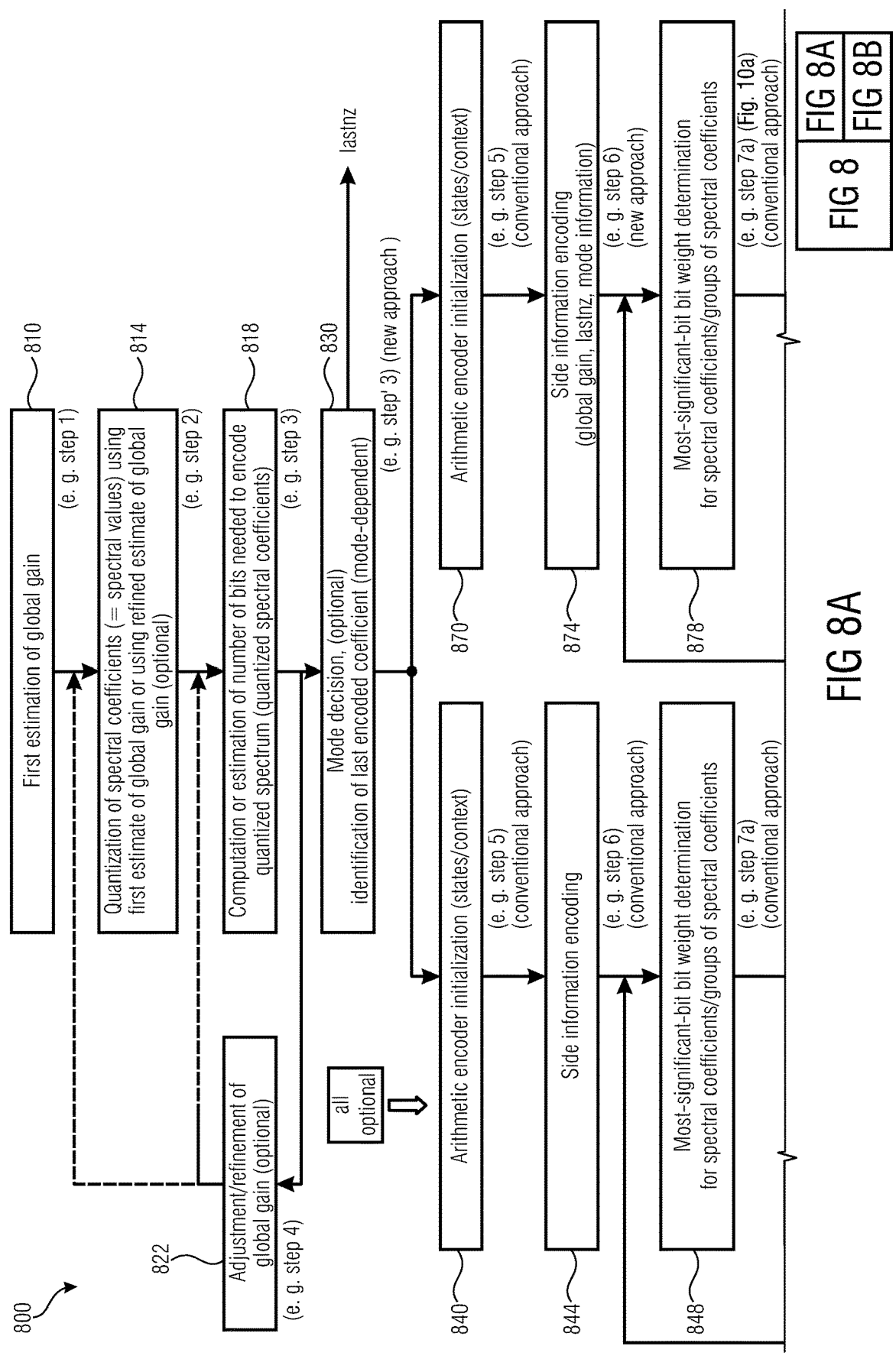

FIG. 8 shows a flowchart of a functionality which may be performed by any of the audio encoders described herein.

It should be noted that some or all of the functionalities described with reference to FIG. 8 (and also with respect to the following figures) can be taken over into the audio encoders of FIGS. 3, 4, 5 and 6.

It should also be noted that FIG. 8 is focused on the encoding of spectral values, which may, typically, be quantized spectral values. Advantageously, but not necessarily, the spectral values are signed integer values, which are represented by a binary two's-complement representation.

The functionality as shown in the flowchart 800 comprises a first estimation 810 of a global gain. This estimation may, for example, be made on the basis of a set of spectral values, which may be associated with a frame of an audio content, and may also consider a bit budget (or, equivalently, a bitrate budget).

The functionality of the audio encoder or of the audio encoding, as shown in FIG. 8, also comprises a quantization 814 of spectral coefficients (or, equivalently, spectral values) using a first estimate of a global gain or using a refined estimate of a global gain (which may be obtained in an iterative manner). In the step 814, there is a computation or estimation of a number of bits needed to encode the quantized spectrum (which may be represented by quantized spectral coefficients or by quantized spectral values).

On the basis of this computation or estimation of the number of bits needed, which is performed in step 818, the global gain may optionally be adjusted or refined in a step 822, to thereby obtain an improved estimate of the global gain.

Accordingly, by performing steps 810, 814 and 818, and optionally step 822, a "global gain information" (or, generally, an information describing a quantization of the spectral values) may be obtained, which results in a quantization such that an expected number of bits at least approximately fits a bit budget. However, it should be noted that, in view of complexity constraints, the global gain information may not be quite appropriate, such that an encoding of spectral values quantized in dependence on the global gain information may still consume more or less bits when compared to the bit budget.

It should be noted that any details regarding the computation of the global gain or regarding the quantization are not essential for the present invention. Rather, embodiments according to the present invention will work with any mechanism which provides quantized spectral values such that the spectral values can be encoded without excessively violating the bit budget.

The functionality 800 further comprises performing a mode decision 830. However, performing the mode decision can be considered as optional, since audio encoders using only one mode (designated herein as "second mode") are also possible. The mode decision 830 optionally comprises a mode-dependent identification of a last encoded coefficient. Depending on the mode decision, the determination of the last encoded coefficient may be performed in a different manner.

If the "first mode" is used, there may be a decision not to encode some non-zero spectral values in order to save bits (and to stay within the bit budget). In this case, a frequency associated with the last encoded spectral coefficient may be chosen to be smaller than a maximum frequency at which there is a non-zero spectral value. Consequently, some non-zero spectral values in a high frequency region may not be encoded in the first mode.

In contrast, in the second mode, at least most significant bits are encoded for all non-zero spectral coefficients. Accordingly, the last encoded coefficient may, for example, be chosen to be the highest-frequency non-zero spectral value.

An index describing the highest frequency spectral value which will be encoded is provided as a control information "lastnz" both in the first mode and in the second mode.

In the following, operation in the "first mode" will be described, taking reference to functionalities 840 to 869.

Operation in the first mode comprises an arithmetic encoder initialization 840. In this step, states and a context of the arithmetic encoder will be initialized.

In the step 844, some side information will be encoded, like a mode information indicating the usage of the first mode, the global gain and the information identifying the last encoded coefficient (lastnz).

Functionalities 848 to 864 are repeated for each spectral value, or for each group of spectral values. It should be noted that, in an embodiment, groups comprising two spectral values will be encoded. However, an encoding of individual spectral values is also possible.

The actual encoding of spectral values comprises a most significant bit weight determination for a spectral coefficient or for a group of spectral coefficients. For example, the number representation of one or two spectral coefficients is examined and it is identified which is the highest-valued bit position which comprises a "1". For example, a binary value "00010000" comprises its most significant bit at bit position 5, having bit weight 16. If a pair of spectral values is considered, which is to be encoded together, the maximum of the most significant-bit positions of the two spectral values is determined. For optional details, reference is made to the description of "step 7a" which will be provided below (confer the description of FIG. 10a).

In a step 852, a most significant bit weight will be encoded, which can be done, for example, by providing a sequence of specific encoded symbols, wherein the number of specific encoded symbols indicates the bit position (or, equivalently, the bit weight). For example, so-called "escape-symbols" can be used, which are known in arithmetic coding. For optional details regarding functionality 852, reference is made, for example, to the discussion of "step 7b" provided below (confer FIG. 10c).

Subsequently, a most significant bit encoding 856 is performed. In this step, one or more bits (for example, two bits) at the identified most-significant-bit bit position (or adjacent to the identified most-significant-bit bit position) are encoded. For example, if bit position 5, having bit weight 16 is identified in step 848, then bits having bit positions 5 and 4 (bit weights 16 and 8) of a first spectral value may be encoded together with bits at bit positions 5 and 4 (having bit weights 16 and 8) of a second spectral value. Thus, in the example, a total of four bits may be encoded together, wherein typically at least one of the two spectral values will have a "1" at bit position 5 (bit weight 16). For example, the four mentioned bits may be mapped onto a symbol "sym" using a context-based arithmetic coding. For optional details, reference is made, for example, to the description of "step 7c" which is provided below (confer FIG. 10*d*).

In a step 860, there is a remaining bit encoding. In the step 860, there may, for example, be an encoding of (all) less significant bits (including one or more least significant bits) for all spectral values which have been encoded in step 856 and which comprise more bits than the one or more most significant bits (e.g. numbits>2). In other words, for each spectral value which has partially (but not completely) been encoded in step 856 (because the encoding of the one or more most significant bits was not sufficient to represent the spectral value with full accuracy, down to a bit having bit weight 1), all less significant bits will be encoded.

Taking reference to the above example, if bits 5 and 4 have been encoded in step 856 for the first spectral value and for the second spectral value, then bits 1, 2 and 3 will be encoded for the first spectral value and for the second spectral value in step 860.

For optional details, reference is made to the description of step 7d of the conventional approach.

In step 864, there is a sign encoding for all non-zero spectral values for which the one or more most significant bits have been encoded. For optional details, reference is made to the description of step 7e (confer FIG. 10*f*).

As mentioned before, steps 848 to 864 are repeated for each spectral value, or for each group of spectral values the most significant bits of which are encoded together.

In the step 868 there is a determination of a number of used bits, and in step 869, there is, optionally, an encoding of a refinement information if there are still unused bits available.

To conclude, when operating in the first mode, some non-zero spectral values are skipped in the encoding, but all spectral values which are actually encoded are encoded with full resolution (up to the least significant bit). Accordingly, a variation of the needed bitrate can be made by decided how many spectral values are left unencoded (skipped in the encoding).

In the following, the operation in the second mode which may, in some embodiments, be the only mode, will be described taking reference to functionalities 870 to 898.

The encoding in the second mode comprises an arithmetic encoder initialization 870, in which states in a context of the arithmetic encoding will be initialized.

In the step 874, some side information will be encoded, like a global gain information, "lastnz" and a mode information indicating that the second mode is used (provided that the encoder is switchable between the first mode and the second mode).

Functionalities 878 to 894 are performed for each spectral value to be encoded, or for each group of spectral values to be encoded jointly.

In step 878, there is a most significant bit weight determination for spectral coefficients (or spectral values) or for groups of spectral coefficients (or spectral values). For optional details, reference is made to the explanation regarding functionality 848 and also to the description of "step 7a" below (confer FIG. 10*a*).

In step 882, there is a least significant bit cancellation and a least significant bit information processing. For example, the least significant bit information is cancelled in the number representation of such spectral values which comprise both one or more most significant bits and a least significant bit (numbits>2). For example, all odd spectral values can be set to the next (adjacent) even value, an absolute value of which is smaller than the absolute value of the odd value. For example, a value of 1 can be set to 0, a value of 3 can be set to 2, a value of −1 can be set to 0 and a value of −3 can be set to −2. For optional details, confer steps 1010*f*,1011*f* mentioned below.

However, information about the least significant bit, and also information about the sign of the spectral value (if the spectral value is set from +1 to 0 or from −1 to 0) can be stored in a least significant bit information bitstream (e.g. lsbs[ ]). For details, reference is made, for example to the "step 7a bis", which is described below (confer FIG. 10*b*).

Moreover, there is a most significant bit weight encoding 886, which may be equal to the most significant bit weight encoding 852. For optional details, confer the description of Step 7b (FIG. 10*c*).

Also, there is a most significant bit encoding 890, which may be identical to the most significant bit encoding 856, except for the fact that the spectral values modified in step 882 are used (with the least significant bit value removed). For optional details, see the description of Step 7c and FIG. 10*d*.

Moreover, there is a less-significant-bit encoding 892. In the less-significant-bit encoding 892, there is an encoding of less significant bits, except for one or more least significant bits. In other words, bits which are between the least significant bits and the one or more most significant bits encoded in step 890 may be encoded, for example by sequentially writing them into a bitstream. For optional details, reference is made to the below description of "step 7d—new version" (confer FIG. 10*e*).

Moreover, there is a sign encoding 894, which is substantially identical to the sign encoding 864, except for the fact that the sign is determined on the basis of a spectral value as modified in step 882.

For example, if the original (quantized) spectral value was +1, the spectral value has been changed to 0 in step 882, and there is no sign encoding in step 894, because this sign is only encoded for non-zero values. Similarly, if the spectral value originally was −1 (after the quantization), the spectral value is amended to 0 in step 882, and no sign is encoded in step 894 (because signs are not encoded for zero values).

For optional details regarding the sign encoding, reference is made to the description of step 7e (FIG. 10*f*).

Steps 878 to 894 are repeated for all spectral values or groups of spectral values the most significant bits of which are jointly encoded.

In step 896, there is a determination of a number of bits available for an encoding of least significant bits. This number is designated, for example, with nlsbs and may, for example, designate a number of unused bits.

In step 898, the unused bits (the number of which was determined in step 896) are used for the "actual" encoding of the least significant bits (inclusion of the least significant bit information obtained in step 882, or a part thereof, into the encoded audio representation). For example, a bit sequence which was determined in step 882, or a portion thereof, is added to an encoded audio representation. This bit sequence comprises the least significant bits and signs for those spectral values which have been changed to be zero by the cancellation of the least significant bits.

Accordingly, in the second mode, symbols representing one or more most significant bits, a bit sequence representing the less significant bits except for the one or more least significant bits (and some sign information) and the bit sequence representing the least significant bits (and some sign information) is provided. In the sequence representing the less significant bits, the less significant bits (and signs) may be included spectral-value-by-spectral-value or sequentially for pairs of spectral values encoded jointly. Also, in the bit sequence representing the least significant bits, the least significant bits are included spectral-value-by-spectral-value.

It should be noted that further optional details regarding the encoding 800 will be described below. It should also be noted that references to the pseudo program code representation of the steps are included in FIG. 8. The details described in the pseudo-program code representations are not essential, but can optionally be included individually for each of the steps shown in FIG. 8.

9. Audio Decoding (Spectral Value Decoding) According to FIG. 9

Figure 9A:
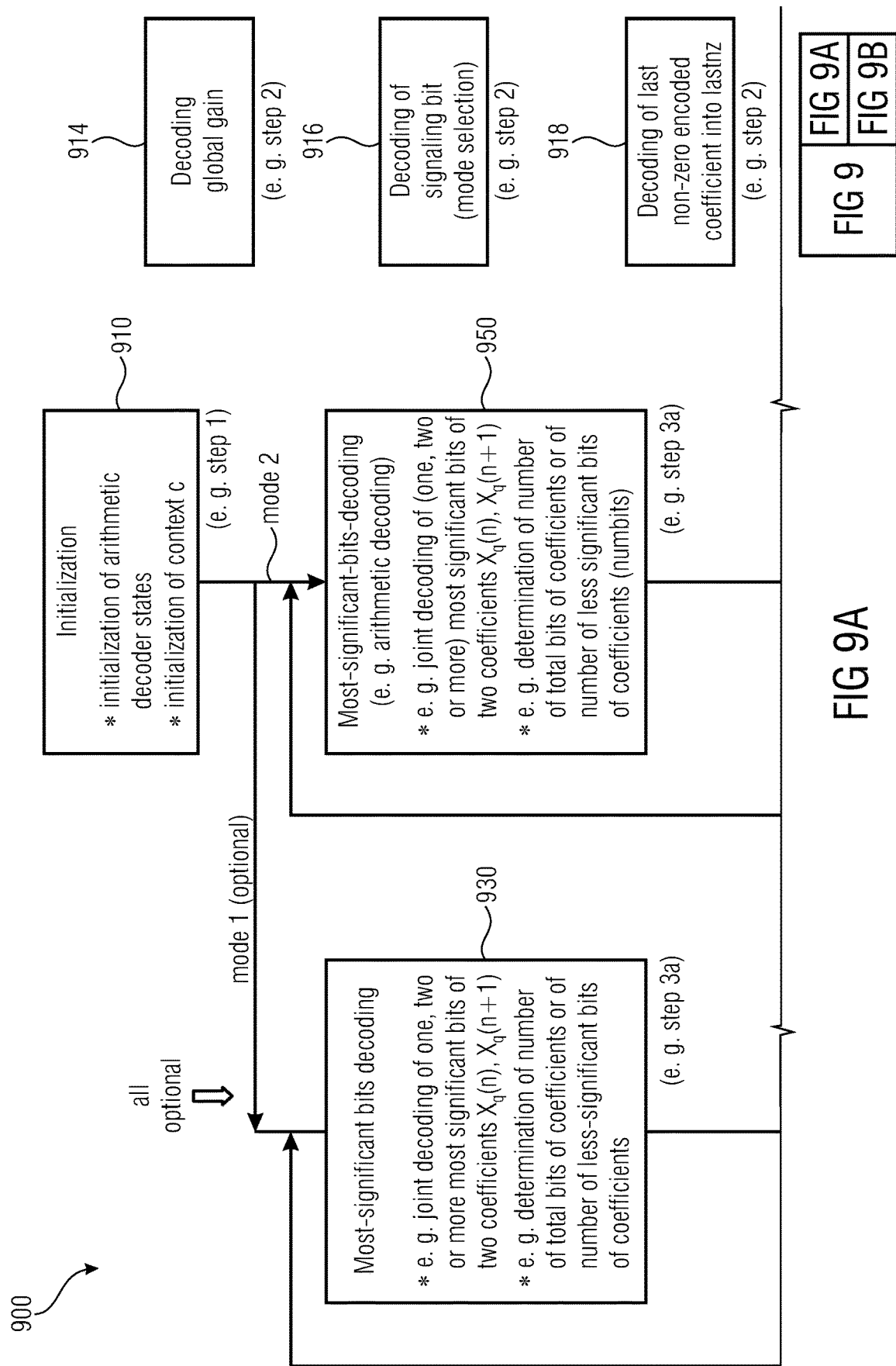

FIG. 9 shows a schematic representation of functionalities which may be performed by the audio decoders as described herein.

It should be noted that some or all of the functionalities described in FIG. 9 may be performed by the audio decoders. It should be noted that it will be sufficient to implement one or several of the functionalities described in FIG. 9 individually, but that it is advantageous to implement the full functionality. In particular, the functionality disclosed in FIG. 9 is related to the provision of decoded spectral values on the basis of an encoded information representing spectral values. The functionality as shown in FIG. 9 may, for example, be implemented in the decoding 720 of the audio decoder 700.

The functionality 900 comprises, in a step 910 an initialization of arithmetic decoder states and initialization of a context c which is used by the arithmetic decoder. For optional details, reference is made, for example, to the "step 1" of the decoding as described below.

The functionality 900 also comprises a decoding 914 of a global gain or global gain information, a decoding 916 of a signaling bit for a mode selection (selection of mode 1 or of mode 2) and a decoding 918 of an information about a last non-zero encoded coefficient ("lastnz"). It should be noted that the steps 916 and 918 should be considered as being optional, and that the step 914 can be replaced by the decoding of any other information which defines a quantization.

The functionality 900 comprises a decoding in a first mode which is shown in steps 930 to 948 and a decoding in a second mode, which is shown in steps 950 to 972. In should be noted that the operation in the first mode, as described in steps 930 to 948, should be considered as being optional. In other words, it is also sufficient if the audio decoding can operate in the second mode which is described by steps 950 to 972, even though the possibility to switch between two modes extends the functionality and brings along some advantages.

Moreover, the functionality 900 also comprises performing inverse quantization 980 of decoded spectral values, which may, for example, be performed by block 730 in the decoder 700.

In the following, the operation in the first mode will be described.

The decoding in the first mode comprises a most significant bit decoding 930 which may, for example, comprise a joint decoding of one, two or more most significant bits of two coefficients, which may be designated with $X_q(n)$ and $X_q(n+1)$. The most significant bit decoding 930 may, for example, comprise a determination of a number of total (encoded) bits of the coefficients (e.g. numbits) or a number of less-significant bits of the coefficients which follow the jointly encoded most significant bits.

For example, it may be recognized by the decoder (for example on the basis of a signaling information in the encoded audio representation) that one of the two spectral coefficients decoded together comprises a non-zero value (most significant bit) at a fifth bit position (having bit weight 16). Accordingly, bits at the positions 4 and 5 (having bit weights of 8 and 16) will be decoded jointly for the two spectral values which are decoded together (as a group). The bit position of the most significant bit can be encoded, for example, using an "escape-symbol mechanism" which is known in the art of arithmetic encoding and decoding. For optional details, reference is made, for example to the description of "step 3a" below (FIG. 11a).

The decoding in the first mode further comprises a less significant bit decoding 934. For example, there may be a decoding of (all) less significant bits, including one or more least significant bits, of all spectral values for which one or more most significant bits have been decoded. For example, the less significant bits may be read from a bit sequence. For details, reference is made, for example to "step 3b, conventional approach" as described below.

The decoding in the first mode comprises a sign decoding 938, in which signs may be decoded for all spectral values for which a non-zero value has been decoded in steps 930, 934. For details, reference is made, for example, to the below discussion of "step 3c" (confer FIG. 11c).

The decoding in the first mode comprises a zeroing 942 of uncoded spectral coefficients. For example, all spectral coefficients, frequencies of which are above a certain frequency which has been signaled from an encoder to the decoder may be set to zero. For details, reference is made, for example, to the below description of "step 4".

The decoding in the first mode also comprises a determination 944 of a number of unused bits. For example, it may be determined how many bits of the total bit budget have not been used in the previous decoding steps.

The decoding in the first mode may further, optionally, comprises a refinement 948 in which, for example, spectral values which have been decoded may be further refined. For details, reference is made, for example to the below description of "step 6".

Accordingly, in the first mode, spectral values up to a maximum frequency defined by the information about the last non-zero encoded coefficient information will be fully decoded (from the most significant bit to the least significant bit), including a decoding of the sign.

However, it should be noted that details, as described below with reference to "step 3a" to "step 6" may optionally be introduced in these steps. However, it should be noted that it is not essential to introduce all the details described below, and that it is sufficient in some embodiments to keep to the details below only in one of the steps or in some of the steps.

In the following, a decoding in a second mode will be described taking reference to steps 950 to 972.

A decoding in the second mode comprises a most significant bit decoding 950, which may, for example, comprise an arithmetic decoding of one or more most significant bits. For example, the most significant bit decoding 950 may comprise a determination of a number of total bits of the coefficients, or of a number of less significant bits of the coefficients, or of a bit position (or a bit weight) of the one or more most significant bits. Moreover, the most significant bit decoding 950 may comprise a joint decoding of one, two or more most significant bits of two spectral coefficients or spectral values $X_q(n)$, $X_q(n+1)$.

For optional details, reference is made, for example to the below description of "step 3a" (FIG. 11a).

The decoding in the second mode also comprises a less-significant-bit-decoding 954, which can be considered as being optional. In the less-significant-bit-decoding 954, a decoding of less significant bits, except for one or more least significant bits, takes place. The less significant bit decoding 954 may be similar to the less significant bit decoding 934, except for the fact that a least significant bit, or multiple least significant bits, are omitted in the less-significant-bit-decoding 954. For optional details, reference is made, for example, to the below description of "step 3b" (new version) (FIG. 11b).

The decoding it the second mode also comprises a sign decoding 958 in which signs of the spectral values decoded in steps 950, 954 are decoded, as long as the decoded portion of the spectral values which are decoded in steps 950, 954 (which do not comprise the one or more least significant bits) indicate a non-zero value. For optional details, reference is made, for example, to the below description of "step 3c" (FIG. 11c).

It should be noted that steps 950, 954, 958 are repeated for all spectral values to be decoded, or for all groups of spectral values to be decoded, wherein a number of spectral values to be decoded may, for example, be indicated by the last-non-zero-encoded coefficient information provided by the encoder.

The decoding in the second mode also comprises a zeroing 962 of uncoded spectral coefficients, which have not been provided by an encoder and which have not been decoded in view of the last-non-zero encoded coefficient information. For optional details, see the below description of step 4.

Moreover, there is a determination 968 of a number of bits available for a least-significant-bit decoding. In other words, a number of unused bits (bits of the bit budget which have not been used in the decoding steps 950, 954, 958) is determined. For details, reference is made, for example, to the below description of "step 5".

The decoding in the second mode also comprises a selective decoding 972 of one or more least significant bits for coefficients having more bits than the one or more most significant bits. In other words, one or more least significant bits may be decoded for only some of the spectral values which have been decoded in steps 950, 954, 958, such that only some (but not all) of said spectral values are refined by least significant bit information. Step 972 may, for example, include a sign consideration for such spectral values for which a zero value has been decoded in steps 950 and 954 (such that no sign has been decoded in step 958) and for which the least significant bit information indicates a non-zero value. Accordingly, the spectral values (or spectral coefficients) will be refined by least significant bit information from a bit sequence comprising least significant bits and sign information. The number of spectral values which will be refined depends on a result of the determination 968 of the number of bits available for least significant bits.

Accordingly, the decoding in the second mode will provide some spectral values with full precision (including a least significant bit) and some spectral values with reduced precision (without least significant bits).

It should be noted that the details described below for "step 3a" to "step 6" can optionally be used. However, the details described below for "step 3a" to "step 6" should not be considered as being essential. Also, it should be noted that details can be introduced for individual steps without raising the need to use all the details described below taking reference to "step 3a" to "step 6".

Moreover, the functionality 900 also comprises performing an inverse quantization 980, wherein the spectral values decoded in the first mode and/or the spectral values decoded in the second mode will be inversely quantized. In the inverse quantization, the global gain information decoded in step 914 can be applied. However, different possibilities for setting the inverse quantization can also be used.

10). Encoding Method According to FIGS. 10a-10f

In the following, an example implementation of the steps to quantize and encode a MDCT spectrum $X(n)$, $0 \leq n < N$ will be described. The method may, for example be used in (or performed by) the audio encoders 300, 400, 500 or in the audio encoder 600. Features described herein can also be taken over, individually or in combination, into the functionality 800. In particular, a focus will be on the operation on mode 2, which can be the only mode in some embodiments.

In the following, a first step will be described. The first step comprises a first estimation of the global gain. This first estimation, for example, does not quantize the spectrum nor compute the number of bits consumed by the arithmetic encoder. It is based only on the energy of groups of MDCT coefficients and a low-complexity iterative approach to obtain a first coarse estimation of the global gain. For example, reference is made to section 1.3.8.2 in the NBC specification.

In the following, a second step will be described. The second step comprises a quantization of the MDCT spectrum using the global gain found in step 1. This produces the quantized MDCT spectrum $X_q(n)$ $0 \leq n < N$. For details, reference is made, for example, to section 1.8.3 in the NBC specification.

In the following, a third step will be described. The third step comprises a computation of the number of bits needed to encode the quantized spectrum $X_q(n)$. In addition, this step may also make the decision whether to use a conventional approach (also designated as "first mode") or the new approach (also designated as "second mode"). For example, the step may set a signaling bit mentioned herein (for example, a signaling bit signaling whether the first mode or the second mode should be used). For example, the new approach (second mode) may be used if a number of consumed bits is above the bit budget and if some criteria is met (for example, a high bitrate is used). The conventional approach (first mode) may be used if a number of consumed bits is below the bit budget, or if the criteria (for example, the criteria for the usage of the second mode) is not met.

Finally, the third step finds the last non-zero encoded coefficient lastnz. It is found like described in the description of the conventional approach (i.e., in order to truncate the spectrum) only if the conventional approach is selected ("the step finds the index of the last non-zero encoded coefficient lastnz such that the consumed number of bits of the truncated spectrum can fit within the bit budget, see section 1.3.8.4 in the NBC specification"). If the new approach (second mode) is selected, the spectrum is not truncated and lastnz corresponds then simply to the last non-zero coefficient (for example, to the highest-frequency non-zero spectral coefficient).

In the following, step 4 will be described. The fourth step comprises adjusting the global gain as a function of the number of bits computed in step 3. If the number of bits is too high, the global gain is increased. If the number of bits is too low, the global gain is decreased. Then, steps 2 and 3 are optionally redone. Step 4 can be repeated several times until an optimal global gain is found. However, if low-complexity is needed, the step 4 may not be performed, or may be performed only once (like, for example, in NBC, see section 1.3.8.6 in the NBC specification).

In the following, step 5 will be described. Step 5 comprises an initialization of arithmetic encoder states, and an initialization of a context c which is used by the arithmetic encoder.

In the following, step 6 will be described. Step 6 comprises encoding the global gain and last non-zero encoded coefficient lastnz as side information. Additionally, this step also encodes the signaling bit (for example, the signaling bit indicating whether the first mode or the second mode is used) as side information.

In the following, step 7 will be described. However, step 7 comprises repeating the sub-steps 7a to 7e for all (n=0; n<lastnz; n+=2). In other words, steps 7a to 7e are repeated starting from n=0 as long as n is smaller than lastnz, wherein n is incremented by two in each iteration. Two spectral values are processed in each iteration, and typically all non-zero spectral values will be processed (since, in mode 2, lastnz will be chosen such that at least most significant bits will be encoded for all non-zero spectral values).

In the following, step 7a will be described. Step 7a comprises computing the minimum number of bits needed to represent the amplitude (or magnitude, or absolute value) of the two coefficients $X_q(n)$ and $X_q(n+1)$ (which are integer values). For details regarding an example implementation, reference is made to the pseudo program code of FIG. 10*a* (confer reference numeral 1000*a*). A coefficient having the larger absolute value determines the minimum number of bits needed to represent the amplitude (magnitude, absolute value) of the two coefficients.

In the following, step 7a-bis will be described, which may, for example, be performed between steps 7a and 7b. In other words, step 7a-bis is an additional step just after step 7a, which is performed if numbits is larger than two (numbits>2). In other words, step 7a-bis is performed if more bits than the two most significant bits are needed to represent $X_q(n)$ and/or $X_q(n+1)$. In step 7a-bis, the least significant bit of each coefficient is "saved" and the coefficient is then modified such that its least significant bit is now zero. The sign of the coefficient is also saved in case the coefficient was originally non-zero and becomes zero after setting its least significant bit to zero.

For details regarding this functionality, reference is made, for example to the pseudo program code representation shown in FIG. 10*b*.

As can be seen at reference numeral 1010*a*, a least significant bit of an absolute value of $X_q[n]$ is extracted and saved in a bit sequence lsbs at a position indicated by running variable nlsbs (cf.: reference sign 1010*b*). The running variable nlsbs is then increased to refer to the next unused bit within the bit sequence lsbs. If it is found that $X_q$ is +1 or −1 (condition at reference numeral 1010*c*), a sign bit is set to be 0 if $X_q[n]$ is larger than 0 and set to be 1 if $X_q$ is smaller than 0, as can be seen at reference numeral 1010*d*. Also, if $X_q$ is +1 or −1, the sign bit is saved, as a next bit, in the bit sequence lsbs, which is shown at reference numeral 1010*e*. Moreover, the signed spectral value $X_q$ is then modified in that uneven values are set to adjacent even values having a smaller magnitude. This functionality is shown at reference numeral 1010*f*.

However, it should be noted that the order of the processing steps 1010*a* to 1010*f* could be changed, as long as the overall functionality remains unchanged. Naturally, it would also be possible to store intermediate quantities.

Moreover, it should be noted that the same functionality is also performed for the spectral value $X_q[n+1]$, which is shown at reference numerals 1011*a* to 1011*f*.

Accordingly, step 7a-bis provides a bit sequence lsbs, which represents the least significant bits of all spectral values for which numbits is larger than two, wherein sign bits are included in the bit sequence lsbs for spectral values for which numbits is larger than two and which take the value +1 or −1 (for example, because they are in a group with a larger spectral value). The bits in the sequence lsbs are ordered in the sequence of the spectral values, but there are no bits in the sequence lsbs for such spectral values for which numbits is not larger than two (i.e., which are fully represented by the two most significant bits).

In the following, a step 7b will be described. In this step 7b, an information regarding the value "numbits" will be encoded (when numbits was determined in step 7a and describes a bit weight of the most significant bits which are encoded for a spectral value or a group of spectral values). For example, step 7b comprises encoding numbits-2 escape values (for example, represented by VAL_ESC=16) if numbits is larger than 2. For details, reference is made to FIG. 10*c* (reference numeral 1020*a*). For example, the escape values are encoded using an arithmetic encoding, wherein a context is evaluated to obtain probabilities for the arithmetic encoding. The escape symbols are encoded with arithmetic encoding using the probabilities p. Moreover, the context is updated.

However, any details of this step are not essential for the present invention.

In the following, a step 7c will be described. Step 7c comprises encoding two most significant bits of each coefficient $X_q(n)$ and $X_q(+1)$ as a single symbol sym (whose value lies between 0 and 15). In step 1040*a*, it is determined, on the basis of the value numbits, by how many bits the (binary) number representation of $X_q[n]$ and $X_q[n+1]$ (as modified in step 7a-bis for the case of numbits>2) will be shifted to the right. This is shown at reference numeral 1040*a* and can be considered as optional. In step 1040*b*, $X_q[n]$ is processed such that bits at bit positions determined by numbits are stored in a variable a. In step 1040*c*, $X_q[n+1]$ and is processed such that bits at bit positions determined by numbits are taken over into variable b. In other words, bits at bit positions considered as two most significant bits are taken over in variables a and b.

Consequently, a four-bit value is determined which combines the two most significant bits of $X_q[n]$ and $X_q[n+1]$, as it is shown at reference numeral 1040*d*. Variable sym then represents a four-bit symbol comprising two most significant bits of each of the two spectral values to be encoded together. Then, probabilities for the arithmetic encoding are determined from the context c of the arithmetic encoding, and the symbol sym is encoded using an arithmetic encoding and considering the probabilities p determined from the context. Subsequently, the context is updated.

Accordingly, an arithmetic encoded representation of symbol sym representing the two most significant bits of the two spectral values to be jointly encoded is obtained.

In the following, step 7d will be described. Step 7d comprises an encoding of the remaining bits (also designated as "intermediate bits" or "less significant bits") except for the least significant bit. For details, reference is made to FIG. 10e, which shows a pseudo-program code representation. As can be seen, running variable b runs from b=1 to numbits-3. Accordingly, bits are encoded starting from bit position 2 (having bit value 2) provided that the two most significant bits which are encoded together in step 7c are at least at bit positions 3 and 4 (having bit values 4 and 8) or at higher bit positions. Accordingly, bits at bit positions (b+1) of the absolute values of the spectral values $X_q[n]$ and $X_q[n+1]$ are encoded as side information. Accordingly, any bits which lie between the least significant bit and the two most significant bits are encoded as side information in step 7d, provided that such bits exist (which depends on the bit positions of the most significant bits as defined by numbits).

For example, a loop shown at reference numeral 1050a is executed from b=1 to b=numbits-3 (provided that numbits is larger than or equal to 4). As can be seen at reference numeral 1050b, a bit at bit position b+1 of the absolute value of $X_q[n]$ is encoded as side information. As can be seen at reference numeral 1050c, a bit at bit position b+1 of the absolute value of $X_q[n+1]$ is encoded a side information. Steps 1050b and 1050c are repeated until running variable b reaches numbits-2.

In the following, step 7e will be described. Step 7e includes encoding the sign of each coefficient (or spectral value) except if the coefficient is 0. It should be noted that, in step 7e, the coefficients modified in step 7a-bis are considered. In other words, the sign of the spectral value $X_q$ will be encoded if the original value of $X_q$ (before the modification in step 7a-bis) is larger than or equal to 2 or smaller than or equal to −2. In contrast, if $X_q[n]$ was originally equal to 0, or was set to 0 in step 7a-bis, there is no encoding of the sign in step 7e. The check as to whether the (modified) spectral value $X_q[n]$ is equal to 0 or not is seen at reference numeral 1060a, and the provision of a sign bit "0" for a positive value of $X_q[n]$ and of a sign bit "1" for a negative value of $X_q[n]$ can be seen at reference numeral 1060b. The encoding of the sign value as side information is shown at reference numeral 1060c.

A similar functionality is also performed for $X_q[n+1]$, which is shown at reference numerals 1061a, 1061b and 1061c.

In the following, step 8 will be described. Step 8 comprises finalizing the arithmetic encoder and computing a number of unused bits. For example, it may be computed how many bits of the total bit budget remain unused in steps 7b, 7c, 7d and 7e.

In the following, step 9 will be described. In step 9, (if the new approach is selected, or if the second mode is selected, or if the encoder only uses the second mode) residual quantization/encoding (as in the conventional concept) is not used. If there are unused bits, these are used for encoding the nlsbs bits which are saved in lsbs[ ] (see step 7a-bis). In other words, if it is found, for example after the completion of steps 7a to 7e, that not all bits of the bit budget have been used, a number of bits of the bit sequence lsbs provided in step 7a-bis will be included into a bitstream (or, generally, into an encoded audio representation). The number of bits of the bit sequence lsbs included into the encoded audio representation may, for example, be determined by the number of unused bits, such that the bit budget is fully used (for example, up to 1 or 2 bits, or even totally).

To conclude, it should be noted that the steps described herein, or details thereof, can be used when performing the functionality of FIG. 8. For example, steps 1 to 4 described here, or details thereof, may be used to implement functionalities 810, 814, 818, 830.

Moreover, steps 5 to 9 described here may be used to implement functionalities 870, 874, 878, 882, 886, 890, 892, 894, 896 and 898. However, it should be noted that the details described herein can be individually taken over into the steps of the functionality 800.

11). Audio Decoding According to FIGS. 11a to 11d

In the following, an audio decoding functionality will be described taking reference to FIGS. 11a to 11d. The decoding functionality described here can be used to provide decoded spectral values on the basis of an encoded information representing the spectral values. The functionality described here can be used, for example, in the audio decoders according to FIGS. 1 and 2 and the audio decoder 700 according to FIG. 7 (for example, to implement the decoding 720). The steps described here can also be used in the functionality 900, for example to implement functionalities 910, 950, 954, 958, 962, 968, 972.

In the following, the functionality for decoding spectral values will be described step-by-step (focusing on the decoding in the "second mode" or in the case that only the second mode is used).

In the following, a first step will be described. The first step comprises an initialization of the arithmetic decoder states and an initialization of a context c used by the arithmetic decoder.

In the following, a second step will be described. The second step comprises decoding the global gain (or a global gain information, or any other information describing the inverse quantization) and the last non-zero encoded coefficient information "lastnz". In other words, the second step comprises decoding some side information or control information. Additionally, the second step also decodes the signaling bit (for example, the signaling bit defining whether the first mode or the second mode should be used).

In the following, step 3 will be described. For example, step 3 comprises repeating steps 3a to 3c for all (n=0; n<lastnz; n+=2). In other words, steps 3a to 3c will be repeated for all spectral values to be decoded (as defined by lastnz), wherein groups of two spectral values will be processed together.

In the following, step 3a will be described. Step 3a comprises decoding the two most significant bits of both coefficients (or spectral values) $X_q(n)$ and $X_q(n+1)$. Details regarding step 3a are shown in FIG. 11a.

Step 3a comprises a determination of the variable numbits, which describes a bit position of the two most significant bits to be decoded. The variable numbits is initialized to 1 at reference numeral 1110a. Subsequently, probabilities p are obtained from the context (which has been initialized before) in step 1110b and symbol sym is decoded using an arithmetic decoding and using the probabilities p in step 1110c. Subsequently, the context is updated in step 1110d and the variable numbits is increased by 1 in step 1110e. However, if the decoded symbol sym is the escape symbol, steps 1110b, 1110c, 1110d, 1110e are repeated. Thus, if the first decoded symbol is no escape symbol, numbits is set to be equal to 2 and the most significant bit positions to be decoded would define the bits at bit positions 1 and 2 (having bit values 1 and 2). However, if one or more escape symbols are identified by the arithmetic decoding, the variable numbits is increased further, indicating a higher bit weight of the most significant bits to be decoded, which also indicates that there is "place" for one or more least significant bits. However, as soon as it is found that the last-decoded symbol is not an escape symbol, the most significant values, having bit weights defined by variable numbits, are determined on the basis of the decoded symbol. For example, if the symbol is represented by a four bit value, two bits of the four bit value are used to define the two most significant bits of spectral value $X_q[n]$, and two bits of the four bit value are used to define the two most significant bits of the spectral value $X_q[n+1]$. Details can be seen at reference numerals 1110*f* and 1110*g*. Accordingly, 0, 1 or more escape symbols, which are decoded by the arithmetic decoding, determine the bit weights of the most significant bits, and a symbol which is not an escape symbol defines the bit values of the most significant bits of two spectral values.

In the following, step 3a-bis will be described. Step 3a-bis is an additional step just after step 3a. This step saves numbits in an array numbits[n] so that it can be reused later in step 6. In other words, the values of the variable numbits are maintained for all pairs of spectral values decoded for a later use. This is, however, only an auxiliary step.

In the following, step 3b will be described. Step 3b comprises decoding the remaining bits except the least significant bit. For details, reference is made to FIG. 11*b*. It should be noted here that step 3b only decodes remaining bits if numbits is larger than or equal to 4, i.e., if the binary number representations of the spectral values (or of at least one spectral value out of a pair of spectral values processed together) comprises more bits than two most significant bits and one least significant bit (i.e. at least 4 bits). These bits, bit positions of which are between the least significant bit and the two most significant bits are decoded subsequently, starting from the bit having bit position 2 and proceeding towards bits having higher bit positions (if any). For this purpose, running variable b is initialized to 1 and the bit decoding is performed as long as b is smaller than numbits-2. A loop functionality is shown at reference numeral 1120*a*, a decoding of a bit for the first spectral value $X_q$ is shown at reference numeral 1120*b*, an addition of the bit, weighted with its bit weight, to the first spectral value is shown at reference numeral 1120*c*, a decoding of a bit for the second spectral value $X_q[n+1]$ is shown at reference numeral 1120*d*, and an addition of the bit, weighted by its bit weight, is shown at reference numeral 1120*e*.

In the following, step 3c will be described. Step 3c comprises decoding the sign of each coefficient, except if the coefficient (or spectral value) is 0.

For example, it is checked whether the spectral coefficient decoded so far (in steps 3a and 3b, without considering the least significant bit) is equal to 0 or not (see reference numeral 1130*a*). If the spectral value $X_q[n]$ is different from 0, then a sign bit is decoded (step 1130*b*) and if the sign bit is equal to 1 (which is checked at reference numeral 1130*c*) then the sign of $X_q[n]$ is inverted (cf.: reference numeral 1130*d*). A similar functionality is performed for the second spectral value, as shown at reference numerals 1131*a* to 1131*d*.

In the following, step 4 will be described. In step 4, all coefficients (or spectral values) for which an index n is larger or equal to lastnz are set to 0. Accordingly, those spectral coefficients which have not been encoded by the encoder (which is signaled by the side information "lastnz") are set to a well-defined value (0).

In the following, step 5 will be described.

Step 5 comprises a finalizing of the arithmetic decoder and computing the number of unused bits. For example, it may be computed how many bits have been decoded in steps 3a, 3b and 3c, and it can then be concluded how many bits of a total bit budget have not been used so far.

In the following, step 6 will be described. In the $6^{th}$ step, if there are unused bits, nlsbs bits are decoded and they are stored in lsbs[ ]. In other words, a sequence of nlsbs bits will be used for a least significant bit refinement, wherein they can either be used directly or can be stored in an intermediate data structure, like an array lsbs[ ]. Then, coefficients (n, n+1) (or spectral values $X_q[n]$ and $X_q[n+1]$) are refined if numbits[n] is greater than 2 (for the respective spectral values having index n and n+1) using the decoded lsb bits (or least-significant-bit bits).

For details, reference is made to FIG. 11*d*.

As can be seen at reference numeral 1140*a*, running variable k is initialized to 0. Then, a loop processing is run over all pairs of spectral values, wherein the loop definition can be seen at reference numeral 1140*b*. However, it should be noted that any pairs of spectral values are skipped in the loop processing which do not comprise more bits than the two most significant bits. A check whether the currently processed pair of spectral values comprises more bits than the most significant bits can be seen at reference numeral 1140*c*. Also, it should be noted that the processing (for example, the refinement of spectral values using least significant bit information) is stopped in any case (even if not all spectral values having more bits than the two most significant bits have been considered) when the number of processed bits reaches the total number nlsbs of bits available for the least-significant-bit refinement. An abortion of the loop processing is, for example, effected by the command "break", and it can be seen that there is typically an evaluation as to whether a maximum number of bits available for the refinement of least significant bits has been reached before a new bit from the bit sequence or array lsbs is evaluated. For example, there is a check whether all available bits have been evaluated at reference numeral 1140*d*, which precedes the reading of a new bit from the bit sequence or array lsbs, which can be seen at reference numeral 1140*e*. Following a reading of a bit from the bit sequence or array lsbs (at reference numeral 1140*e*), different action is taken in dependence on the bit value and also in dependence on the value of the previously decoded spectral value $X_q[n]$. If the value of the refinement bit read in step 1140*e* is zero, no further action is taken (because the bit indicates no need for an amendment of the previously decoded value). In contrast, if the value of the refinement bit read in step 1140*e* is "1" the action taken is dependent on the actual value of the spectral value $X_q[n]$. If the spectral value $X_q$ is larger than zero and if the bit read in step 1140*e* is "1", then the spectral value $X_q[n]$ is increased by 1 (i.e., by a least significant bit value), which can be seen at reference numeral 1140*f*. If the spectral value $X_q[n]$ is negative and the bit value read in step 1140*e* is "1" then the spectral value $X_q[n]$ is reduced by 1 (i.e., by a least significant bit value).

However, if the value $X_q$ is 0 and the bit value of the bit read in step 1140*e* is "1", then another bit is read from the bit sequence or array lsbs, as shown at reference number 1140*i*, wherein the reading of another bit in step 1140*i* is preceded by a check whether a total number of available bits has already been reached (which leads to an abortion of the loop by the "break" command). Subsequently, the value of $X_q[n]$ is selectively set to +1 or -1 in dependence on the value of the "sign bit" read in the step 1140*i*, which is shown at reference numeral 1140*j*. Subsequently, steps 1140*d* to 1140*j* are repeated for the second spectral value $X_q[n+1]$.

To conclude, as long as not all bits of the bit sequence or array lsbs, which are available for the refinement of the least significant bits, have been used up, there is a processing of "refinement bits" from said bit sequence or array lsbs. If the previously decoded spectral value $X_q[n]$, $X_q[n+1]$ is different from 0, a magnitude of said spectral value is selectively increased by a least significant bit value in dependence on a "refinement bit" read from the bit sequence or array lsbs. If the previously decoded spectral value $X_q[n]$, $X_q[n+1]$ is 0, then a "sign bit" is additionally extracted from the bit sequence or array lsbs, and the sign bit decides whether the spectral value $X_q[n]$, $X_q[n+1]$ should be set to +1 or −1 in case the previous (first) refinement bit indicates that the spectral value should be modified by a least significant bit value. In contrast, the sign bit is not used if the refinement bit indicates that a value of the spectral value $X_q[n]$, $X_q[n+1]$ should remain unchanged.

In other words, the first refinement bit associated to a spectral value can be considered as a bit indicating whether the magnitude of the spectral value should be increased by one least significant bit value, and the second refinement bit (sign bit) is only used in cases that the previously decoded spectral value was 0.

Thus, there is a very efficient concept for the refinement, wherein typically only one bit is needed for the least significant bit refinement of a spectral value, and wherein two bits (a bit deciding whether there should be a refinement and a bit deciding the sign) are only needed in the case that the previously decoded spectral value is 0.

It should be noted that the functionalities described here may, for example, be used in the decoding functionality 900.

The features discussed here in much detail, taking reference to pseudo program codes can be introduced into the functionality as shown in FIG. 9 individually or in combination. However, it should be noted that it is not necessary to include each and every detail, and that the details described here may be advantageous when taken individually.

11). Conclusions
11.1) General In the following, some basic ideas of the present invention will be summarized. In particular, the aspects mentioned herein can be implemented individually or in combination with the other aspects into the embodiments of the invention.

Embodiments according to the invention are based on the finding that, at lower bitrates, a conventional approach can severely degrade the coding performance. It has been found that at high bitrates, the high bit budget allows to quantize the full spectrum with high precision, even the high frequency coefficients. It has also been found that setting some of the high frequency coefficients to 0 would add a significant amount of distortion in the high frequencies, which would prevent a transparent quality of the decoded output signal. In FIG. 12, a MDCT spectrum SNR is plotted for every frame of an audio signal and for two bitrates, a low bitrate of 32 kbps and a high bitrate of 128 kbps. The SNR at 32 kbps looks consistent but the SNR at 128 kbps contains big drops. These drops correspond to the frames where the high-frequency coefficients were truncated because the consumed number of bits exceeds the bit budget.

11.2). Step-By-Step Description of the Conventional Approach
In the following, the steps needed to quantize and encode the MDCT spectrum $X(n)$, $0 \le n < N$ as performed in a conventional approach will be described.

Encoder
Step 1: First estimation of the global-gain. This first estimation does not quantize the spectrum nor compute the number of bits consumed by the arithmetic encoder. It is based only on the energy of groups of MDCT coefficients and a low-complexity iterative approach to obtain a first coarse estimation of the global-gain. (see Section 1.3.8.2 in the NBC specs)

Step 2: Quantization of the MDCT spectrum using the global-gain found in Step 1. This produces the quantized MDCT spectrum $X_q(n)$, $0 \le n < N$. (see Section 1.3.8.3 in the NBC specs)

Step 3: Compute the number of bits needed to encode the quantized spectrum $X_q(n)$. If the number of bits exceeds the bit budget, this step also finds the index of the last non-zero encoded coefficient lastnz, such that the consumed number of bits of the truncated spectrum can fit within the bit budget. (see Section 1.3.8.4 in the NBC specs)

Step 4: Adjust the global-gain as a function of the number of bits computed in Step 3: if the number of bits is too high, increase the global-gain; if the number of bits is too low, decrease the global-gain. Then, redo Steps 2 and 3. The Step 4 can be repeated several times until the optimal global-gain is found. If low-complexity is needed, the Step 4 is not performed or performed only once (like in NBC, see Section 1.3.8.6 in the NBC specs).

Step 5: Initialization of the arithmetic encoder states; Initialization of the context c.

Step 6: Encode the global-gain and the last non-zero encoded coefficient lastnz as side-information.

Step 7: Repeat the following substeps for all ($n=0$; $n<$lastnz; $n+=2$):

Step 7a: Compute the minimum number of bits needed to represent the amplitude of the two coefficients $X_q(n)$ and $X_q(n+1)$ numbits=ceil(log 2(max(abs($X_q[n]$),abs($X_q[n+1]$))+ 1));

Step 7b: Encode numbits-2 escape values (VAL_ESC=16) if numbits>2

```
for (b = 0; b < numbits-2; b++) {
    Get probabilities p from context c
    Encode escape symbol VAL_ESC with ari. enc. and probabilities p
    Update context c
}
```

Step 7c: Encode the 2 most significant bits of both coefficients $X_q(n)$ and $X_q(n+1)$ as a single symbol sym (whose value lies between 0 and 15)

```
s = max(0, numbits-2);
a = abs(X_q[n]) >> s;
b = abs(X_q[n+1])) >> s;
sym = a + 4*b;
Get probabilities p from context c
Encode symbol sym with ari. enc. and probabilities p
Update context c
```

Step 7d: Encode the remaining bits if numbits>2

```
for (b = 0; b < numbits-2; b++) {
    bit0 = (abs(X_q[n]) >> b) & 1;
    Encode bit0 as side-information
    bit1 = (abs(X_q[n+1]) >> b) & 1;
    Encode bit1 as side-information
}
```

Step 7e: Encode the sign of each coefficient, except if the coefficient is zero

```
if (X_q[n] != 0 ) {
    bit0 = 0;
```

```
            if (X_q[n] < 0) {
              bit0 = 1;
            }
            Encode bit0 as side-information
        }
        if (X_q[n+1] != 0) {
            bit1 = 0;
            if (X_q[n+1] < 0) {
              bit1 = 1;
            }
            Encode bit1 as side-information
        }
```

Step 8: Finalize the arithmetic encoder and compute the number of unused bits.
Step 9: If there are unused bits, encode residual bits given by the residual quantizer (see Section 1.3.9 in NBC specs).

Decoder

Step 1: Initialization of the arithmetic decoder states; Initialization of the context c.
Step 2: Decode the global-gain and the last non-zero encoded coefficient lastnz.
Step 3: Repeat the following substeps for all (n=0; n<lastnz; n+=2):
  Step 3a: Decode the 2 most significant bits of both coefficients $X_q$ (n) and $X_q$ (n+1)

```
    numbits = 1;
    do {
        Get probabilities p from context c
        Decode symbol sym with ari. dec. and probabilities p
        Update context c
        numbits++;
    } while (sym==VAL_ESC)
    X_q[n] = (sym & 3) << (numbits-2);
    X_q[n+1] = (sym >> 2) << (numbits-2);
```

Step 3b: Decode the remaining bits if numbits>2

```
    for (b = 0; b < numbits-2; b++) {
        Decode bit0
        X_q[n] += bit0 << b
        Decode bit1
        X_q[n+1] += bit1 << b
    }
```

Step 3c: Decode the sign of each coefficient, except if the coefficient is zero

```
    if (X_q[n] != 0 ) {
        Decode bit0
        if (bit0 == 1) {
            X_q[n] = -X_q[n];
        }
    }
    if (X_q[n+1] != 0) {
        Decode bit1
        if (bit1 == 1) {
            X_q[n+1] = -X_q[n+1];
        }
    }
```

Step 4: Set all coefficients n>=lastnz to zero
Step 5: Finalize the arithmetic decoder and compute the number of unused bits.
Step 6: If there are unused bits, decode residual bits. Apply the inverse residual quantizer which refines the non-zero coefficients using the residual bits (see Section 1.4.3 in the NBC specs).
Step 7: Inverse quantization: multiply the decoded MDCT coefficients by the global-gain It should be noted that steps 1 to 9 as described in the present section "step-by-step description of the conventional approach" can be used in conventional audio encoders and decoders, and can also be used when an audio encoder or decoder according to the present invention operates in a first encoding mode.

For example, encoder steps 1 to 9 described in the step-by-step description of the conventional approach can be used to implement functionalities 810, 814, 818, 840, 844, 848, 852, 856, 860, 864, 868 and 869. Encoder steps 1, 2, 4, 5, 6, 7a, 7c, 7e and 8 described above in the step-by-step description of the conventional approach can also be used in an audio encoder according to an embodiment of the present invention, for example to implement functionalities 810, 814, 818, 822, 870, 874, 878, 886, 890, 894 and 896 (for example, when working in the new second mode).

Decoder steps 1, 2, 3, 3a, 3b, 3c, 4, 5, 6, 7 can also be used in an audio decoding according to the present invention when operating in the "first mode", for example to implement steps 910, 914, 918, 930, 934, 938, 942, 944, 948, 980.

Moreover, decoder steps 1, 2, 3, 3a, 3c, 4, 5 and 7 may also be used to implement functionalities 910, 914, 918, 950, 958, 962, 968 and 980 in an inventive decoder (for example, when operating in the "second mode").

11.3). Aspects of the Proposed Invention

In the following, improvements and extensions over the encoder steps and decoder steps used in the conventional approach will be described.

It has been found that, at high bitrates, the quantized MDCT spectrum $X_q[n]$ computed in encoder steps 1 to 4 contains coefficients with high amplitude. It has been found that the minimum number of bits needed to represent the amplitude of these coefficients (encoder step 7a) is thus high and in most cases above 2. Consequently, there is in most cases at least one least significant bit (LSB) per coefficient, encoded as side information as described in encoder step 7d. These least significant bits (LSBs) are the less important information, and it has been found that they can be removed with a relatively small impact on the SNR. It has been found that, actually, the impact is much less than setting an entire coefficient to 0 (i.e., setting both most significant bits MSBs and least significant bits LSBs to 0) like in the conventional approaches.

Embodiments according to the proposed invention are thus based on the idea that it is more efficient to truncate the least significant bits LSBs than to truncate the high-frequency coefficients, when the number of bits consumed for encoding the quantized MDCT data exceeds the bit budget. This is, however, only advantageous (or only possible) when the quantized MDCT spectrum coefficients have a high amplitude, so at high bitrates. Consequently, the proposed invention adds one signaling bit to the bitstream as side information (wherein said signaling bit may, for example, describe whether the "first mode" or the "second mode" is used). This bit signals whether the conventional approach (for example, as described in the section step-by-step description of the conventional approach) or the new approach (as described, for example, in the section step-by-step description of an embodiment of the proposed invention) is used. It should be noted that in the case where the consumed number of bits is below the bit budget, the new approach is not needed, and the signaling bit can be set to trigger the conventional approach. The new approach is, for example, used only when the consumed number of bits exceeds the bit budget and some criteria is met (for example, high bitrate).

Figure 13:
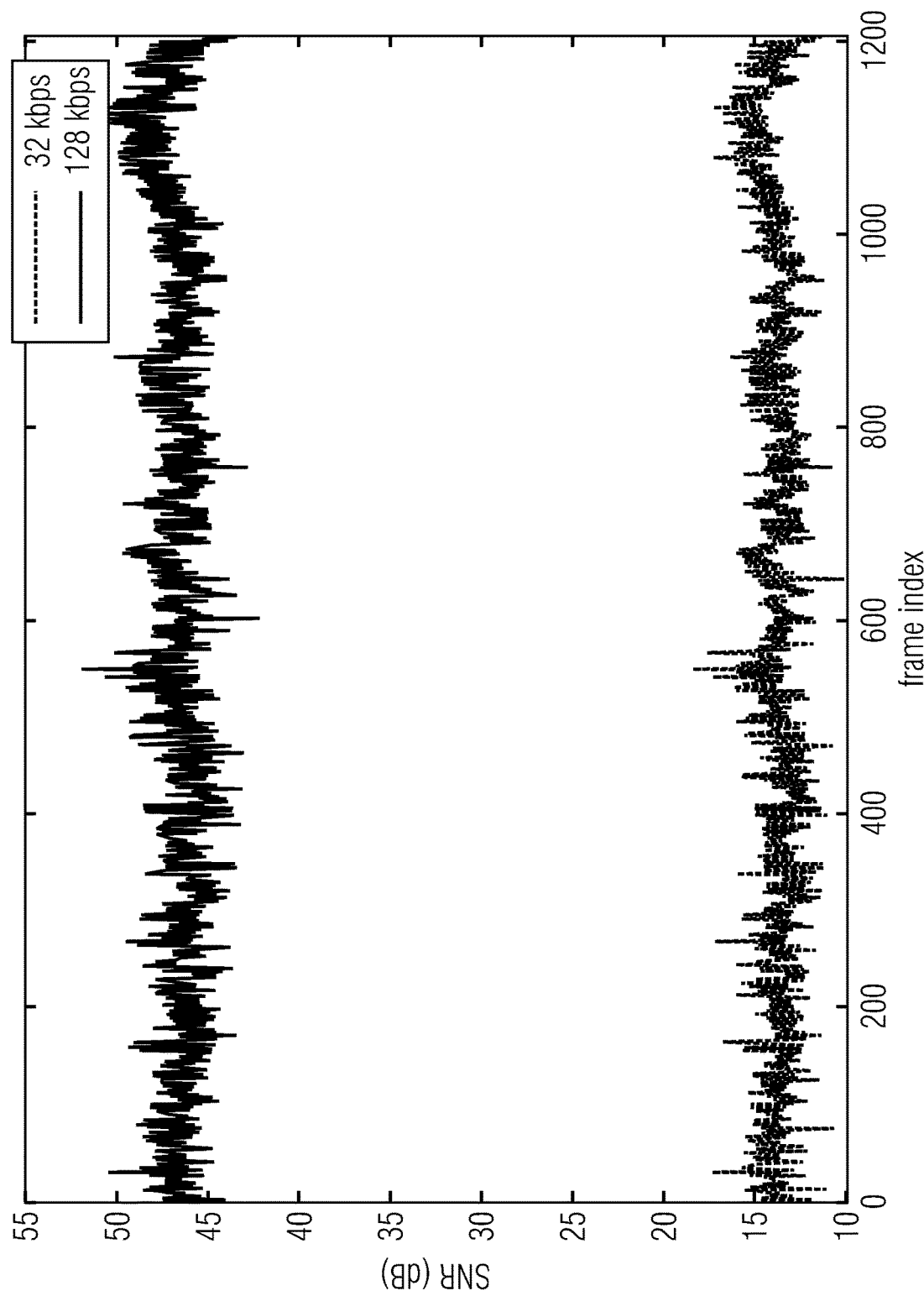
FIG. 13 shows a graphic representation of a signal-to-noise ratio provided by audio encoders/decoders according to the present invention.

In FIG. 13, the same experiment as for the previous figure (FIG. 12) was done, except that an embodiment according to the proposed invention was used for the high bitrate case of 128 kbps. The SNR at 128 kbps looks now much more consistent, all the drops are gone.

11.4). Step-By-Step Description of an Embodiment of the Proposed Invention

In the following, an embodiment according to the present invention will be described step-by-step. In this description, reference will also be made to the step-by-step description of the conventional approach provided in section 11.2, since several of the steps of the conventional approach can be taken over.

In other words, most of these steps described in section 11.2 (conventional approach) are the same here. Thus, only the steps which are different will be described here.

Encoder
- Step 3: This step still computes the number of bits needed to encode the quantized spectrum $X_q(n)$. In addition, this step must also make the decision whether to use the conventional approach or the new approach (i.e. set the signaling bit mentioned in the previous section)
  - new approach if: consumed bits above the bit budget and some criteria is met (e.g. high bitrate)
  - conventional technology if: consumed bits below the bit budget, or the criteria is not met
  - Finally, the step finds the last non-zero encoded coefficient lastnz. It is found like described in Section 11.2 (i.e. in order to truncate the spectrum) only if the conventional approach is selected. If the new approach is selected, the spectrum is not truncated and lastnz corresponds then simply to the last non-zero coefficient.
- Step 6: additionally, this step now encodes also the signaling bit as side-information The other encoder steps are the same if the conventional approach was selected. If the new approach is selected, the following steps are added/modified.
- Step 7a-bis: this is an additional step just after Step 7a, which is performed if numbits>2. The least significant bit of each coefficient is saved, and the coefficient is then modified such that its LSB is now zero. The sign of the coefficient is also saved in case the coefficient was originally non-zero and becomes zero after setting its LSB to zero.

```
if (numbits > 2)
{
    bit = abs(X_q[n]) & 1;
    lsbs[nlsbs++] = bit;
    if (bit != 0 && (abs(X_q[n]) & FFFE) == 0)
    {
        bit = 0;
        if (X_q[n] < 0) {
            bit = 1;
        }
        lsbs[nlsbs++] = bit;
    }
    X_q[n] = (Xq[n]/2) * 2;
    bit = abs(X_q[n+1]) & 1;
    lsbs[nlsbs++] = bit;
    if (bit != 0 && (abs(X_q[n+1]) & FFFE) == 0)
    {
        bit = 0;
        if (X_q[n+1] < 0) {
            bit = 1;
        }
        lsbs[nlsbs++] = bit;
    }
    X_q[n+1] = (Xq[n + 1]/2) * 2;
}
```

- Step 7d: Encode the remaining bits except the least significant bit

```
for (b = 1; b < numbits-2; b++) {
    bit0 = (abs(X_q[n]) >> b) & 1;
    Encode bit0 as side-information
    bit1 = (abs(X_q[n+1]) >> b) & 1;
    Encode bit1 as side-information
}
```

- Step 9: if the new approach is selected, residual quantization/encoding is not used. If there are unused bits, these are used for encoding the nlsbs bits which were saved in lsbs[ ] (see Step 7a-bis).

Decoder
- Step 2: additionally, this step now decodes also the signaling bit

The other decoder steps are the same if the conventional approach was selected. If the new approach is selected, the following steps are added/modified.
- Step 3a-bis: this is an additional step just after Step 3a. It saves numbits in an array numbits[n] so it can be reused later in step 6.
- Step 3b: Decode the remaining bits except the least significant bit

```
for (b = 1; b < numbits-2; b++) {
    Decode bit0
    X_q[n] += bit0 << b
    Decode bit1
    X_q[n+1] += bit1 << b
}
```

- Step 6: If there are unused bits, decode nlsbs bits and store them in lsbs[ ]. Then refine the coefficients (n,n+1) if numbits[n]>2 using the decoded LSB bits.

```
k = 0;
for (n = 0; n < lastnz; n+=2) {
    if (numbits[n] > 2) {
        if (k == nlsbs) {
            break;
        }
        bit0 = lsbs[k++];
        if (bit0 == 1) {
            if (X_q[n] > 0) {
                X_q[n] += 1;
            } else if (X_q[n] < 0) {
                X_q[n] -= 1;
            } else {
                if (k == nlsbs) {
                    break;
                }
                bit1 = lsbs[k++];
                X_q[n] = 1 - 2*bit1;
            }
        }
        if (k == nlsbs) {
            break;
        }
        bit0 = lsbs[k++];
        if (bit0 == 1) {
            if (X_q[n+1] > 0) {
```

```
            X_q[n+1] += 1;
        } else if (X_q[n+1] < 0) {
            X_q[n+1] -= 1;
        } else {
            if (k == nlsbs) {
                break;
            }
            bit1 = lsbs[k++];
            X_q[n+1] = 1 - 2*bit1;
        }
    }
  }
}
```

12. Methods According to FIGS. 14 to 18

FIGS. 14 to 15 show flow charts of methods for audio decoding according to embodiments of the invention.

Figure 17:
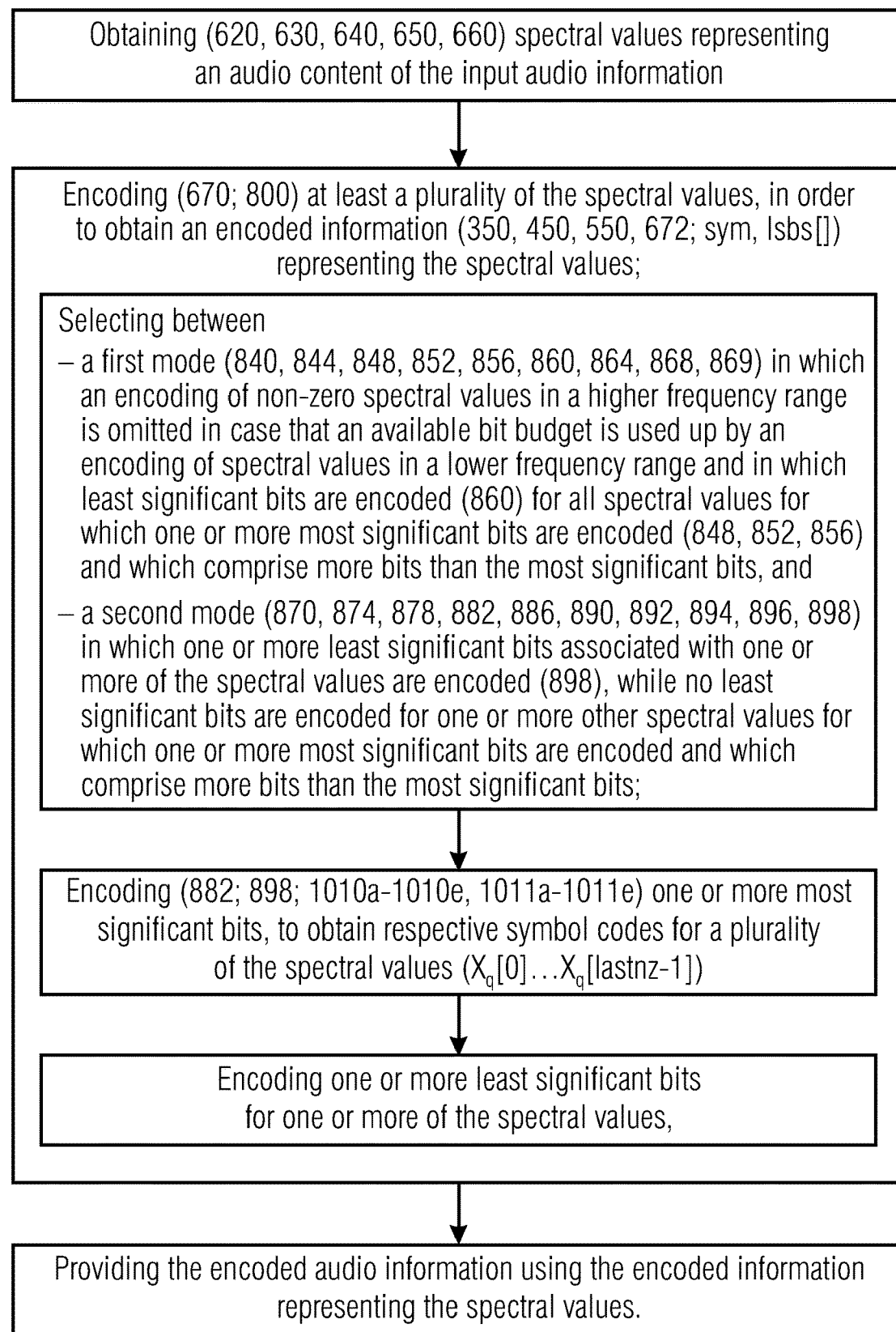
Figure 18:
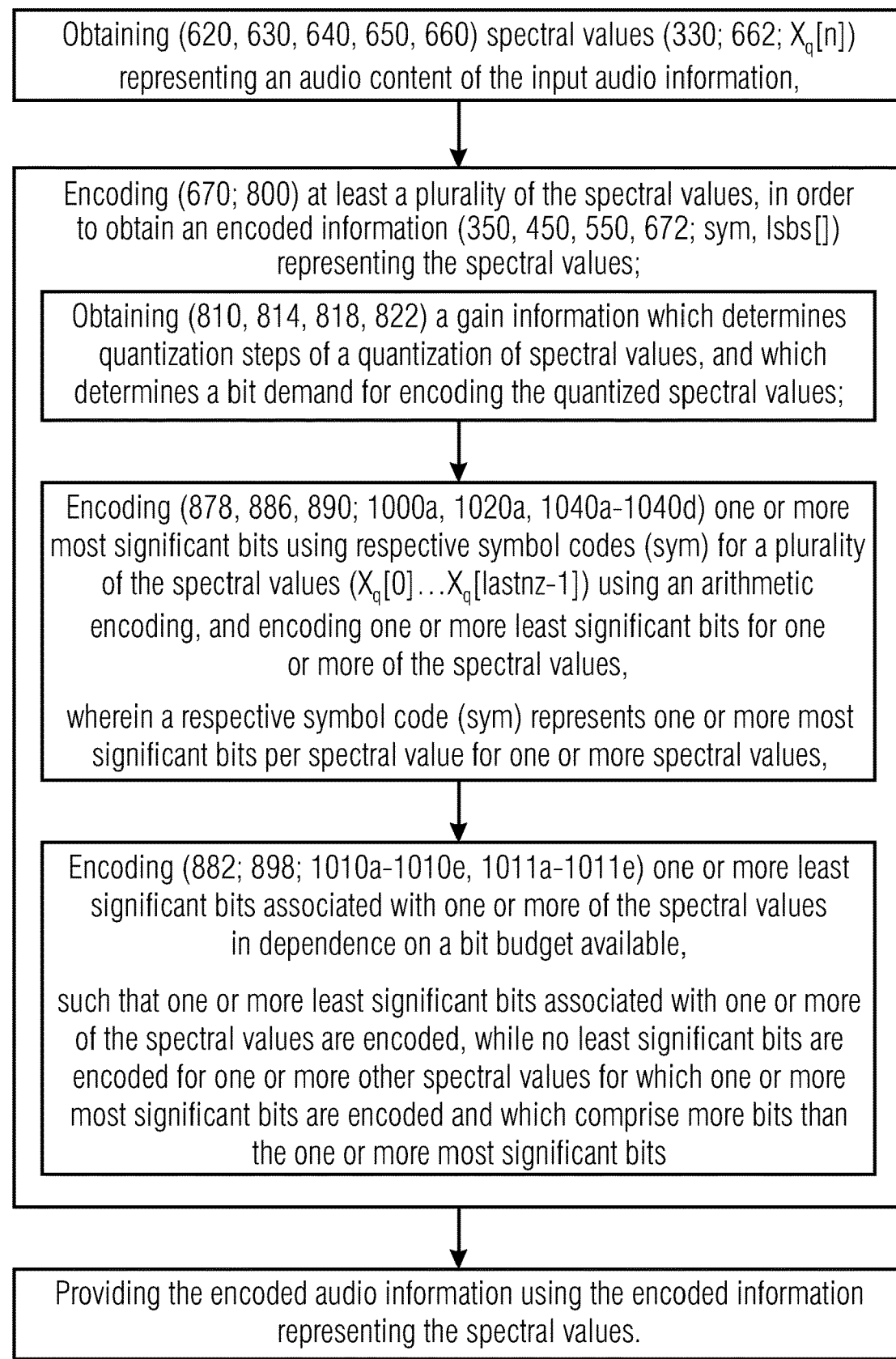

FIGS. 16 to 18 show flow charts of methods for audio decoding according to embodiments of the invention.

It should be noted that the methods can be supplemented by any of the features and functionalities described herein with respect to the corresponding apparatuses and by any of the mentioned functionalities, either individually or in combination.

13. Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An audio encoder for providing an encoded audio information on a basis of an input audio information,
   wherein the audio encoder is configured to acquire spectral values representing an audio content of the input audio information, wherein the audio encoder is configured to encode at least a plurality of the spectral values, in order to acquire an encoded information representing the spectral values, wherein the audio encoder is configured to acquire a gain information which determines quantization steps of a quantization of spectral values, and which determines a bit demand for encoding the quantized spectral values, wherein the audio encoder is configured to encode one or more most significant bits using respective symbol codes for a plurality of the spectral values using an arithmetic encoding, and to encode one or more least significant bits for one or more of the spectral values, wherein a respective symbol code represents one or more most significant bits per spectral value for one or more spectral values, wherein the audio encoder is configured to encode one or more least significant bits associated with one or more of the spectral values in dependence on a bit budget available, such that one or more least significant bits associated with one or more of the spectral values are encoded, while no least significant bits are encoded for one or more other spectral values for which one or more most significant bits are encoded and which comprise more bits than the one or more most significant bits, wherein the audio encoder is configured to provide the encoded audio information using the encoded information representing the spectral values, wherein the audio encoder is configured to be switchable between a first mode in which an encoding of non-zero spectral values in a higher frequency range is omitted in case that an available bit budget is used up by encoded spectral values in a lower frequency range and in which least significant bits are encoded for all spectral values for which one or more most significant bits are encoded and which comprise more bits than the most significant bits, and a second mode in which one or more least significant bits associated with one or more of the spectral values are encoded, while no least significant bits are encoded for one or more other spectral values for which one or more most significant bits are encoded and which comprise more bits than the most significant bits, and wherein the audio encoder is configured to decide whether to use the first mode or the second mode in dependence on the number of bits needed and in dependence on a criterion which indicates how many spectral values comprise more bits than the one or more most significant bits.

2. The audio encoder of claim 1, wherein the audio encoder is configured to acquire a first estimate of the gain information based on an energy of groups of spectral values, to quantize a set of spectral values using the first estimate of gain information, to compute or estimate a number of bits needed to encode the set of spectral values quantized using the first estimate of gain information or using a refined gain information, and to decide whether to use the first mode or the second mode in dependence on a number of bits needed.

3. The audio encoder according to claim 1, wherein the arithmetic encoding is configured to determine bit positions of the one or more most significant bits and incorporate into the arithmetically encoded representation an information describing the bit positions.

4. The audio encoder according to claim 1, wherein the audio encoder is configured to map at least two most significant bits of the at least one spectral value onto one symbol of an arithmetically encoded representation, which represents the at least two most significant bits of the at least one spectral value.

5. The audio encoder according to claim 1, wherein the audio encoder is configured to encode, for all spectral values for which one or more most significant bits are encoded and which comprise more bits than the one or more most significant bits and a least significant bit, one or more intermediate bits, bit positions of which are between the least significant bit and the one or more most significant bits.

6. The audio encoder according to claim 1, wherein the audio encoder is configured to only incorporate a sign information into the encoded audio representation for spectral values which only differ from zero by a least significant bit if the least significant bit of such spectral values is actually encoded.

7. The audio encoder according to claim 1, wherein the audio encoder is configured to sequentially provide subsequent bits of a least-significant-bit-information bit sequence in order to encode least significant bit values associated with the spectral values.

8. The audio encoder according to claim 7, wherein the audio encoder is configured to provide a single bit of the least-significant-bit-information bit sequence for respective spectral values for which the one or more most significant values and any intermediate bits, as far as intermediate bits are present, indicate a non-zero value, wherein the used single bit of the least-significant-bit-information bit sequence is used in order to encode a least significant bit value, wherein the audio encoder is configured to provide a single bit of the least-significant-bit-information bit sequence for respective spectral values for which the one or more most significant values and any intermediate bits, as far as intermediate bits are present, indicate a zero value, and for which the provided single bit of the least-significant-bit-information bit sequence confirms the zero value, and wherein the audio encoder is configured to provide two subsequent bits of the least-significant-bit-information bit sequence for respective spectral values for which the one or more most significant values and any intermediate bits, as far as intermediate bits are present, indicate a zero value, and for which a first of the provided bits of the least-significant-bit-information bit sequence indicates a deviation from the zero value by a least significant bit value, wherein a second of the provided bits of the least-significant-bit-information bit sequence encodes a sign of the respective spectral value.

9. The audio encoder according to claim 1, wherein the audio encoder is configured to encode least significant bits starting from a least significant bit associated with a lowest frequency spectral value and proceeding towards spectral values associated with increasingly higher frequencies, such that encoded information for refining spectral values by least-significant-bit information is provided in a range from a lowest frequency spectral value up to a spectral value for which a last least significant bit information is provided, and such that no encoded information for refining spectral values by least-significant-bit information is provided for spectral values comprising associated frequencies higher than a frequency associated with the spectral value for which the last least significant bit information is provided.

10. The audio encoder according to claim 1, wherein the audio encoder is configured to jointly encode one or more most significant bits per spectral value for at least two spectral values using respective symbol codes,
  wherein a respective symbol code represents one or more most significant bits per spectral value for at least two spectral values.

11. The audio encoder according to claim 1, wherein the audio encoder is configured to determine, when operating in the second mode, an actual highest-frequency non-zero spectral value and to encode at least one or more most significant bits of all non-zero spectral values or of all non-zero groups of spectral values.

12. The audio encoder according to claim 1, wherein the audio encoder is configured to encode, when operating in the second mode, all bits except for a least significant bit for all non-zero spectral values, and
  wherein the audio encoder is configured to encode least significant bits for spectral values until a bit budget is exhausted.

13. The audio encoder according to claim 1, wherein the audio encoder is configured to acquire a gain information which determines quantization steps of a quantization of spectral values, and which determines a bit demand for encoding the quantized spectral values.

14. An audio encoder for providing an encoded audio information on a basis of an input audio information,
  wherein the audio encoder is configured to acquire spectral values representing an audio content of the input audio information,
  wherein the audio encoder is configured to encode at least a plurality of the spectral values, in order to acquire an encoded information representing the spectral values,
  wherein the audio encoder is configured to acquire a gain information which determines quantization steps of a quantization of spectral values, and which determines a bit demand for encoding the quantized spectral values,
  wherein the audio encoder is configured to encode one or more most significant bits using respective symbol codes for a plurality of the spectral values using an arithmetic encoding, and to encode one or more least significant bits for one or more of the spectral values,
  wherein a respective symbol code represents one or more most significant bits per spectral value for one or more spectral values,
  wherein the audio encoder is configured to encode one or more least significant bits associated with one or more of the spectral values in dependence on a bit budget available,
  such that one or more least significant bits associated with one or more of the spectral values are encoded, while no least significant bits are encoded for one or more other spectral values for which one or more most significant bits are encoded and which comprise more bits than the one or more most significant bits,
  wherein the audio encoder is configured to provide the encoded audio information using the encoded information representing the spectral values,
  wherein the audio encoder is configured to be switchable between
    a first mode in which an encoding of non-zero spectral values in a higher frequency range is omitted in case that an available bit budget is used up by encoded spectral values in a lower frequency range and in which least significant bits are encoded for all spectral values for which one or more most significant bits are encoded and which comprise more bits than the most significant bits, and
    a second mode in which one or more least significant bits associated with one or more of the spectral values are encoded, while no least significant bits are encoded for one or more other spectral values for which one or more most significant bits are encoded and which comprise more bits than the most significant bits, and
  wherein the audio encoder is configured to decide whether to use the first mode or the second mode in dependence on the number of bits needed and in dependence on a bitrate, such that the second mode is chosen if a bitrate is larger than or equal to a threshold bitrate and if a computed or estimated number of bits needed to encode the set of spectral values is higher than a bit budget.

15. An audio encoder for providing an encoded audio information on a basis of an input audio information,
  wherein the audio encoder is configured to acquire spectral values representing an audio content of the input audio information,
  wherein the audio encoder is configured to encode at least a plurality of the spectral values, in order to acquire an encoded information representing the spectral values,
  wherein the audio encoder is configured to acquire a gain information which determines quantization steps of a quantization of spectral values, and which determines a bit demand for encoding the quantized spectral values,
  wherein the audio encoder is configured to encode one or more most significant bits using respective symbol codes for a plurality of the spectra values using an arithmetic encoding, and to encode one or more least significant bits for one or more of the spectral values,
  wherein a respective symbol code represents one or more most significant bits per spectral value for one or more spectral values,
  wherein the audio encoder is configured to encode one or more least significant bits associated with one or more of the spectral values in dependence on a bit budget available,
  such that one or more least significant bits associated with one or more of the spectral values are encoded, while no least significant bits are encoded for one or more other spectral values for which one or more most significant bits are encoded and which comprise more bits than the one or more most significant bits, and
  wherein the audio encoder is configured to provide the encoded audio information using the encoded information representing the spectral values,
  wherein the audio encoder is configured to encode, in a first encoding phase,
    one or more most significant bits per spectral value, and
    for all spectral values for which one or more most significant bits are encoded and which comprise more bits than the one or more most significant bits and a least significant bit, one or more intermediate bits, bit positions of which are between the least significant bit and the one or more most significant bits, and
    for all spectral values for which one or more most significant bits are encoded and for which the one or more most significant bits and any intermediate bits, as far as intermediate bits are present, indicate a non-zero value signs,
  wherein the audio encoder is configured to selectively omit, in the first encoding phase, an encoding of a sign for spectral values for which the one or more most significant values and any intermediate bits, as far as intermediate bits are present, indicate a zero value, and wherein the audio encoder is configured to selectively encode, in a second encoding phase which follows the first encoding phase, sign information for spectral values for which the one or more most significant values and any intermediate bits, as far as intermediate bits are present, indicate a zero value and for which a least significant bit information indicates a non-zero value.

16. An audio encoder for providing an encoded audio information on a basis of an input audio information, wherein the audio encoder is configured to acquire spectral values representing an audio content of the input audio information, wherein the audio encoder is configured to encode at least a plurality of the spectral values, in order to acquire an encoded information representing the spectral values, wherein the audio encoder is configured to acquire a gain information which determines quantization steps of a quantization of spectral values, and which determines a bit demand for encoding the quantized spectral values, wherein the audio encoder is configured to encode one or more most significant bits using respective symbol codes for a plurality of the spectral values using an arithmetic encoding, and to encode one or more least significant bits for one or more of the spectral values, wherein a respective symbol code represents one or more most significant bits per spectral value for one or more spectral values, wherein the audio encoder is configured to encode one or more least significant bits associated with one or more of the spectral values in dependence on a bit budget available, such that one or more least significant bits associated with one or more of the spectral values are encoded, while no least significant bits are encoded for one or more other spectral values for which one or more most significant bits are encoded and which comprise more bits than the one or more most significant bits, wherein the audio encoder is configured to provide the encoded audio information using the encoded information representing the spectral values, and wherein the audio encoder is configured to be switchable between a first mode in which an encoding of non-zero spectral values in a higher frequency range is omitted in case that an available bit budget is used up by encoded spectral values in a lower frequency range and in which least significant bits are encoded for all spectral values for which one or more most significant bits are encoded and which comprise more bits than the most significant bits, and a second mode in which one or more least significant bits associated with one or more of the spectral values are encoded, while no least significant bits are encoded for one or more other spectral values for which one or more most significant bits are encoded and which comprise more bits than the most significant bit.

17. The audio encoder according to claim 16, wherein the audio encoder is configured to provide a bitstream flag which is comprised in the encoded audio information in order to indicate whether the audio encoder operates in the first mode or in the second mode.

18. A method for providing an encoded audio information on a basis of an input audio information, wherein the method comprises acquiring spectral values representing an audio content of the input audio information, wherein the method comprises encoding at least a plurality of the spectral values, in order to acquire an encoded information representing the spectral values, wherein the method comprises acquiring a gain information which determines quantization steps of a quantization of spectral values, and which determines a bit demand for encoding the quantized spectral values, wherein the method comprises encoding one or more most significant bits using respective symbol codes for a plurality of the spectral values using an arithmetic encoding, and encoding one or more least significant bits for one or more of the spectral values, wherein a respective symbol code represents one or more most significant bits per spectral value for one or more spectral values, wherein the method comprises encoding one or more least significant bits associated with one or more of the spectral values in dependence on a bit budget available, such that one or more least significant bits associated with one or more of the spectral values are encoded, while no least significant bits are encoded for one or more other spectral values for which one or more most significant bits are encoded and which comprise more bits than the one or more most significant bits, wherein the method comprises providing the encoded audio information using the encoded information representing the spectral values, wherein the method is switchable between a first mode in which an encoding of non-zero spectral values in a higher frequency range is omitted in case that an available bit budget is used up by encoded spectral values in a lower frequency range and in which least significant bits are encoded for all spectral values for which one or more most significant bits are encoded and which comprise more bits than the most significant bits, and a second mode in which one or more least significant bits associated with one or more of the spectral values are encoded, while no least significant bits are encoded for one or more other spectral values for which one or more most significant bits are encoded and which comprise more bits than the most significant bits, and wherein the method comprises deciding whether to use the first mode or the second mode in dependence on the number of bits needed and in dependence on a bitrate, such that the second mode is chosen if a bitrate is larger than or equal to a threshold bitrate and if a computed or estimated number of bits needed to encode the set of spectral values is higher than a bit budget.

19. A non-transitory digital storage medium having a computer program stored thereon to perform a method for providing an encoded audio information on a basis of an input audio information, wherein the method comprises acquiring spectral values representing an audio content of the input audio information, wherein the method comprises encoding at least a plurality of the spectral values, in order to acquire an encoded information representing the spectral values, wherein the method comprises acquiring a gain information which determines quantization steps of a quantization of spectral values, and which determines a bit demand for encoding the quantized spectral values, wherein the method comprises encoding one or more most significant bits using respective symbol codes for a plurality of the spectral values using an arithmetic encoding, and encoding one or more least significant bits for one or more of the spectral values, wherein a respective symbol code represents one or more most significant bits per spectral value for one or more spectral values, wherein the method comprises encoding one or more least significant bits associated with one or more of the spectral values in dependence on a bit budget available, such that one or more least significant bits associated with one or more of the spectral values are encoded, while no least significant bits are encoded for one or more other spectral values for which one or more most significant bits are encoded and which comprise more bits than the one or more most significant bits, wherein the method comprises providing the encoded audio information using the encoded information representing the spectral values, wherein the method is switchable between a first mode in which an encoding of non-zero spectral values in a higher frequency range is omitted in case that an available bit budget is used up by encoded spectral values in a lower frequency range and in which least significant bits are encoded for all spectral values for which one or more most significant bits are encoded and which comprise more bits than the most significant bits, and a second mode in which one or more least significant bits associated with one or more of the spectral values are encoded, while no least significant bits are encoded for one or more other spectral values for which one or more most significant bits are encoded and which comprise more bits than the most significant bits, and wherein the method comprises deciding whether to use the first mode or the second mode in dependence on the number of bits needed and in dependence on a bitrate, such that the second mode is chosen if a bitrate is larger than or equal to a threshold bitrate and if a computed or estimated number of bits needed to encode the set of spectral values is higher than a bit budget, when said computer program is run by a computer.

* * * * *